United States Patent [19]

Yoh et al.

[11] Patent Number: 5,159,260

[45] Date of Patent: Oct. 27, 1992

[54] REFERENCE VOLTAGE GENERATOR DEVICE

[75] Inventors: Kanji Yoh, Kokubunji; Osamu Yamashiro, Omiya; Satoshi Meguro, Kodaira; Koichi Nagasawa, Kunitachi; Kotaro Nishimura, Kokubunji; Harumi Wakimoto, Hino; Kazutaka Narita, Kodaira, all of Japan

[73] Assignee: Hitachi, Ltd., Tokyo, Japan

[21] Appl. No.: 4,307

[22] Filed: Jan. 7, 1987

Related U.S. Application Data

[63] Continuation of Ser. No. 759,965, Jul. 29, 1985, abandoned, which is a continuation of Ser. No. 537,847, Sep. 30, 1983, abandoned, which is a continuation of Ser. No. 10,961, Feb. 9, 1979, abandoned.

[30] Foreign Application Priority Data

| Mar. 8, 1978 [JP] | Japan | 53-25444 |
| Apr. 5, 1978 [JP] | Japan | 53-39242 |
| Sep. 13, 1978 [JP] | Japan | 53-111722 |
| Sep. 13, 1978 [JP] | Japan | 53-111725 |

[51] Int. Cl.⁵ .................................. G05F 3/24
[52] U.S. Cl. .......................... 323/313; 323/314; 307/296.1; 307/296.6
[58] Field of Search ............ 323/226, 273, 280, 281, 323/313, 314, 317, 315, 316; 307/296.1, 296.6, 296.8

[56] References Cited

U.S. PATENT DOCUMENTS

| 3,673,471 | 6/1972 | Klein et al. | 351/42 |
| 3,743,923 | 7/1973 | Steudel | 323/281 |
| 3,975,648 | 8/1976 | Tobey, Jr. et al. | 307/297 |
| 4,005,353 | 1/1977 | Yokoyama | 323/281 |
| 4,264,857 | 4/1981 | Jambotkar | 307/297 |
| 4,513,308 | 4/1985 | Greene et al. | 357/32 |

FOREIGN PATENT DOCUMENTS

| 2142050 | 3/1972 | Fed. Rep. of Germany. |
| 2338239 | 3/1974 | Fed. Rep. of Germany. |

*Primary Examiner*—Steven L. Stephan
*Assistant Examiner*—Emanuel T. Voeltz
*Attorney, Agent, or Firm*—Antonelli, Terry, Stout & Kraus

[57] ABSTRACT

This reference voltage generator device detects a voltage corresponding to an energy gap of a semiconductor, or a voltage of a value close thereto, or a voltage based on an energy level of a semiconductor, and generates the detected voltage as a reference voltage. The reference voltage is generated by detecting a difference of threshold voltages of first and second insulated gate field-effect transistors (IGFETs). Gate electrodes of the first and second IGFETs are formed on gate insulating films which are formed on different surface areas of an identical semiconductor substrate under substantially the same conditions. The gate electrodes of the first and second IGFETs are respectively made of two semiconductors which are selected from among a semiconductor of a first conductivity type, a semiconductor of a second conductivity type and an intrinsic semiconductor made of an identical semiconductor material, and which have Fermi energy levels of values different from each other. The channels of the first and second IGFETs have an identical conductivity type. On the basis of a self-alignment structure, at least those parts of first and second polycrystalline semiconductor regions being the gate electrodes of the first and second IGFETs which are proximate to source and drain regions are doped with the same impurity as that of the source and drain regions, and a central part of one of the first and second polycrystalline semiconductor regions is doped with an impurity of a selected one of the first conductivity type and the second conductivity type.

10 Claims, 52 Drawing Sheets

FIG. 4a

Ge energy levels for dopants:
- Top row (acceptors/donors above gap center): Li 0.0095, Sb 0.012, P 0.18, As 0.26, S 0.09, Cu 0.04, Ag 0.20, Au (0.37, 0.27, 0.31, 0.30), 0.20, Se 0.14, 0.28
- Below gap center: 0.07, 0.13, 0.15/0.05, 0.16, 0.16, 0.35, 0.25, 0.22, 0.23, 0.12, 0.83, 0.24, 0.07
- Bottom: 0.010, 0.010, 0.01, 0.0110, 0.011, 0.04, 0.02, 0.03
- Bottom labels: B Al Tl Ga In Be   Zn Cd Mn Fe Co Ni Hg Pt Cr

FIG. 4b

Si energy levels for dopants:
- Top: Li 0.033, Sb —, P —, As 0.039, Bi 0.044, 0.045, 0.069; Ni 0.18; S 0.35, 0.37; Mn —; Ag 0.33, Pt 0.37, Hg 0.33
- Near gap center: 0.54 A, 0.52, 0.53 D, 0.53
- Below: 0.39, 0.55, 0.31, 0.37, 0.35 D, 0.40, 0.34, 0.36
- Lower: 0.045, 0.057, 0.16, 0.26, 0.065, 0.24, 0.22, 0.03
- Bottom labels: B Al Ga In Tl Co Zn   Cu   Au   Fe   O

FIG. 4c

GaAs energy levels for dopants:
- Top: Te 0.003; Si 0.002; Ge SHALLOW LEVEL; Sn SHALLOW LEVEL; O —; Se 0.005
- Mid: 0.70, 0.63, 0.52, 0.51, 0.53 D, 0.37, 0.24
- Lower: 0.21, 0.021, 0.096, 0.16, 0.026, 0.08, 0.143, 0.15, 0.0012, 0.019, 0.023, 0.024, 0.023, 0.023
- Bottom labels: Mg C Cd Li Zn Mn Co Ni Si Ga Fe Cr Li Cu

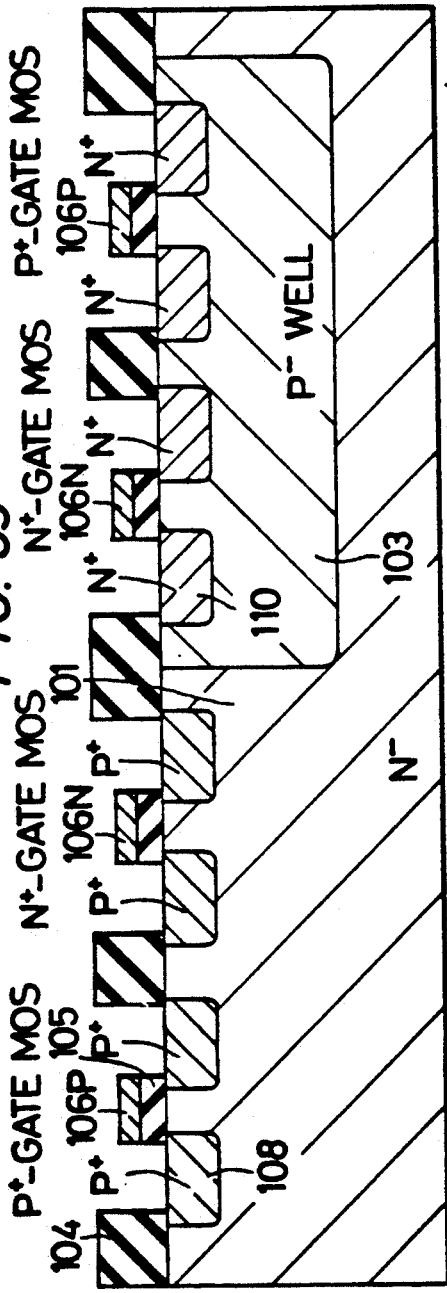
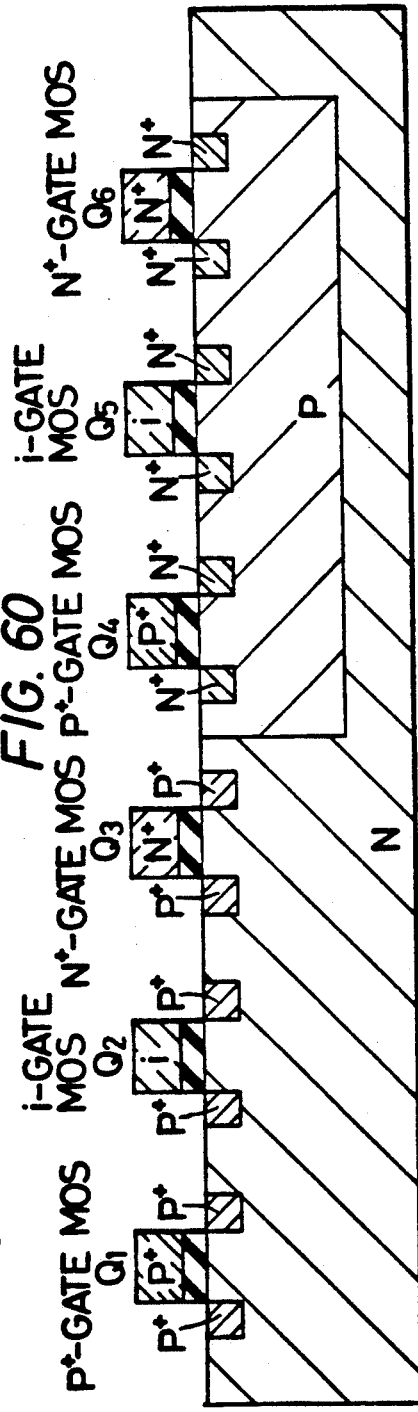

REFERENCE VOLTAGE GENERATOR DEVICE

This application is a continuation of application Ser. No. 759,965, filed on Jul. 29, 1985 now abandoned, which is a continuation of application Ser. No. 537,847, filed Sep. 30, 1983, now abandoned, which is a continuation application of Ser. No. 010,961, filed Feb. 9, 1979, now abandoned.

BACKGROUND OF THE INVENTION

This invention relates to a reference voltage generator device as well as applications thereof, and also to a method of manufacturing the same.

In generating reference voltages in various semiconductor electronic circuits, it is an indispensable condition to utilize any physical quantity having the dimension of the voltage. As the physical quantities, there have heretofore been utilized such quantities as the forward voltage drop $V_F$ or reverse breakdown voltage (Zener voltage) $V_Z$ of a PN-junction diode, the threshold voltage $V_{th}$ of an insulated gate field-effect transistor (often represented by an IGFET or MOSFET), etc.

These physical quantities do not indicate voltage values which are absolutely fixed, on the contrary their voltage values are subject to fluctuations due to various factors. In order to make use of the physical quantities for the reference voltage generator devices of various electronic circuits, accordingly, attention must be paid to factors of the fluctuations of the voltage values to be obtained and allowable widths of the fluctuations.

First of all, as to the temperature characteristics of the physical quantities, the voltages $V_F$ and $V_{th}$ usually have a temperature-dependency of approximately 2-3 mV/°C. The fluctuation of the reference voltage attendant upon the temperature change attains such a magnitude that the application has to be given up in some uses.

By way of example, when a battery checker for giving the alarm that the voltage of a battery has lowered below a predetermined reference value is intended to be realized in an electronic timepiece which employs a silver oxide battery having a nominal voltage of 1.5V, whether the battery voltage is high or low needs to be judged with the boundary (detection level) or the detection reference value at about 1.4V.

When a reference voltage generator device is to be constructed by exploiting the threshold voltage $V_{th}$ of a MOSFET or the forward drop voltage $V_F$ of a diode which is about 0.6V, the detection level aimed at 1.4V has a temperature-dependency of:

$$\frac{1.4\ (V)}{0.6\ (V)} \times \{2 \sim 3\ (mV/°C.)\} = 4.67 \sim 7.0\ (mV/°C.).$$

Accordingly, even when the practical operating temperature range is estimated as narrow as 0° C. to 50° C., the detection level fluctuates as greatly as 1.23V to 1.57V, and a practical battery checker cannot be obtained.

Subsequently, the physical quantities have dispersions or deviations in their manufacture. For example, the threshold voltage $V_{th}$ of a MOSFET has a dispersion of about ±0.2V, which is greater than the temperature fluctuation. Accordingly, in a case where the above-stated battery checker is put into the form of an IC (integrated circuit) by exploiting the voltage $V_{th}$, not only external components and external connection pins (external connection terminals) for adjusting the reference voltage but also the labor of the adjustment after the fabrication of the IC is required.

The lower voltage limit of the Zener voltage $V_z$ is about 3 V, and it is impossible to generate a reference voltage to be used in a low voltage range of 1 to 3V or so. In case of using the Zener voltage or the forward drop voltage of a diode as a reference voltage, a current on the order of several mA to several tens of mA needs to be caused to flow, which is inappropriate to the point of lowering the power dissipation of the reference voltage generator device.

As is apparent from the above explanation, the conventional reference voltage generator devices exploiting the voltages $V_{th}$, $V_F$ and $V_z$ have not always been suited to all the uses when the temperature characteristics, the dispersions or deviations in manufacture, the power dissipation, the voltage level etc. have been taken into account. For uses requiring very severe charactetistics, it has been often the case that the practical use or the mass production must be relinquished.

The inventors have their studies as above described that the improvements in the conventional reference voltage generator devices are subject to limitations physically, and have therefore developed a reference voltage generator device which has a new idea and concept.

SUMMARY OF THE INVENTION

An object of this invention is to provide a reference voltage generator circuit based on a new idea not having hitherto existent, and to facilitate the designs and mass production of electronic circuits based on said reference voltage generator circuit.

Various embodiments of this invention to be described later have the following advantages:

(1) A reference voltage generator device of small temperature variations can be provided.

(2) There can be provided a reference voltage generator device in which the fluctuations of a voltage value to be obtained are small with respect to the fluctuations of manufacturing conditions, for example, the manufacturing dispersions (deviations) among lots are small.

(3) There can be provided a reference voltage generator device in the form of an integrated circuit which can diminish the manufacturing dispersions to such an extent that any adjustment after the manufacture is unnecessary.

(4) There can be provided an electronic circuit device in the form of an integrated circuit including a reference voltage generator device which can be manufactured with a large tolerance relative to a specification aimed at.

(5) There can be provided an electronic circuit device in the form of an integrated circuit including a reference voltage generator device which has a high manufacturing yield, i.e. a high efficiency percentage.

(6) A reference voltage generator device which is suited to an IGFET integrated circuit can be provided.

(7) A reference voltage generator device and a voltage comparator which are of low power dissipation can be provided.

(8) There can be provided a reference voltage generator device which can produce a low voltage (of or below 1.1V) of excellent precision.

(9) There can be provided a reference voltage generator device which is suited to a power source of a comparatively low voltage (approximately 1 to 3V), for example, a silver oxide battery of 1.5V or a mercury battery of 1.3V.

(10) It is possible to provide a reference voltage generator device which is suited to a semiconductor integrated circuit.

(11) It is possible to provide a voltage comparator, a stabilized power supply device, a constant-current circuit and a battery checker are very high precision devices.

(12) It is possible to provide a semiconductor integrated circuit device for an electronic timepiece which contains a battery checker of high precision therein and which has a small number of external terminals.

(13) It is possible to provide an IGFET integrated circuit in which the threshold voltage of an IGFET with a back bias applied thereto can be maintained at a substantially constant voltage independent of dispersions in manufacture and changes in temperature, whereby the yield of manufacture can be enhanced.

(14) It is possible to provide a reference voltage generator device which is compatible with a complementary type insulated gate field-effect transistor integrated circuit (CMOS IC) or with an N-channel MOSIC or P-channel MOSIC, and a method of manufacturing the same.

(15) It is possible to provide a constant-voltage output circuit which is suitable for rendering the power dissipation low. That is, there can be provided a constant-voltage output circuit which produces a stabilized voltage with a supply voltage such as battery voltage lowered in absolute value and which has a low power dissipation.

(16) It is possible to provide a reference voltage generator device which is compatible with the so-called silicon gate insulated-gate field-effect transistor integrated circuit employing silicon for gate electrodes, and a method of manufacturing the same.

(17) There can be provided a method of manufacturing a reference voltage generator device without increasing the number of fabricating steps in the fabrication of a silicon gate P-channel IGFET integrated circuit.

(18) There can be provided a reference voltage generator circuit which exploits the difference of the Fermi levels of aluminum and intrinsic silicon, which does not employ P-type silicon containing a P-type impurity such as born liable to be introduced into a channel portion through a gate insulating film and which undergoes small dispersions in manufacture.

(19) It is possible to provide a method of manufacturing a reference voltage generator device which can prevent an acceptor impurity forming a P-type silicon gate such as B, Al and Ga from being introduced into a channel portion through a gate oxide film to change the threshold voltage of an IGFET whose gate electrode is made of the P-type silicon.

(20) It is possible to provide a semiconductor memory which has the function of preventing any erroneous writing in a data retention mode. That is, when a supply voltage has become below a set detection voltage, at least one of control signals required for a writing operation can be inhibited.

(21) It is possible to provide a Schmitt trigger circuit which is constructed of MISFETs (insulated gate field-effect transistors) and whose hysteresis curves have a width varying little due to the fluctuations of a supply voltage, the manufacturing dispersions of the MISFETs, the changes of the temperature, etc.

This invention has been made by going back to the starting point of the physics of semiconductors and taking special notice of the energy gap $E_g$, the Fermi level $E_f$, etc.

It is well known that semiconductors have energy gaps $E_g$ and various levels such as donor, acceptor and Fermi levels. However, an example of a reference voltage generator device with note taken of the physics of semiconductors, especially the energy gap $E_g$ and the Fermi level $E_f$, has not been proposed up to the present time even though remarkable developments have been achieved in extensive fields since the discovery of semiconductors.

Stated upon actual results, the inventors have determined how to utilize the energy gap $E_g$, the Fermi level $E_f$, etc. for reference voltage sources and have succeeded in the realization thereof. It is not a difficult theory in itself to use the energy gap $E_g$, the Fermi level $E_f$, etc. for reference voltage sources, and the results will be readily understood. However, this success which the applicants have achieved is believed to be unprecedented in that the inventors have brought forth by going back to the starting point of the material properties of semiconductors in the field of semiconductor industry which is no longer short in history is creative and epochal, and is expected to this success greatly contribute to further advancements of electronic circuits and the semiconductor industry in the future.

According to one aspect of the performance of this invention, two IGFETs which have silicon gate electrodes of conductivity types opposite to each other are fabricated within a silicon monolithic semiconductor integtated circuit chip. Since these FETs are manufactured under substantially the same conditions except for the conductivity types of the gate electrodes, the difference of the threshold voltages $V_{th}$ of both the FETs becomes approximately equal to the difference of the Fermi levels of P-type silicon and N-type silicon. The gate electrodes are doped with respective impurities to the vicinities of the saturation densities, and the difference becomes approximately equal to the energy gap $E_g$ of silicon (about 1.1V), which is utilized as a reference voltage source.

Since the reference voltage generator device based on such a construction is low in its temperature-dependency and small in the its manufacturing deviations, it can be used as a reference voltage generator device for various electronic circuits.

The above-mentioned objects, advantages and various features of this invention will become apparent from the following description taken with reference to the drawings.

BRIEF DESCRIPTION OF THE DRAWINGS

FIGS. 2(a) to 2(d) are diagrams showing the band structures and Fermi levels $E_f$ of semiconductors, in which FIGS. 2(a) and 2(b) illustrate an example of an N-type semiconductor and FIGS. 2(c) and 2(d) illustrate an example of a P-type semiconductor, FIG. 5 is a diagram showing the temperature characteristics of the Fermi levels of N-type and P-type Si with the impurity densities being a parameter, FIGS. 4(a), 4(b) and 4(c) are diagrams showing the distributions of energy levels possessed by Ge, Si and GaAs semiconductors and various donor and acceptor impurities, respectively, FIGS. 5(a) and 5(b) are diagrams showing the energy state and the states of charges of a P+-type semiconductor-insulator-N-type semiconductor structure respectively, while FIG. 10(a) is a circuit diagram of a reference voltage generator circuit showing an embodiment of this invention, while FIG. 11(a) shows a further example of a reference voltage generator circuit, while FIG. 35(a) is a circuit diagram for explaining an example of a voltage regulator to which an offset type operational amplifier circuit according to this invention is applied, while FIG. 36(a) is a circuit diagram for explaining a voltage regulator according to another embodiment of this invention, while FIG. 40(a) shows a Schmitt trigger circuit to which the principle of this invention is applied, while FIG. 53(a) shows a voltage detector circuit which is used in the semiconductor random access memory according to this invention, while

DESCRIPTION OF THE PREFERRED EMBODIMENTS

The physics of semiconductors which begins with the crystalline structure of a semiconductor and which develops into the energy band of a semiconductor and phenomena brought on semiconductors by donor and acceptor impurities are explained in numerous reference.

It is, of course, well known that semiconductors of different compositions have energy gaps $E_g$ inherent thereto and that the energy gap $E_g$ expressed in eV has the dimension of the voltage. As previously stated, however, there has not been any example wherein, with notice taken of the fact that the semiconductor has the inherent energy gap $E_g$ and that it exhibits the low temperature-dependency, it is exploited as the reference voltage source.

The present embodiment has been made upon starting from such fundamentals of the physics. of semiconductors. Therefore, the detailed description of this invention will be commenced with the principle matters thereof by firstly referring to the physics of semiconductors. Since the material properties of semiconductors are explained siderably minutely in many reference, they will now be briefly described with the aid of one of the reference. "Physics of Semiconductor Devices" by S. M. SZE, published by John Wiley & Sons in 1969, especially Chapter 2 "Physics and Properties of Semiconductors" on pp. 11–65.

Application of Energy Gap $E_g$

There are various compositions of semiconductors. Among them, typical as semiconductors industrially utilized at present are non-compound semiconductors of germanium (Ge) or silicon (Si) and gallium-arsenic (GaAs) compound semiconductors. The relations between the energy gaps $E_g$ of these semiconductors and the temperature are explained on page 24 of the above mentioned reference, and are reprinted in FIG. 1.

Figure 1:
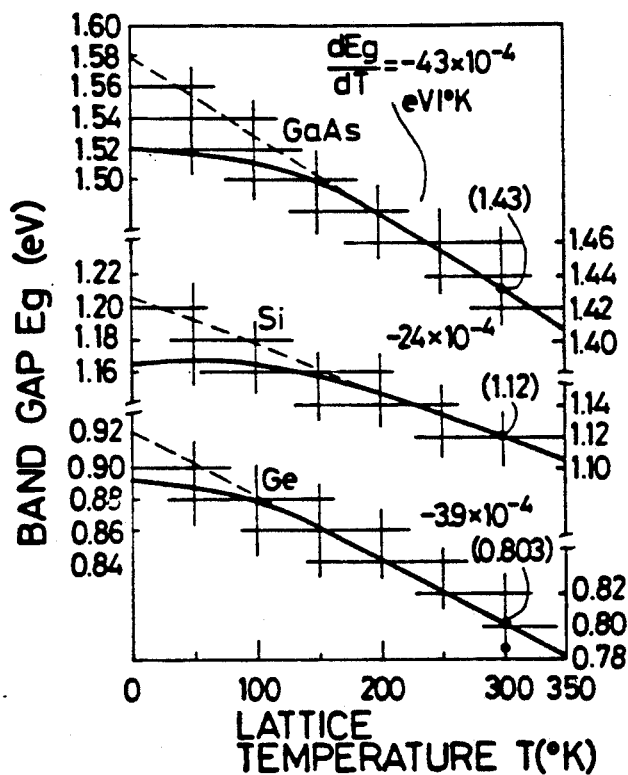
FIG. 1 is a diagram showing the band gaps $E_g$ of GaAs, Si and Ge and their temperature-dependencies.

As seen from FIG. 1, the energy gaps $E_g$ of Ge, Si and GaAs are 0.80 (eV), 1.12 (eV) and 1.43 (eV) at the normal temperature (300° K.) respectively. Their temperature-dependencies are 0.39 (meV/°K), 0.24 (meV/°K) and 0.43 (meV/°K), respectively. By deriving voltages of values equivalent to or close to the energy gaps $E_g$, accordingly, reference voltage generator devices are obtained which have the temperature-dependencies being one order smaller than those of the forward voltage drop $V_F$ of a PN-junction diode and the threshold voltage $V_{th}$ of an IGFET as stated previously. Furthermore, a voltage to be obtained is determined by the energy gap $E_g$ inherent to the semiconductor. With, for example, Si, it is decided to be about 1.12 (V) at the normal temperature substantially independently of the other factors. Thus is possible to obtain a reference voltage which is not affected by dispersions in the manufacturing conditions etc.

An example will now be explained as to what principle the voltage corresponding to the energy gap $E_g$ of the semiconductor can be derived.

Application of Difference of Fermi Levels (Work Functions) of N-type, i-type and P-type Semiconductors The states of energy levels in the case of doping semiconductors with donor and acceptor impurities are well known. Especially attended to in this invention is the phenomenon that the energy levels at which the Fermi energies of N-type and P-type semiconductors are located are separated towards a conduction band and towards a valence band with respect to the Fermi energy level $E_i$ of an intrinsic semiconductor. In the tendency in which the energy levels become more distant from the Fermi level $E_i$ of the intrinsic semiconductor as the densities of the acceptor and donor impurities are higher, the Fermi level $E_{fp}$ of the P-type semiconductor comes close to the top $E_v$ of the valence band, while the Fermi level $E_{fn}$ of the N-type semiconductor comes close to the bottom $E_c$ of the conduction band. Accordingly, when the difference $(E_{fn}-E_{fp})$ of both the Fermi levels is taken, the energy level difference is substantially approximate to the energy gap $E_g$ possessed by the semiconductor and its temperature-dependency is also approximate to that of the energy gap $E_g$. The same applies to the differences $(E_{fn}-E_i)$ and $(E_i-E_{fp})$ between the Fermi levels of the P-type semiconductor and the intrinsic semiconductor and between the Fermi levels of the N-type semiconductor and the intrinsic semiconductor. In this case, however, the absolute value approaches $E_g/2$. Hereinbelow, the differences relative to the intrinsic semiconductor will not be described in detail on the ground that they become a half of the difference between the P-type and the N-type. As will be stated in detail later, the higher the impurity concentration, the lower the temperature-dependency of $(E_{fn}-E_{fp})$. In order to attain a great energy level difference approximate to the energy gap $E_g$ and to attain a low temperature-dependency thereof, accordingly, it is favorable to establish an impurity density as close to the saturation density as possible.

The Fermi levels $E_{fn}$ and $E_{fp}$ concern, not only the density of the donor or acceptor impurit but also donor or acceptor levels $E_d$ or $E_a$, which differs depending upon impurity materials. As the level $E_d$ or $E_a$ has an energy level nearer to the conduction band or the valence band respectively, the Fermi level $E_{fd}$ or $E_{fa}$ comes closer thereto. In other words, as the impurity levels $E_d$ and $E_a$ of the donor and acceptor have shallower levels, the difference $(E_{fn}-E_{fp})$ of the Fermi levels comes closer to the energy gap $E_g$ of the semiconductor.

As the impurity level $E_d$ or $E_a$ of the donor or acceptor is closer to the Fermi level $E_i$ of the intrinsic semiconductor, that is, as it has a deeper level, the difference $(E_{fn}-E_{fp})$ of the Fermi levels becomes more distant from the energy gap $E_g$ of the semiconductor. This, however, does not signify that the temperature-dependency degrades, but signifies that the absolute value of the difference $(E_{fn}-E_{fp})$ of the Fermi levels diminishes. Accordingly, the difference $(E_{fn}-E_{fp})$ of the Fermi levels or the difference of work functions is a physical quantity inherent to the semiconductor material, the impurity materials, etc. From another viewpoint, it can become a reference voltage source parallel or similar to the energy gap $E_g$ of the semiconductor. That is, the difference $(E_{fn}-E_{fp})$ of the Fermi levels per se can become a reference voltage source which is lower in the temperature-dependency and less liable to be affected by the manufacturing conditions than the forward voltage drop $V_F$ of a PN-junction and the threshold voltage $V_{th}$ of an IGFET. In consequence, an expedient of taking out the difference $(E_{fn}-E_{fp})$ of the Fermi levels by the use of impurity materials exhibiting donor and acceptor levels $E_d$ and $E_a$ having shallow levels can become one method for deriving a voltage of a value substantially approximate to the energy gap $E_g$ of the semiconductor. On the other hand, as regards the setting of a voltage value to be obtained, in case of intending to attain a comparatively large reference voltage equivalent to the energy gap of the semiconductor, impurities which exhibit shallow levels may be used, and in case of intending to attain a comparatively small reference voltage, impurities which exhibit deep levels may be used.

Concrete Examples of Selection of Impurity Materials

Figure 3:
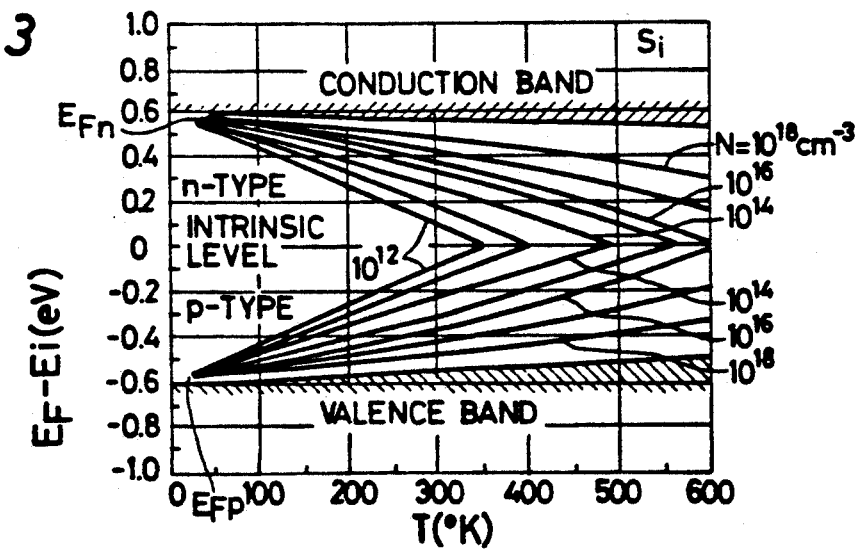

The relations between the Fermi level $E_f$ and the donor level $E_d$, acceptor level $E_a$, donor density $N_d$, acceptor density $N_a$ and the temperature T will be described more in detail with reference to FIG. 2 and FIG. 3. Prior to the description, data on page 30 of the aforecited literature as reprinted in FIG. 4 will be referred to in order to explain what levels various impurities present to the Ge, Si and GaAs semiconductors and to explain how the impurities are utilized in this invention.

FIGS. 4(a), 4(b) and 4(c) are diagrams which show the energy distributions of various impurities for Ge, Si and GaAs, respectively. Numerals in the respective diagrams indicate energy differences $(E_c-E_d)$ from the bottom $E_c$ of a conduction band as to levels located above the center of a gap or the Fermi level of an intrinsic semiconductor $E_i$ drawn by a broken line, and indicate energy differences $(E_a-E_v)$ from the top $E_v$ of a valence band as to levels located below the gap center $E_i$, the unit being (eV) in both the cases.

Accordingly, an impurity material indicated by a small numerical value in each diagram is such that its level is close to the bottom $E_c$ of the conduction band or the top $E_v$ of the valence band, and it is appropriate as an impurity for obtaining a voltage close to the energy gap $E_g$. By way of example, for Si which is used most frequently at present, level differences $(E_c-E_d)$ and $(E_a-E_v)$ respectively exhibited by the donor impurities of Li, Sb, P, As and Bi and the acceptor impurities of B, Al and Ga are the smallest, and both the level differences are below about 6% of the energy gap $E_g$ of Si. When a temperature change from 0° K. is neglected, the difference $(E_{fd}-E_{fa})$ of the Fermi levels of N-type Si and P-type Si employing these impurities becomes about 94%–97% of the energy gap $E_g$ of Si, which value is approximately equal to $E_g$. A donor impurity and an acceptor impurity which exhibit the smallest level differences ($E_c - E_d$) and ($E_a - E_v$) next to the above impurities are S (about 16% of $E_g$) and In (about 14% of $E_g$), respectively. The difference ($E_{fd} - E_{fa}$) of the Fermi levels of N-type Si and P-type Si employing the respective impurities becomes about 0.85 $E_g$ at 0° K., and the deviation from the energy gap $E_g$ of Si is as great as about 15%. It is accordingly understood that the deviation is much greater than those of the aforecited impurities.

Thus, one donor impurity selected from the group consisting of Li, Sb, P, As and Bi and one acceptor impurity selected from the group consisting of B, Al and Ga are suitable as the impurity materials of P-type and N-type Si for obtaining a voltage substantially equal to the energy gap $E_g$ of Si. The other impurities will be suited to the end of obtaining voltages considerably smaller than the energy gap $E_g$ of Si.

Physics of Fermi Level $E_f$

Figure 2A:
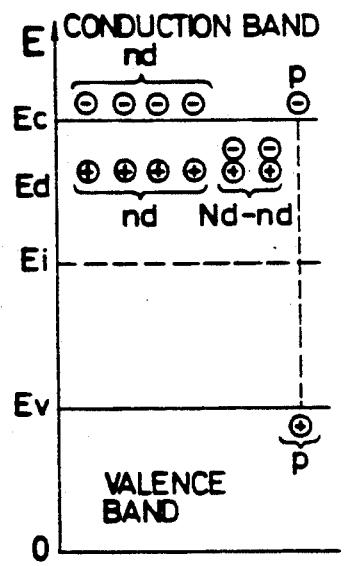
Figure 2B:
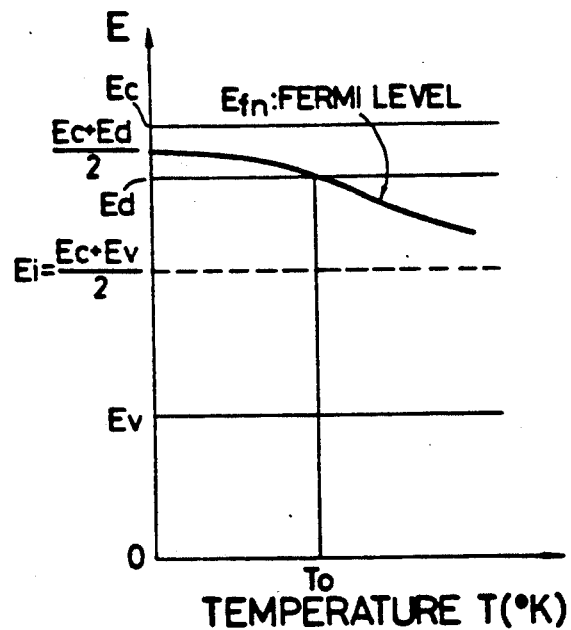
Figure 2C:
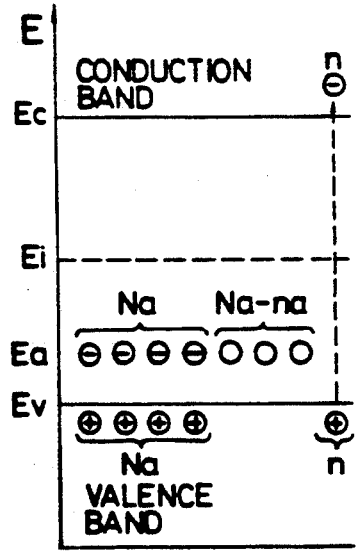
Figure 2D:
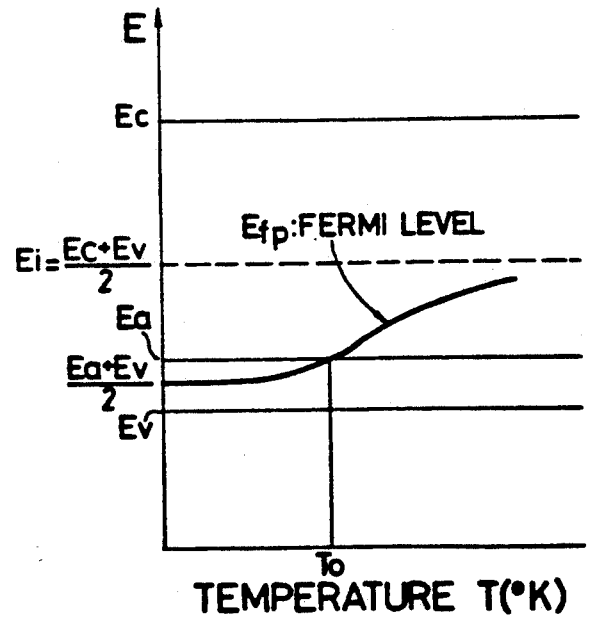

Now, the difference ($E_{fn} - E_{fp}$) of Fermi levels will be explained on physical properties with reference to FIGS. 2(a) to 2(d). These figures are diagrams illustrative of the energy levels of semiconductors. FIGS. 2(a) and 2(b) show the energy level model of an N-type semiconductor and the temperature characteristic thereof respectively, while FIGS. 2(c) and 2(d) show the energy level model of a P-type semiconductor and the temperature characteristic thereof respectively.

Carriers in a semiconductor consist of the sum between electrons $n_d$ created by ionization of donor impurities $N_d$ and electron-hole pairs excited from a valence band. When the donor impurity density $N_d$ is sufficiently high, the number of the excited electron-hole pairs is negligible, and the number of conduction electrons, n becomes:

$$n \simeq n_d \quad (1)$$

$n_d$ and n are respectively evaluated from the probability at which electrons are trapped by the donor level and the number of electrons which exist in a conduction band, and become:

$$n_d = N_d \left( 1 - \frac{1}{1 + \exp\left(\frac{E_d - E_F}{kT}\right)} \right) = N_d \cdot \frac{1}{1 + \exp\left(\frac{E_F - E_d}{kT}\right)} \quad (2)$$

and $$n = N_c \cdot \exp\left(\frac{E_F - E_c}{kT}\right) \quad (3)$$

Here, the effective density of states in the conduction band, $N_c$ becomes:

$$N_c = 2 \left( \frac{2\pi m^*}{h^2} kT \right)^{3/2}$$

where h: Planck's constant, m: effective mass of electron,
k: Boltzmann's constant, and T: lattice temperature.
From Equations (1), (2) and (3), $$N_c \cdot \exp\left(\frac{E_F - E_c}{kT}\right) = \frac{N_d}{1 + \exp\left(\frac{E_F - E_d}{kT}\right)} \quad (4)$$

and $$\frac{N_d}{N_c} = \exp\left(\frac{E_F - E_c}{kT}\right) + \exp\left(\frac{2E_F - E_d - E_c}{kT}\right) \quad (5)$$

Here, since the Fermi level is supposed to lie at a position proximate to the bottom of the conduction band $E_c$, the first term of Equation (5) is negligible, so that:

$$E_F = \tfrac{1}{2}(E_d + E_c) - \tfrac{1}{2}kT\ln\frac{N_c}{N_d} \quad (6)$$

This equation (6) signifies the following. In case where the impurity concentration density $N_d$ is high, not only at a low temperature, but also at the normal temperature, $N_c/N_d$ approximates 1 (one) and $$\ln\frac{N_c}{N_d} \to 0.$$

so that the Fermi level $E_F$ lies at the intermediate point between the bottom $E_c$ of the conduction band and the donor level $E_d$ and that the temperature-dependency becomes substantially equal to the temperature characteristic of $E_c$.

However, in case where the temperature has become sufficiently high, the electron-hole pairs excited from the valence band are predominant, the influences of the impurities lessen and the Fermi level $E_{Fn}$ in the N-type semiconductor comes close to the level $E_j$ of the intrinsic semiconductor. The above relationship is illustrated in FIG. 2(b).

Quite the same applies to a case of a P-type semiconductor containing only an acceptor impurity as shown in FIG. 2(c). When the temperature is low and in case where the acceptor impurity density is high, the Fermi level $E_{Fp}$ in the P-type semiconductor lies at a substantially intermediate position between the top $E_v$ of the valence band and the acceptor level $E_a$. Upon rise of the temperature, it comes close to the Fermi level $E_i$ of the intrinsic semiconductor.

The temperature-dependency of the Fermi level $E_{Fp}$ in the P-type semiconductor is illustrated in FIG. 2(d).

Relation between Temperature Characteristic of Fermi Level $E_f$ and Impurity Density-Concrete Example The relations between the temperature-dependencies of the Fermi levels $E_{fp}$ and $E_{fn}$ and the impurity fensities have been explained on physical properties. Now, by taking as a concrete example the Si semiconductor which is practically used most frequently at present, the difference of the Fermi levels ($E_{fn} - E_{fp}$) and its temperature-dependency in the practical use will be explained with reference to data on page 37 of the aforecited literature. The data are reprinted in FIG. 3.

In conventional processes for manufacturing a Si semiconductor integrated circuit, boron B and phosphorus P are solely used as impurity materials. Their high impurity densities are $10^{20}$ (atoms/cm$^3$). However, even when the donor and acceptor impurity densities $N_d$ and $N_a$ are made $10^{18}$ (atoms/cm$^3$) which is lower by two orders, the difference $(E_{fn}-E_{fp})$ of the Fermi levels of the N-type semiconductor and the P-type semiconductor is $0.5-(-0.5)=1.0$ (eV) at 300° K. as read from FIG. 3, and it is a value comparatively close to the energy gap $E_g \simeq 1.1$ eV at the same temperature. The changes of the difference versus temperatures are from about 1.04 (eV) to 0.86 (eV) in a range of from 200° K. to 400° K. ($-70°$ C. to 130° C.), and the changing rate is 0.9 (mV/°C.). This is a small value of approximately $\frac{1}{3}$ in comparison with 2 to 3 mV/°C. of the rates of changes versus temperatures of the threshold voltage $V_{th}$ of an IGFET and the forward drop voltage $V_F$ of a diode as stated previously.

When the impurity densities are $10^{20}$ cm$^{-3}$ or higher, the Fermi level difference becomes substantially equal to the silicon energy gap $(E_g)_{Si}=1.1$ (V), and the changing rate versus temperatures becomes about 0.2 mV/°C., which is a sufficiently small value.

Accordingly, if the impurity concentrations are about $10^{18}$ cm$^{-3}$ or higher, a temperature-dependency which is, at least, reduced to $\frac{1}{2}-\frac{1}{3}$ of those of the prior arts can be attained. More preferably, the impurity concentrations are $10^{20}$ cm$^{-3}$ or higher (betterment to about 1/10), and most preferably, they are the saturation densities or degenerate densities.

Principle of Deriving Difference of Fermi Levels and Actual Example

Upon what principle can the voltage corresponding to the difference of the Fermi levels $(E_{fn}-E_{fp})$, $(E_{fn}-E_i)$ be taken out? An example is to utilize the difference of the threshold voltages $V_{th}$ of two MOSFETs of channels of the same conductivity type which have semiconductor gate electrodes that are formed on gate insulating films formed under substantially the same conditions on different surface areas of an identical semiconductor body and that are made of materials being of an identical semiconductor substance (for example, silicon) but having different conductivity types. Hereunder, the concrete example will be described.

Each of FIGS. 59 and 60 depicts the conceptual sectional structures of the respective FETs formed within a complementary MOS integrated circuit (CMOSIC). Hereinafter, for the sake of brevity, the MOS transistor whose gate electrode is made of a P$^+$-type semiconductor shall be called the "P$^+$ gate MOS", the MOS transistor whose gate electrode is made of an N$^+$-type semiconductor shall be called the "N$^+$ gate MOS", and the MOS transistor whose gate electrode is made of an intrinsic or i-type semiconductor shall be called the "i gate MOS". In FIG. 60, the left half shows P$^+$, i and N$^+$ gate P-channel MOS transistors, while the right half shows P$^+$, i, and N$^+$ gate N-channel MOS transistors.

The differences of threshold voltages among the MOSFETs (Q$_1$)-(Q$_3$) and (Q$_4$)-(Q$_6$) in FIG. 60 become as in the following table:

TABLE

| | Q$_1$ | Q$_2$ | Q$_3$ | Q$_4$ | Q$_5$ | Q$_6$ |
|---|---|---|---|---|---|---|
| | | (Unit: volt) | | | | |
| Q$_1$ | | 0.55 | 1.1 | — | — | — |
| Q$_2$ | 0.55 | | 0.55 | — | — | — |
| Q$_3$ | 1.1 | 0.55 | | — | — | — |
| Q$_4$ | — | — | — | | 0.55 | 1.1 |
| Q$_5$ | — | — | — | 0.55 | | 0.55 |
| Q$_6$ | — | — | — | 1.1 | 0.55 | |

TABLE-continued

| | Q$_1$ | Q$_2$ | Q$_3$ | Q$_4$ | Q$_5$ | Q$_6$ |
|---|---|---|---|---|---|---|
| | | (Unit: volt) | | | | |
| Q$_5$ | — | — | — | 0.55 | | 0.55 |
| Q$_6$ | — | — | — | 1.1 | 0.55 | |

As will be described in detail later, FIGS. 73(a) to 73(f) illustrate sectional views of principal steps which elucidate that the P$^+$ gate MOS and the N$^+$ gate MOS can be fabricated without altering or adding any step of a conventional process for manufacturing a complementary MOS integrated circuit (CMOS IC).

FIGS. 65(a) and 65(b) or FIGS. 66(a) and 66(b) depict a plan view and a sectional structural view of N$^+$ gate or P$^+$ gate P-channel MOS transistors to be actually used in circuit structures, respectively.

Referring to FIGS. 65(a) and 65(b) or FIGS. 66(a) and 66(b), in order to form a self-alignment structure, a P-type impurity is diffused in both those end parts $E_S$ and $E_D$ of the gate electrode G formed of an i-type or intrinsic semiconductor which are close to a source (S) and a drain (D), for both the P$^+$ gate MOS and the N$^+$ gate MOS because the MOS transistor is of the P-channel in this case. In a central part $C_p$ of the gate electrode G, a P-type impurity is diffused for the P$^+$ gate MOS, and an N-type impurity is diffused for the N$^+$ gate MOS. A region i in which no impurity is diffused is provided between the central region and both the end parts $E_S$ and $E_D$ close to the source and the drain. It is thus considered that the point of difference between the P$^+$ gate MOS and the N$^+$ gate MOS is only whether the region of the central region part $C_p$ of the gate is of the P-type semiconductor or the N-type semiconductor.

In FIGS. 65(a) and 65(b) or FIGS. 66(a) and 66(b), numeral 101 designates an N$^-$ silicon substrate, numeral 108 a P$^+$ source region, numeral 113 a P$^+$ drain region, numeral 105 a gate oxide film, numeral 104 a thick field oxide film, and numeral 111 another oxide film. As understood from FIG. 65(a) or FIG. 66(a), a plurality of P$^+$ source regions 108 are electrically connected in common with one another by an interconnection layer 114, a plurality of P$^+$ drain regions 113 are electrically connected in common with each other by an interconnection layer 112, and a plurality of gate electrodes G are electrically connected in common with one another by an interconnection layer 115.

Further, in order to reduce to the utmost the variation of the effective channel lengths of the MOS transistors attributed to the fact that the P-type impurity diffused regions at both the end parts $E_S$ and $E_D$ of the gate electrodes G formed for the self-alignment shift onto either the left or right side (source side or drain side) at the manufacture on account of the error of a mask alignment, the columns of the source regions and the drain regions are alternately arranged, and the columns are arranged so that the left half and the right half may be put into a line symmetry with respect to the channel direction as a whole. Accordingly, even when the shifting of the mask alignment with respect to the channel direction (leftward or rightward shifting) changes the effective channel lengths of the FETs in the respective columns, the average effective channel lengths of the P$^+$ gate MOS and the N$^+$ gate MOS in the respective columns connected in parallel have the changes cancelled as a whole and become substantially constant.

FIGS. 73(a) to 73(f) illustrate how the P$^+$ gate MOS and the N$^+$ gate MOS are constructed by the use of the conventional manufacturing process for a silicon gate CMOS IC.

Figure 73A:
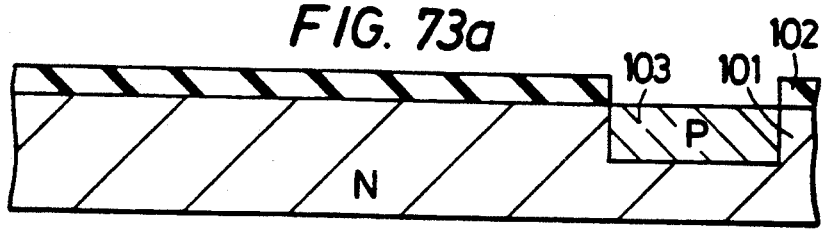
FIGS. 73(a) to 73(f) illustrate that $N^+$ gate (part B) and $P^+$ gate (part A) P-channel MOSFETs are fabricated together with a P-channel FET (part C) and an N-channel FET (part D) which constitute a conventional complementary MOS device.

In FIG. 73(a), numeral 101 designates an N-type silicon semiconductor having a specific resistance of 1Ωcm to 8Ωcm, on which a thermal oxidation film 102 is grown about 4,000 Å to 16,000 Å. In an area of the film, a window for selective diffusion is provided by the photoetching technique. Boron to serve as a P-type impurity is ion-implanted in a quantity of approximately $10^{11}$ to $10^{13}$ cm$^{-2}$ at energy of 50 KeV to 200 KeV, whereupon it is thermally diffused for about 8 to 20 hours, thereby to form a P$^-$ well region 103 which serves as a substrate of an N-channel MOS transistor.

Figure 73B:
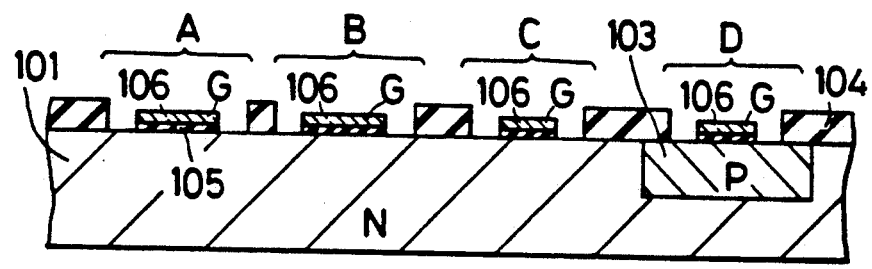

In FIG. 73(b), the thermal oxidation film 102 is fully removed, a new thermal oxidation film 104 is formed about 1 μm to 2 μm, and a region of this film corresponding to the source, drain and gate of the MOS transistor is removed by etching. Thereafter, a gate oxide film 105 which is about 300 Å–1,500 Å thick is formed. On the resultant substrate, polycrystalline Si 106 being of the i-type or intrinsic semiconductor is grown about 2,000 Å to 6,000 Å. By etching, it is removed with the gate part G of the MOS transistor left behind.

Figure 73C:
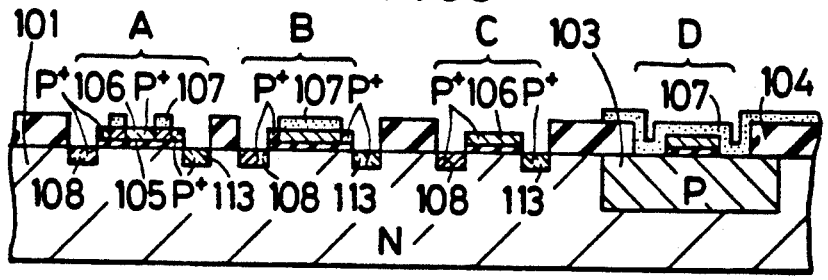

In FIG. 73(c), a mask oxide film 107 is formed by the vapor growth, and its regions under which a P-type impurity is to be diffused are removed by the photoetching technique. Thereafter, boron being the P-type impurity is diffused at a high density of about $10^{20}$ to $10^{21}$ cm$^{-3}$ to form a source region 108 and a drain region 113 of the P-channel MOS transistor and simultaneously to form a gate electrode of a P-type semiconductor.

Figure 73D:
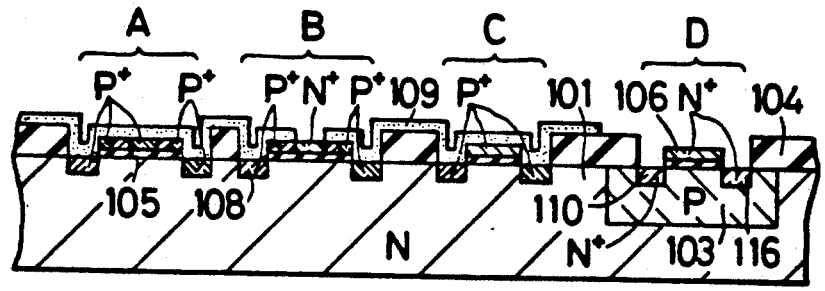

In FIG. 73(d), as in the foregoing, a mask oxide film 109 is formed by the vapor growth, and its regions under which an N-type impurity is to be diffused are removed by the photoetching technique. Thereafter, phosphorus being the N-type impurity is diffused at a high density of about $10^{20}$ to $10^{21}$ cm$^{-3}$, to form a source region 110 and a drain region 116 of the N-channel MOS transistor and simultaneously to form a gate electrode of an N-type semiconductor.

Figure 73E:
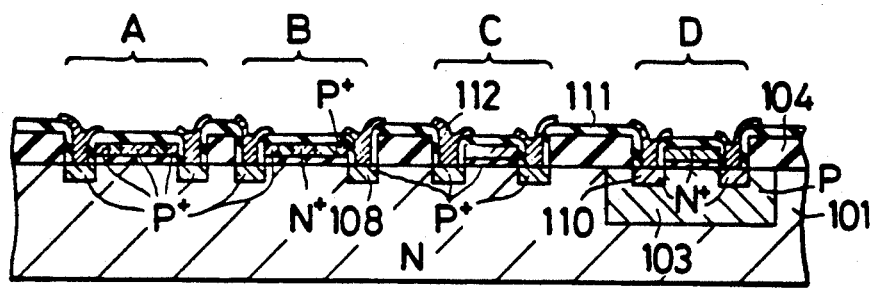

In FIG. 73(e), the oxide film 109 is removed. An oxide film 111 which is approximately 4,000 Å to 8,000 Å thick is formed by the vapor growth, and its region corresponding to an electrode leading-out portion is removed by the photoetching technique. Thereafter, a metal (Aluminum) is evaporated, and an electrode interconnection portion 112 is formed by the photoetching technique.

Figure 73F:
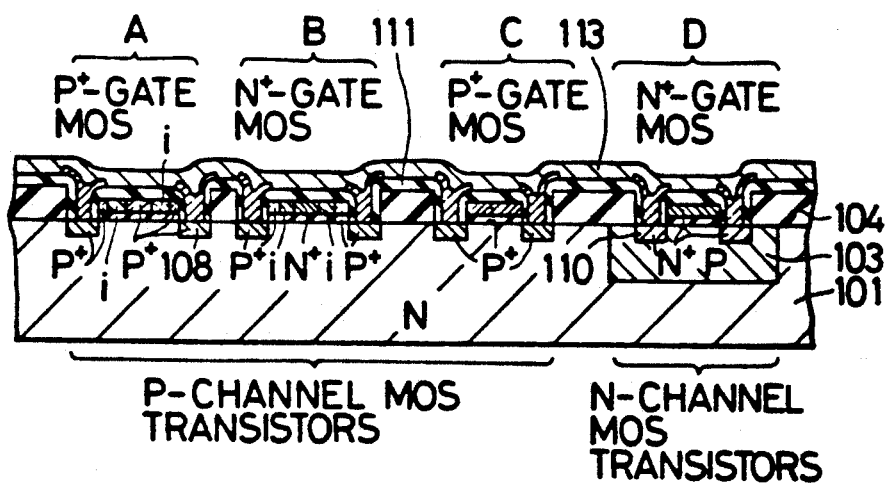

In FIG. 73(f), the resultant substrate is covered with an oxide film being 1 μm to 2 μm thick by the vapor growth.

Now, the threshold voltage of the MOS transistor employing the semiconductor for the gate electrode will be described with reference to FIGS. 5(a) to 5(d). First, in the case of the P+ gate MOS, the following is indicated from an energy band diagram of FIG. 5(a):

$$-q V_G + q \bar{\phi}_{FP} + \frac{E_g}{2} + q \chi = q V_O + q \phi_{srf} + \phi^+_{MP} \quad (7)$$

$$q \chi + \frac{E_g}{2} - q \phi_B$$

$$\phi_{Si}$$

where
- $V_G$: Potential difference between a semiconductor substrate and a gate electrode (P+ semiconductor),
- $\chi$: Electron affinity,
- $E_g$: Energy gap,
- $\phi_{srf}$: Surface potential of an N-type semiconductor substrate,
- $\phi_{FP}$: Fermi potential of a P-type semiconductor with reference to the Fermi potential of an intrinsic semiconductor,
- $\phi_B$: Fermi potential of the N-type semiconductor substrate with reference to the Fermi potential of the intrinsic semiconductor
- q: Unit charge of electron,
- $V_O$: Potential difference applied to an insulator,
- $E_c$: Bottom of a conduction band,
- $E_v$: Top of a valence band,
- $E_i$: Fermi level of the intrinsic semiconductor.

In Equation (7), the work function of the gate electrode is denoted as $\phi_{MP}+$ in potential, and the work function of the semiconductor is similarly denoted as $\phi_{Si}$. Then, $$\phi^+_{MP} = \chi + \frac{E_g}{2q} + \phi^+_{FP} \quad (8)$$

$$\phi_{Si} = \chi + \frac{E_g}{2q} - \phi_F \quad (9)$$

Therefore, $$V_O = -V_G + \phi_{MP}^+ - \phi_{Si} - \phi_{Srf} \quad (10).$$

Figure 5A:
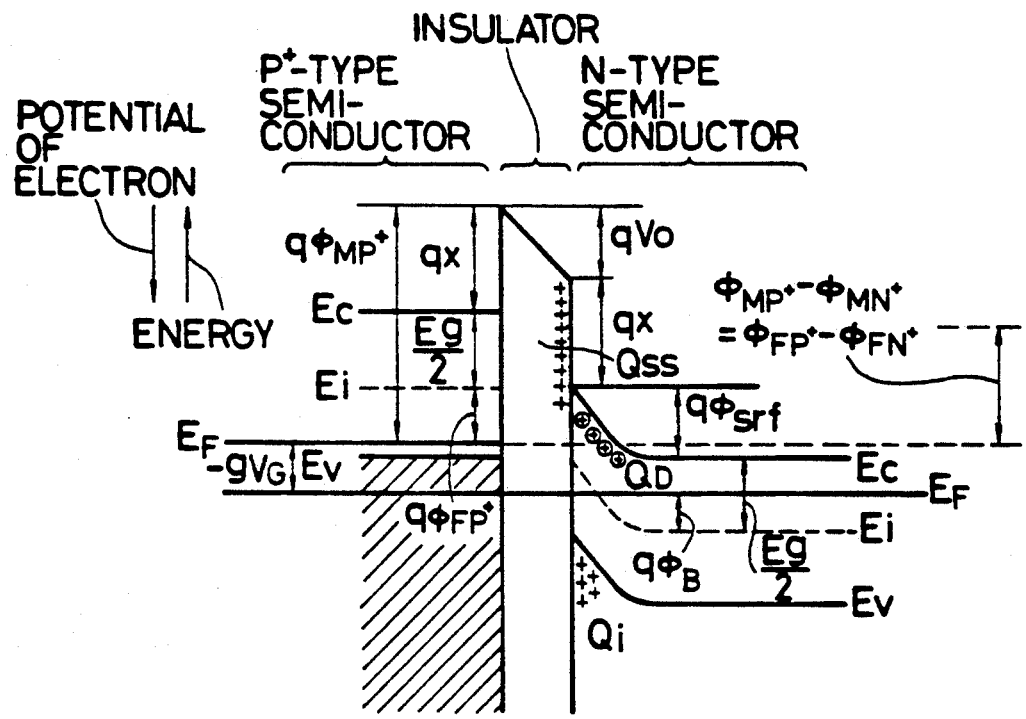
Figure 5B:
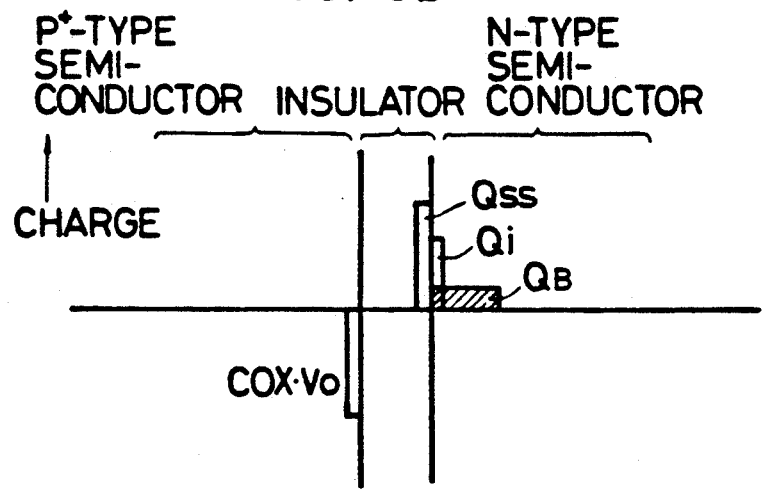

From the relation of charges in FIG. 5(b), $$-C_{OX} \cdot V_O + Q_{SS} + Q_i + Q_B = 0 \quad (11)$$

where
- $C_{OX}$: Capacitance of the insulator per unit area,
- $Q_{SS}$: Fixed charges in the insulator,
- $Q_B$: Fixed charges due to ionization of impurities in the semiconductor substrate,
- $Q_i$: Carriers formed as a channel.

From (10) and (11), $$-C_{OX}(-V_G + \phi_{MP}^+ - \phi_{Si} - \phi_{Srf}) + Q_{SS} + Q_i + Q_D = 0 \quad (12).$$

The gate voltage $V_G$ at the time when the channel $Q_i$ is formed is the threshold voltage. Therefore, letting $V_{thp}^+$ denote the threshold voltage of the P+ gate MOS, $$V_{thp}^+ = V_G|_{Q=0} = \phi_{MP}^+ - \phi_{Si} - \phi_{Srf} - \frac{Q_{SS}}{C_{OX}} - \frac{Q_D}{C_{OX}} \quad (13)$$

At this time, $\phi_{Srf} = 2\phi_F$.

Likewise, in the N+ gate MOS transistor, only the work function $\phi_{MN}^+$ of the gate electrode differs as follows:

$$\phi_{MN}^+ = \chi + \frac{E_q}{2q} + \phi_{FN}^+ \quad (14)$$

Accordingly, the threshold voltage $V_{thN}{}^+$ of the N+ gate MOS becomes:

$$V_{thN}^+ = \phi_{MN}^+ - \phi_{Si} - \phi_{Srf} - \frac{Q_{SS}}{C_{OX}} - \frac{Q_D}{C_{OX}} \quad (15)$$

where $\phi_{Srf} = 2\phi_F$.

Figure 5C:
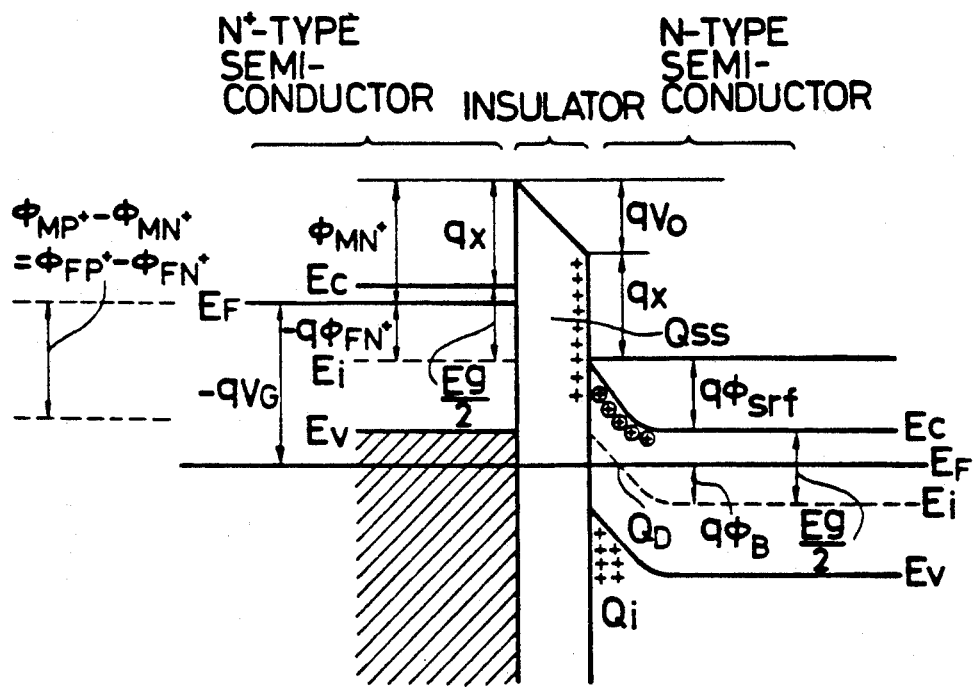
FIGS. 5(c) and 5(d) are diagrams showing the energy state and the states of charges of an N+-type semiconductor-insulator-N-type semiconductor structure respectively.
Figure 5D:
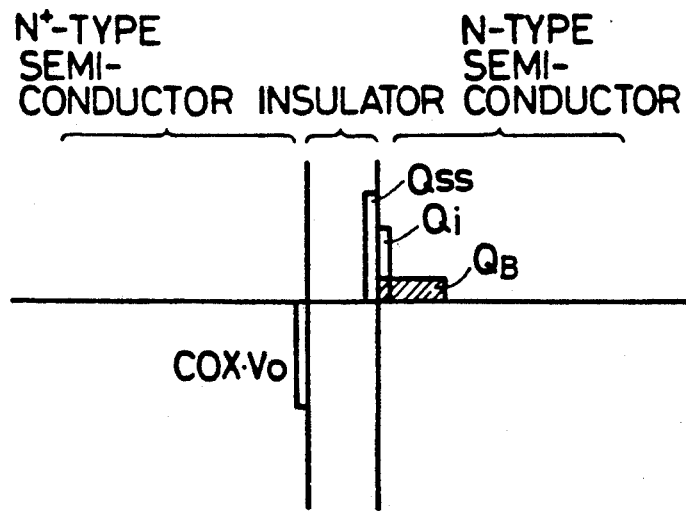

Thus, the difference $V_{thP}{}^+ - V_{thN}{}^+$ of the threshold voltages of the P+ gate MOS and the N+ gate MOS becomes:

$$V_{thP}^+ - V_{thN}^+ = \phi_{MP}^+ - \phi_{MN}^+ = \phi_{FP}^+ - \phi_{FN}^+ \quad (16)$$

which is equal to the difference of the Fermi potentials of the semiconductors making up the gate electrodes. This can be readily understood from the fact that, when FIGS. 5(a) and 5(c) are compared, the gate voltage at the time when the same charge profile is established is equal to the difference of the work functions of the gate electrodes and the difference of the Fermi levels.

While the above description has been made by taking the P−-channel MOS transistor as an example, quite the same applies to the case of the N−-channel MOS transistor.

From the above, it has been understood that a voltage substantially equal to the energy gap $E_g$ can be derived as the difference of the threshold voltages of the P+ gate MOS and the N+ gate MOS. As another method, the voltage of the energy gap $E_g$ can be derived with the difference of the threshold voltage of a MOS whose gate electrode is made of an intrinsic semiconductor (hereinbelow, written as the "i gate MOS") and the threshold voltage of the P+ gate MOS or the N+ gate MOS.

Letting $V_{thi}$ denote the threshold voltage of the i gate MOS, since the Fermi level of the intrinsic semiconductor is 0 (zero) (as the Fermi level of the intrinsic semiconductor is made the reference), the difference of the threshold voltages of the i gate MOS and the P+ gate MOS is:

$$|V_{thi} - V_{thP}^+| = |0 - \phi_{FP}^+| \approx \tfrac{1}{2} E_g \quad (17)$$

The difference of the threshold voltages of the i gate MOS and the N+ gate MOS becomes:

$$|V_{thi} - V_{thN}^+| = |\phi_{FN}^+ - 0| \approx \tfrac{1}{2} E_g \quad (18)$$

It is readily understood that the differences become a voltage of just a half of the energy gap $E_g$.

The voltage which is obtained owing to the difference of the threshold voltages of the i gate MOS and the P+ gate or N+ gate MOS is very useful in that it is approximately 0.55 V and suitable for a low reference voltage source, and that as will be stated later, a reference voltage source of high precision is easily obtained, not only by the manufacturing process of the CMOS integrated circuit, but also by the manufacturing process of single-channel MOS integrated circuit because the doping of gate electrodes with an impurity can be carried out by one step.

FIGS. 67(a) and 67(b) to FIGS. 72(a) and 72(b) depict plan patterns and sectional structures along lines A—A in the plan patterns, of P+ gate, i gate and N+ gate P-channel and N-channel MOS transistors to be actually used in circuit structures.

In the various figures, as similar to the cases of FIGS. 65(a) and 65(b) or FIGS. 66(a) and 66(b), P- or N-type regions of a source and a drain are formed by the diffusion of an impurity by employing polycrystalline Si for a mask. In order to allow a margin for the mask alignment between the mask for selectively diffusing a P-type impurity or an N-type impurity and the source and drain regions, the same impurity as that of the source and drain regions is diffused in both end parts $E_S$ and $E_D$ of a gate electrode G adjoining the source S and drain D in both the P+ gate MOS and the N+ gate MOS. In, for example, the P-channel MOS, boron which is the P-type impurity is diffused. In a central part of the gate electrode, a P-type impurity is diffused for the P+ gate MOS, and an N-type impurity is diffused for the N+ gate MOS.

FIGS. 67(a) and 67(b), FIGS. 68(a) and 68(b) and FIGS. 69(a) and 69(b) represent plan views and sectional views of P-channel MOS transistors of the P+ gate, i gate and N+ gate, respectively, while FIGS. 70(a) and 70(b), FIGS. 71(a) and 71(b) and FIGS. 72(a) and 72(b) represent N-channel MOS transistors of the N+ gate, i gate and P+ gate, respectively.

In FIGS. 67(a) and 67(b) to FIGS. 72(a) and 72(b), in order to reduce to the utmost the variation of the effective channel lengths of the MOS transistors attributed to the fact that those regions at both the end parts $E_S$ and $E_D$ of the gate electrodes G which are formed for the self-alignment and in which the same impurity as that of the source and drain regions is diffused shift to either the left or right side (source side or drain side) at the manufacture on account of the error of the mask alignment, the columns of the source regions and the drain regions are alternately arranged, and the columns are arranged so that the left half and the right half may be put into a line symmetry with respect to the channel direction as a whole. Accordingly, even when the shifting of the mask alignment with respect to the channel direction (leftward or rightward shifting) changes the effective channel lengths of the FETs in the respective columns, the average effective channel lengths of the P+ gate MOS, i gate MOS and the N+ gate MOS in the respective columns connected in parallel have the changes cancelled as a whole and become substantially constant.

FIGS. 74(a) to 74(d) illustrate how the P+ gate MOS and the N+ gate MOS are constructed in the conventional silicon gate CMOS manufacturing process.

Figure 74A:
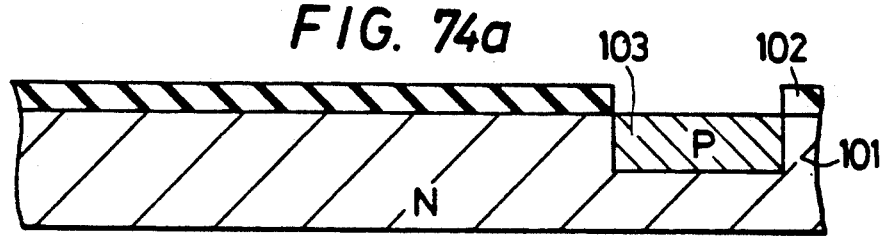
FIGS. 74(a) to 74(d), FIGS. 75(a) to 75(d), FIGS. 76(a) to 76(d) and FIGS. 77(a) to 77(d) show sectional view in the principal steps in the case of manufacturing two MOSFETs according to this invention together with a complementary MOS device, respectively.

In FIG. 74(a), numeral 101 designates an N-type silicon semiconductor having a specific resistance of 1Ωcm to 8Ωcm, on which a thermal oxidation film 102 is grown about 4,000 Å–16,000 Å. In an area of the film, a window for selective diffusion is provided by the photoetching technique. Boron to serve as a P-type impurity is ion-implanted in a quantity of approximately $10^{11}$–$10^{13}$ cm$^{-2}$ at energy of 50 KeV–200 KeV, whereupon it is thermally diffused for about 8–20 hours, thereby to form a P− well region 103 which serves as a substrate of an N-channel MOS transistor.

Figure 74B:
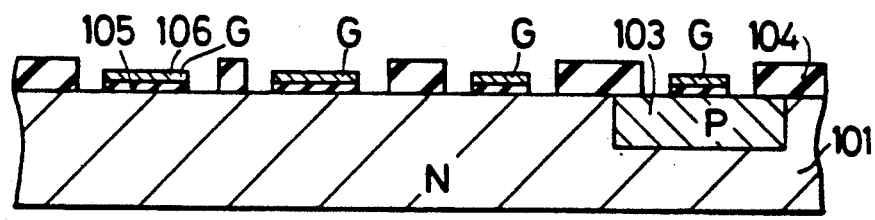

In FIG. 74(b), the thermal oxidation film 102 is entirely removed, a new thermal oxidation film 104 is formed about 1 μm–2 μm, and a region of this film corresponding to the source, drain and gate of the MOS transistor is removed by etching. Thereafter, a gate oxide film 105 which is about 300 Å–1,500 Å thick is formed. On the resultant substrate, polycrystalline Si 106 being of the i-type or intrinsic semiconductor is grown about 2,000 Å-6,000 Å. By etching, it is removed with the gate part G of the MOS transistor left behind.

Figure 74C:
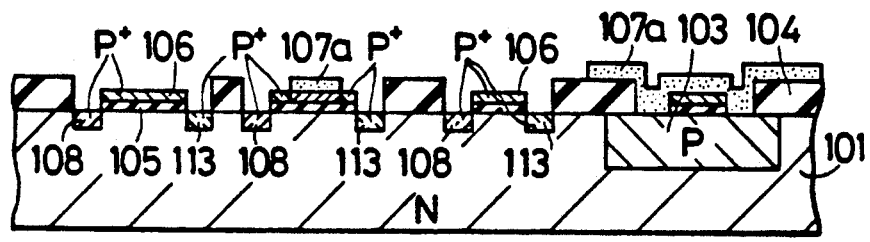

In FIG. 74(c), a mask oxide film 107 is formed by the vapor growth, and its regions under which a P-type impurity is to be diffused are removed by the photoetching technique. Thereafter, boron to become the P-type impurity at a high density of about $10^{20}$–$10^{21}$ cm$^{-3}$ is diffused, to form a source region 108 and a drain region 113 of the P-channel MOS transistor and simultaneously to form a gate electrode of a P-type semiconductor.

Figure 74D:
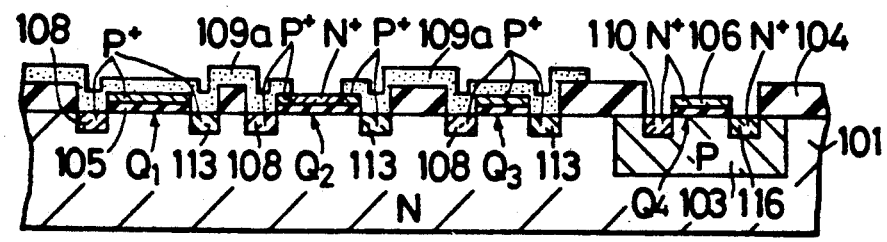

In FIG. 74(d), as in the foregoing, a mask oxide film 109 is formed by the vapor growth, and its regions under which an N-type impurity is to be diffused are removed by the photoetching technique. Thereafter, phosphorus to become the N-type impurity at a high concentration of about $10^{20}$–$10^{21}$ cm$^{-3}$ is diffused, to form a source region 110 and a drain region 116 of the N-channel MOS transistor and simultaneously to form a gate electrode of an N-type semiconductor.

Subsequently, the oxide film 109 is removed. An oxide film which is approximately 4,000 Å–8,000 Å thick is formed by the vapor growth, and its part corresponding to an electrode leading-out portion is removed by the photoetching technique. Thereafter, a metal (Aluminum) is evaporated, and an electrode interconnection portion is formed by the photoetching technique.

Subsequently, the resultant substrate is covered with an oxide film being 1 μm–2 μm thick by the vapor growth.

Here, in FIG. 74(d), Q$_3$ and Q$_4$ indicate MOS transistors which constitute a conventional CMOS inverter, and Q$_1$ and Q$_2$ indicate P$^+$ gate and N$^+$ gate MOS transistors for generating a reference voltage.

Figure 75A:
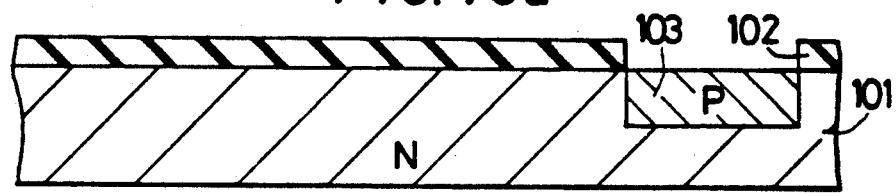
Figure 75B:
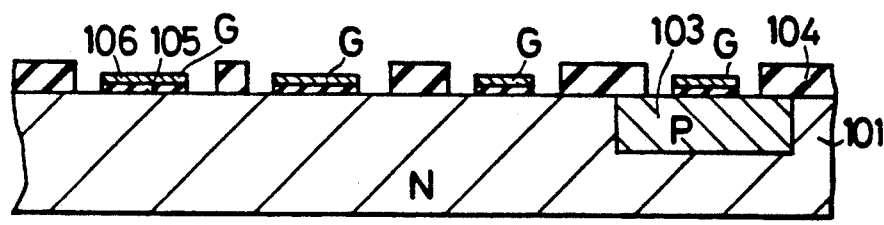
Figure 75C:
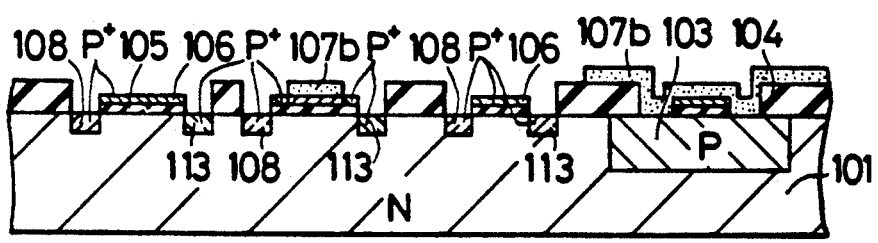
Figure 75D:
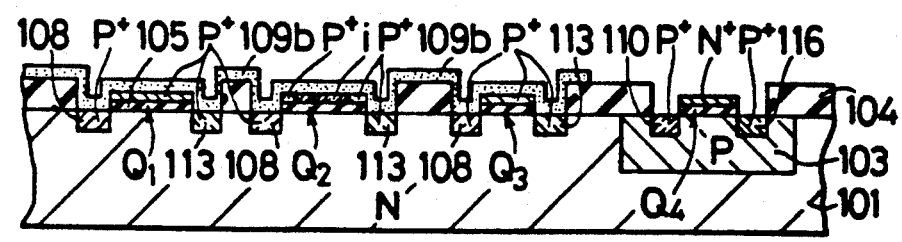
Figure 76A:
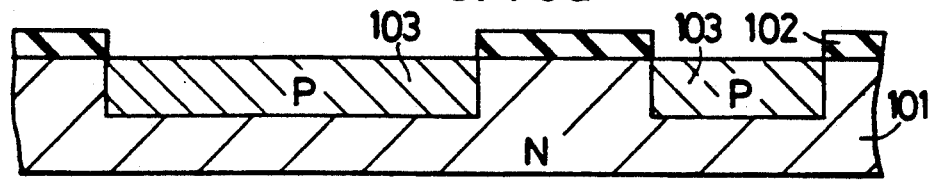
Figure 76B:
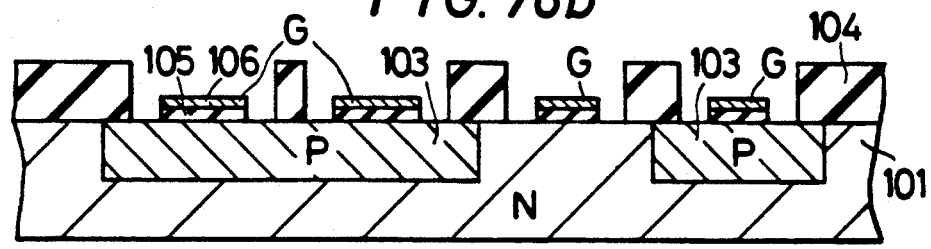
Figure 76C:
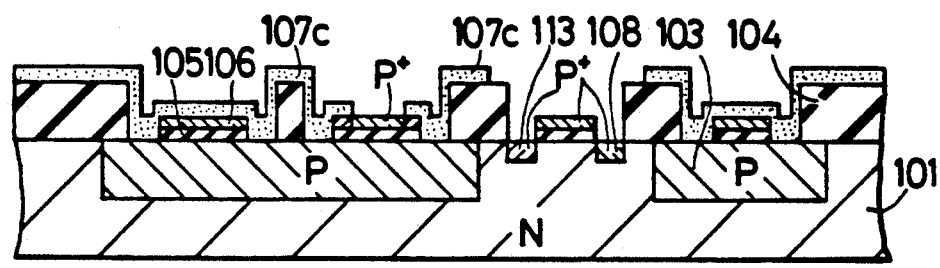
Figure 76D:
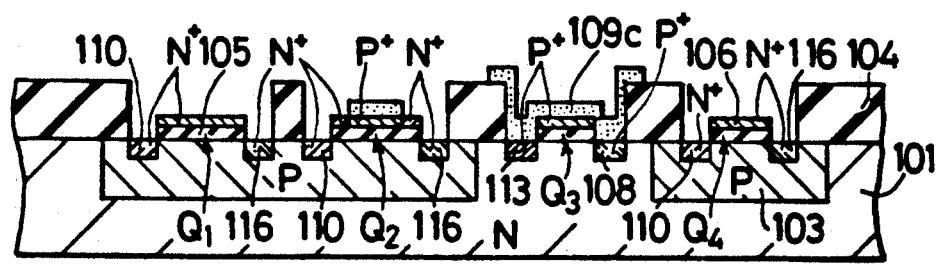
Figure 77A:
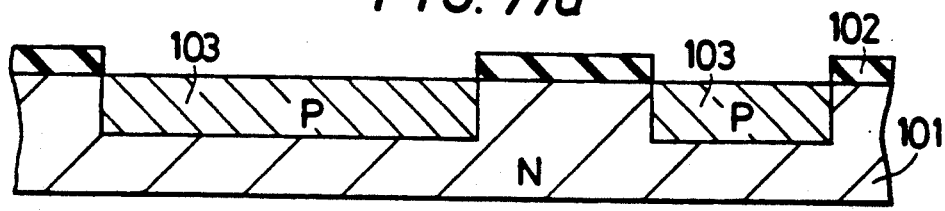
Figure 77B:
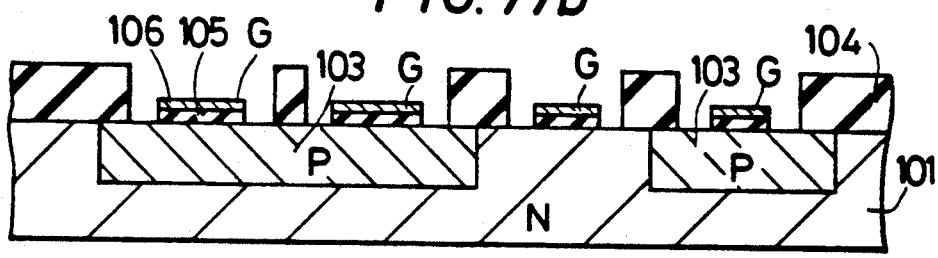
Figure 77C:
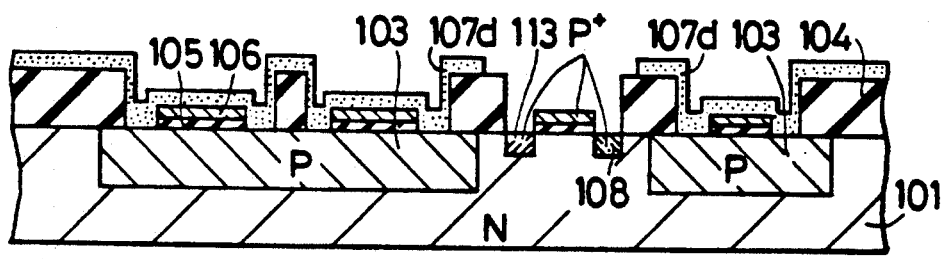
Figure 77D:
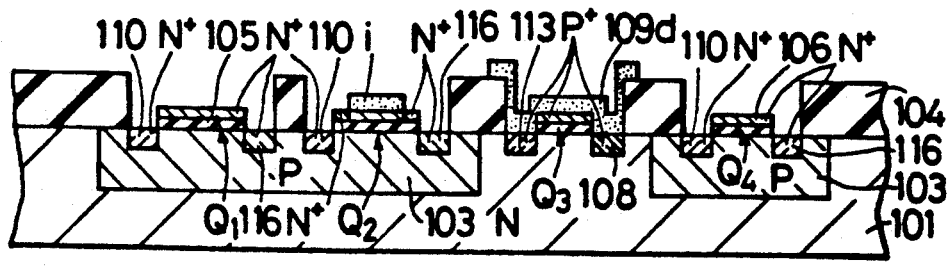

FIGS. 75(a) to 75(d) show sections in the manufacturing process of P$^+$ gate MOS and i gate MOS transistors of the P-channel type. In this example, the steps up to FIG. 75(c) are the same as those up to FIG. 74(c). In FIG. 75(d), however, the N-type impurity is diffused without removing an oxide film 109b overlying the gate of the MOSFET Q$_2$.

FIGS. 76(a) to 76(d) show sections in the manufacturing process of P$^+$ gate MOS and N$^+$ gate MOS transistors of the N-channel type.

FIGS. 77(a) to 77(d) show sections in the manufacturing process of N$^+$ gate MOS and i gate MOS transistors of the N-channel type.

Now, a process of manufacturing an N-channel MOS semiconductor integrated circuit will be explained with reference to sections illustrated in FIGS. 78(a) to 78(e).

(1) A P-type semiconductor substrate 101 having a specific resistance of 8–20 Ωcm is prepared, and a thermal oxidation film 102 which is 1 μm thick is formed on the surface of the substrate.

(2) In order to expose the semiconductor substrate surface corresponding to portions in which MISFETs are to be formed, selected parts of the thermal oxidation film are etched.

Figure 78A:
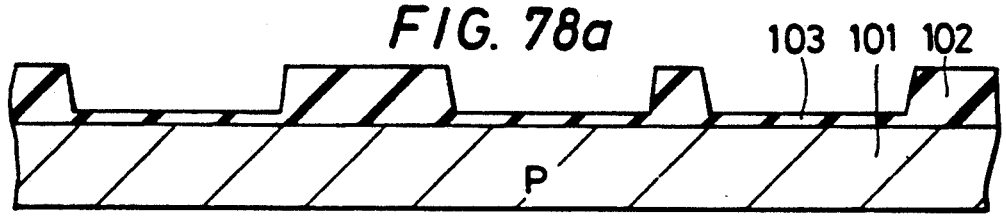
FIGS. 78(a) to 78(e) show sectional views in the various steps of manufacture in the case of N-channel MOSFETs.
Figure 78B:
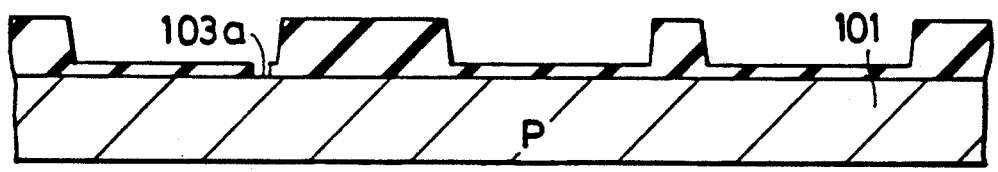
Figure 78C:
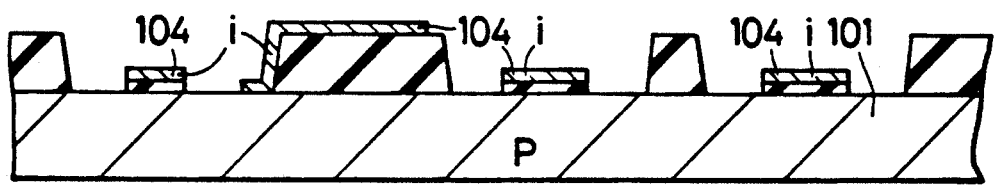
Figure 78D:
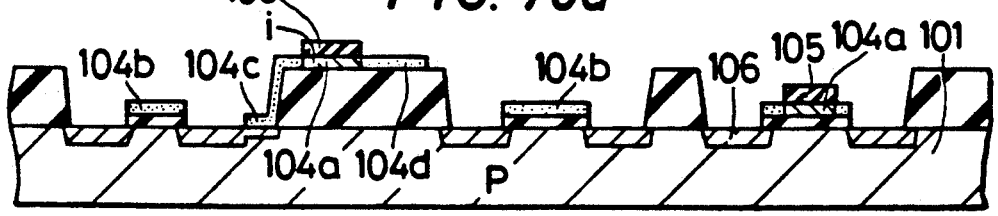
Figure 78E:
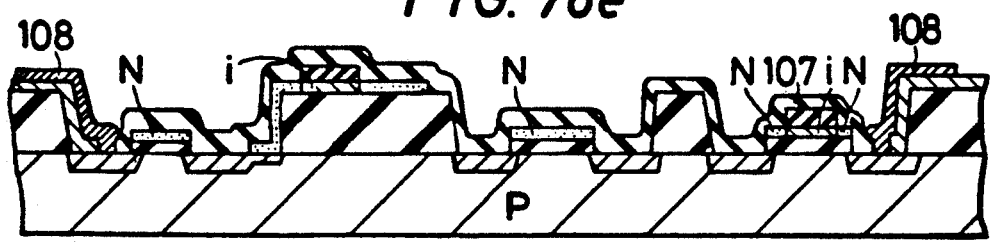
Figure 79A:
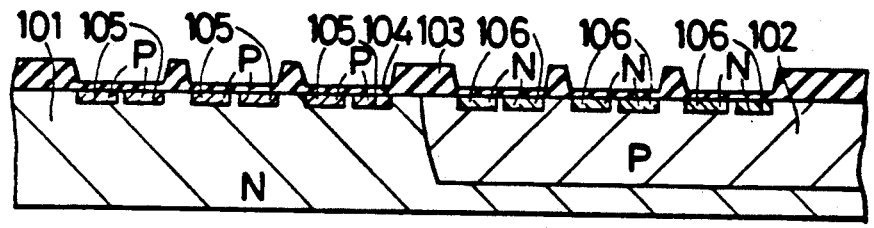
FIGS. 79(a) to 79(e), FIGS. 80(a) to 80(d) and FIGS. 81(a) to 81(d) are sectional views in various steps for explaining a method of manufacturing MOSFETs for use in a reference voltage generator circuit device according to this invention, respectively.
Figure 79B:
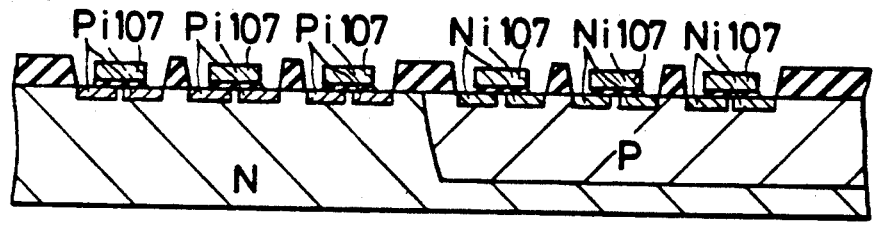
Figure 79C:
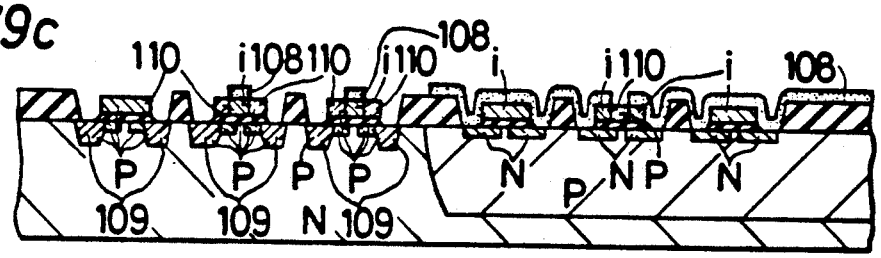
Figure 79D:
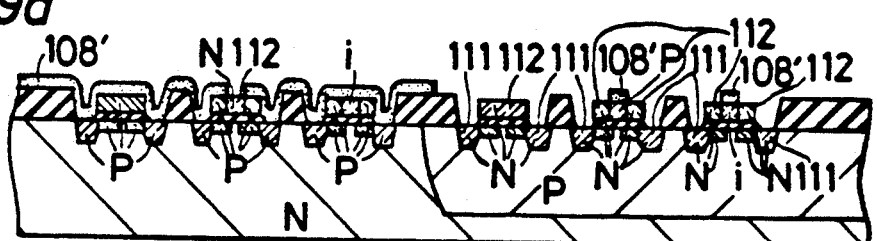
Figure 79E:
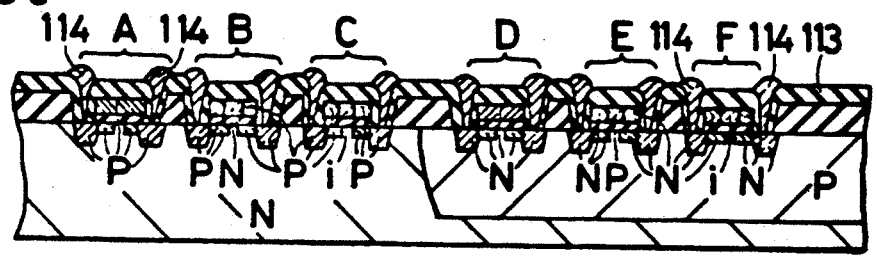
Figure 80A:
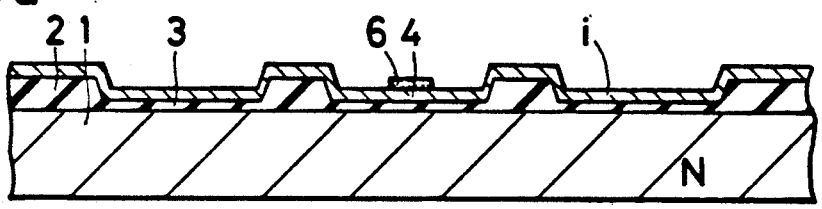
Figure 80B:
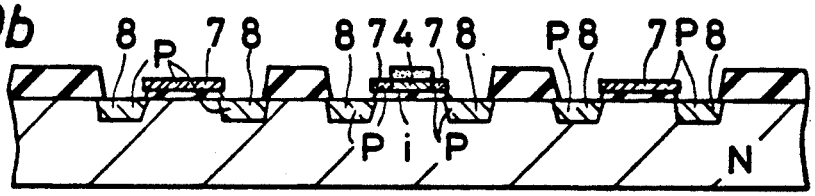
Figure 80C:
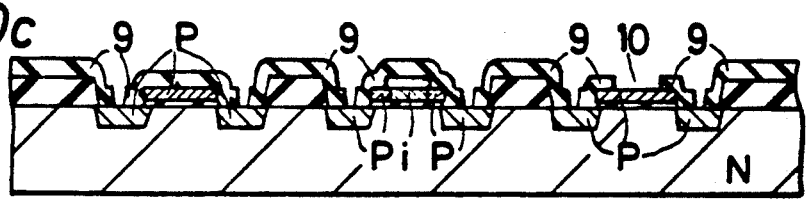
Figure 80D:
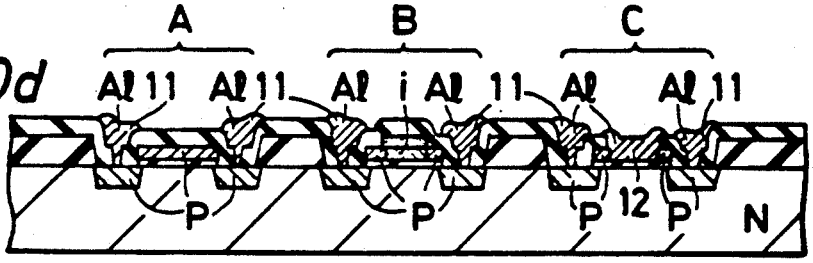

(3) Thereafter, a gate oxide film (SiO$_2$) 103 which is 750 to 1,000 Å thick is formed on the exposed semiconductor substrate surface (FIG. 78(a)).

(4) That part of the gate oxide film 103 which is to come into direct contact with a polycrystalline silicon layer is selectively etched, to form a direct contact hole 103a. (FIG. 78(b)).

(5) Silicon is deposited by the CVD (Chemical Vapor Deposition) process onto the whole major surface of the semiconductor substrate 101 having the oxide film 102, the gate oxide film 103 and the contact hole 103a, to form the polycrystalline silicon layer which is 3,000 to 5,000 Å.

(6) Selected parts of the polycrystalline silicon layer 104 being of the i-type or intrinsic semiconductor are etched. (FIG. 78(c)).

(7) A CVD-mask SiO$_2$ film is deposited to a thickness of 2,000 to 3,000 Å on the whole major surface of the semi-conductor substrate 101 by the CVD process.

(8) The CVD-mask SiO$_2$ film 105 is selectively left only at high resistance parts such as memory cell load resistors, and on the polycrystalline silicon layer of intrinsic level gate portions 104a. (FIG. 78(d)).

(9) Phosphorus is diffused into the semiconductor substrate 101, to form source regions and drain regions 106 at an impurity density of $10^{20}$ atoms/cm$^3$. At this time, the impurity is also introduced into the polycrystalline silicon layer, to form gate electrodes 104b, a direct contact 104c and a polycrystalline silicon interconnection portion 104d. (FIG. 78(d)).

(10) A PSG (Phospho-Silicate-Glass) film 107 is formed at a thickness of 7,000 to 9,000 Å on the entire major surface of the semiconductor substrate 101.

(11) Al (aluminum) is thereafter evaporated on the whole area of the major surface of the semiconductor substrate 101, to form an Al film 108 which is 1 mm thick.

(12) The Al film is selectively etched to form interconnection regions 108. (FIG. 78(e)).

Figure 58:
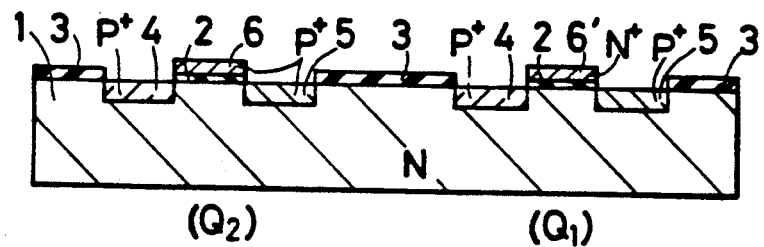
FIG. 58 is a structural sectional view of two MOSFETs which have threshold voltages different from each other in accordance with this invention, FIG. 59 schematically shows sectional structures of $p^+$ gate and $N^+$ gate MOSFETs usable for deriving the difference ($E_{fn} - E_{fp}$) of the Fermi levels of N-type and P-type semiconductors, in which the left half shows a P-channel FET while the right half shows an N-channel FET, FIG. 60 also schematically shows sectional structures of $p^-$ gate and $N^+$ gate MOSFETs usable for deriving the difference ($E_{fn} - E_{fp}$) of the Fermi levels of N-type and P-type semiconductors, in which the left half shows a P-channel FET while the right half shows an N-channel FET, FIG. 61 similarly shows a structure of two P-channel MOSFETs which have threshold voltages different from each other.

The principle of deriving the difference of Fermi levels described above and actual examples will be briefly explained again. Elements shown in FIG. 58 are enhancement type p-channel MISFETs (Q$_1$) and (Q$_2$) which are formed on an n-type semiconductor substrate (1). The gate electrodes of the respective MISFETs are made of conductor layers which are constructed in such a way that polycrystalline silicon layers are doped with semiconductor impurities of different conductivity types. More specifically, the MISFETs (Q$_1$, Q$_2$) are fabricated as follows. As shown in FIG. 58, p$^+$-type semiconductor regions (4, 5) to form the sources and drains of MISFETs are selectively formed on an n-type semiconductor substrate (1). Gate insulating films (2) are formed on the areas of the surface of the semiconductor substrate between the opposing source and drain regions (4, 5), and polycrystalline silicon layers 6 and 6' are formed on the gate insulating films (2). The polycrystalline silicon layer to constitute the gate (6') of one MISFET (Q$_1$) is doped with a semiconductor impurity of the same conductivity type as that of the substrate (n-type). The polycrystalline silicon layer to constitute the gate (6) of the other MISFET (Q$_2$) is doped with a semiconductor impurity of the conductivity type opposite to that of the substrate (p-type).

The threshold voltages (V$_{thQ1}$, V$_{thQ2}$) of the respective MISFETs (Q$_1$, Q$_2$) in the above construction are evaluated from the following equations (19) and (20):

$$V_{thQ1} = \phi_{Mn} + \frac{Q_{ss}}{C_{ox}} + \frac{Q_D}{C_{ox}} \tag{19}$$

$$V_{thQ2} = \phi_{Mp} + \frac{Q_{ss}}{C_{ox}} + \frac{Q_D}{C_{ox}} \tag{20}$$

Here, $\phi_{Mn}$ and $\phi_{Mp}$ denote the work functions between the gates of the respective MISFETs ($Q_1$, $Q_2$) and the substrate, $C_{ox}$ the gate capacitance per unit ares, $Q_{ss}$ the surface charge, and $Q_D$ the charge of a substrate depletion layer.

When the difference of the threshold voltages of both the MISFETs ($Q_1$, $Q_2$) is evaluated, it becomes the difference ($\phi_{Mp}-\phi_{Mn}$) between the work functions which are the first terms of the right-hand sides of Equations (19) and (20), and it can be derived as a voltage which corresponds to the energy gap of silicon. Since this voltage becomes a voltage stipulated by the energy gap of silicon, deviations in the manufactureing process are not involved. In addition, the temperature-dependency is extremely little. The reason why the threshold voltages of MISFETs exhibit great deviations is that the second terms ($Q_{ss}/Q_{ox}$) and the third terms ($Q_D/C_{ox}$) on the right-hand sides of Equations (19) and (20) fluctuate depending upon the conditions of manufacture. In this embodiment, the the MISFETs ($Q_1$, $Q_2$) are manufactured under the same conditions, whereby the second terms and third terms on the right-hand sides of Equations (19) and (20) are made substantially equal. By evaluating the difference between the right-hand sides, the second and third terms are canceled. Thus, the magnitude equivalent to the energy gap is used as an output voltage.

Figure 61:
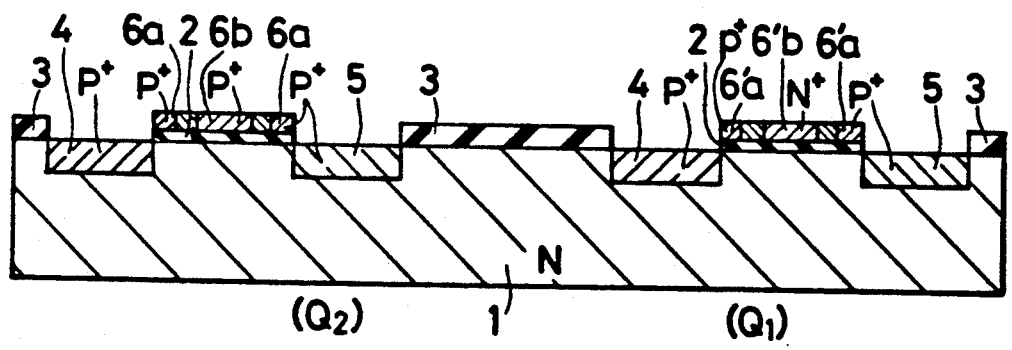

Since the MISFET ($Q_2$) has the source, drain and gate electrode formed by the use of the semiconductor impurity of an identical conductivity type, the conventional manufacturing technology of a silicon gate MISFET in which the semiconductor impurity diffusions of its source and drain and its gate electrode are simultaneously carried out can be employed. On the other hand, the gate electrode of the MISFET ($Q_1$) cannot be formed simultaneously with the source and drain thereof and accordingly needs to be formed by a separate step. In this regard, a method is considered wherein the MISFETs ($Q_1$, $Q_2$) as above described are formed while employing the conventional manufacturing technology of the silicon gate MISFET in which a gate insulating film and a field insulating film are used as a mask. Alternatively, a measure illustrated in FIG. 61 is considered. More specifically, those parts (6a, 6a') of gate electrodes (6, 6') of MISFETs ($Q_1$, $Q_2$) which are proximate to sources and drains are made gate electrode portions in which a p-type semiconductor impurity of the same conductivity type as that of the sources and drains is diffused. The central parts of the gate electrodes which are not doped with any semiconductor impurity, that is, which are made of the intrinsic semiconductor (i-type) are selectively formed with a gate electrode portion (6b) in which a p-type impurity is diffused and a gate electrode portion (6b') in which an n-type semiconductor impurity is diffused, respectively. Herein, the parts doped with no semiconductor impurity have been disposed in consideration of the misregistration of the mask alignment in the case of forming the gate electrode portions (6b, 6b') of the different semiconductor impurities in the selected regions. In this method, the gate electrode portions (6a, 6b) of the MISFET ($Q_2$) are formed by the same step as that for the diffusion of the source and drain.

Each of the MISFETs in the above construction has a gate electrode which is made up of the plurality of gate electrode portions. The plurality of gate electrode portions are connected in common and the difference of threshold voltages of both the MISFETs ($Q_1$, $Q_2$) are taken, whereby threshold voltage components based on the electrode portions of the same structures (gate electrode portions 6a and 6a', and i-type electrode portions) in both the MISFETs ($Q_1$, $Q_2$) are canceled. In addition, regarding the MISFETs owing to the gate electrode portions (6b, 6b'), the second and third terms on the right-hand sides of Equations (19) and (20) are not canceled. As the difference voltage, there is obtained the voltage which corresponds to the silicon energy gap being the difference of the work function between the central parts (6b, 6b') of the gate electrodes and the substrate as described previously, and which is approximately 1.1 V.

Figure 62:
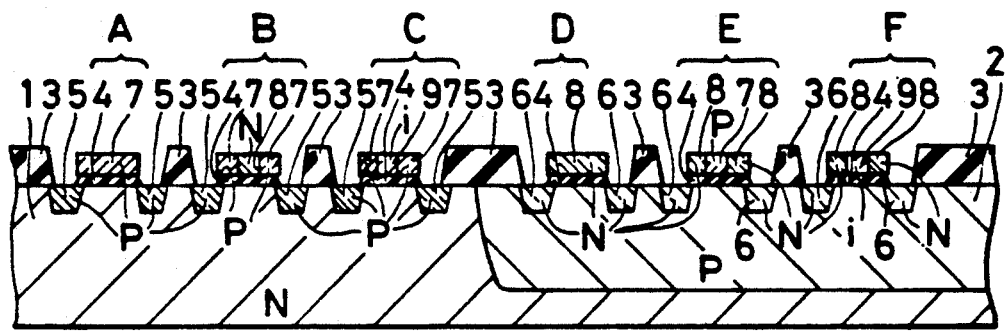
FIGS. 62 and 63 are sectional views each showing the essential portions of MOSFETs which are required for the construction of this invention and which have gate electrodes of different Fermi levels.

FIG. 62 shows a complementary insulated gate fieldeffect transistor integrated circuit (CMOSIC) according to another embodiment of this invention. P-channel MOS transistors A, B and C are formed on an N-type silicon body 1, while N-channel MOS transistors D, E and F are formed on a well layer 2 in which a P-type impurity is diffused at a low concentration. A reference voltage generator device is constructed by exploiting the difference of the threshold voltages of the MOS transistors A and B, the MOS transistors A and C or the MOS transistors B and C, or the difference of the threshold voltages of the MOS transistors D and E, the MOS transistors D and F or the MOS transistors E and F. Here, numeral 3 designates a thick field oxide film (SiO$_2$), and numeral 4 a gate oxide film (SiO$_2$). Numeral 5 designates a P-type semiconductor region for the source or drain of the P-channel MOSFET, and numeral 6 an N-type semiconductor region for the source or drain of the N-channel MOSFET. Numeral 7 indicates P-type polycrystalline silicon, numeral 8 N-type polycrystalline silicon, and numeral 9 the intrinsic semiconductor or i-type polycrystalline silicon. The reference voltage generator device derives the Fermi level difference among the materials 7, 8 and 9 in the form of the voltage.

Figure 63:
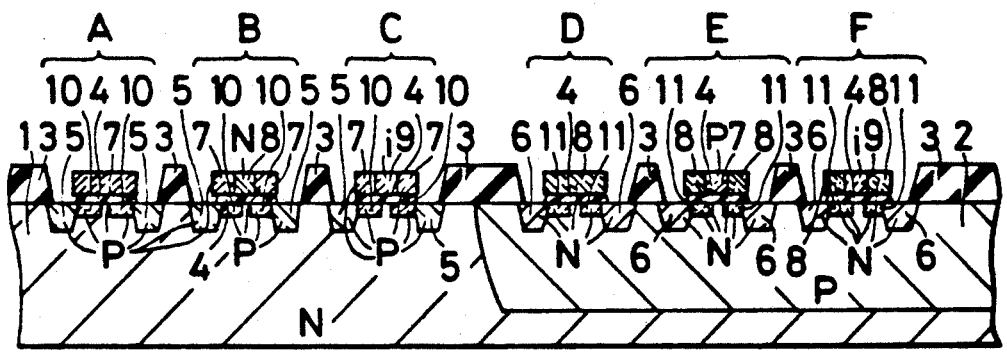

FIG. 63 shows an embodiment which is a further improvement on the embodiment of FIG. 62. P-type impurity layers 10 shown in FIG. 63 are disposed under the gate oxide films 4 in a manner to overlap with the central parts 8 and 9 of the gate electrodes of the respective transistors B and C in FIG. 62, and the transistor A is also provided with a P-type impurity layer 10 so as to have an effective channel length equal to those of the transistors B and C. Further, N-type impurity layers 11 shown in FIG. 63 are disposed under the gate oxide films 4 in a manner to overlap with the central parts 7 and 9 of the gate electrodes of the respective transistors E and F in FIG. 62, and the transistor D is also provided with an N-type impurity layer 11 so as to have an effective channel length equal to those of the transistors E and F. The effective channel lengths of the transistors A, B and C or the transistors D, E and F can be made substantially equal by disposing the P-type impurity layers 10 or the N-type impurity layers 11. Accordingly, the characteristics between the drain currents and gate voltages of the transistors A, B and C or the transistors D, E and F become curves which are parallel to one another and which shift in the direction of the gate voltage axis by the differences of the Fermi levels of the polycrystalline silicon materials at the central parts of the gate electrodes of these transistors. Therefore, the differences of the threshold voltages of the transistors can be derived at high precision in reference voltage generator circuits to be described later.

The temperature-dependencies of the differences of the threshold voltage of the three sorts of IGFETs are very small because the temperature-dependencies of the differences of the Fermi levels of the gate electrode semiconductors are low.

FIGS. 79(a) to 79(e) illustrate a method of manufacturing the CMOSIC shown in FIG. 63.

(a) A low concentration P-type well region 102 is formed in an N-type silicon body 101 by the conventional selective diffusion process. Subsequently, a field oxide film 103 is formed. After forming a gate oxide film 104 in recesses of the film 103, a P-type impurity layers 105 and an N-type impurity layers 106 are formed by the conventional selective ion implantation processes.

(b) Polycrystalline silicon gate electrodes 107 are formed by the conventional chemical vapor deposition and photoetching. At this stage, the electrodes 107 are of the intrinsic semiconductor.

(c) A mask oxide film 108 is formed on selected areas by the chemical vapor deposition. Using it as a mask, source and drain layers 109 of P-channel MOSFETs and P-type polycrystalline layers 110 are formed by the selective diffusion of a P-type impurity.

(d) A mask oxide film 108' is formed on selected areas by the chemical vapor deposition again. Using it as a mask, source and drain layers 111 of N-channel MOSFETs and N-type polycrystalline layers 112 are formed by the selective diffusion of an N-type impurity.

(e) A phosphosilicate glass film 113 is deposited, contact holes are formed therein, and aluminum electrodes 114 are formed. Then, the device is completed.

Figure 64:
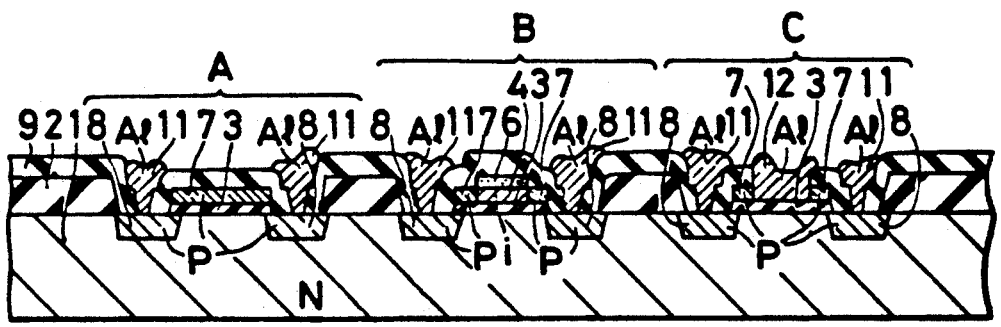
FIG. 64 is a sectional view of the essential portions of MOSFETs which constitute a reference voltage generator device according to this invention.
Figure 65A:
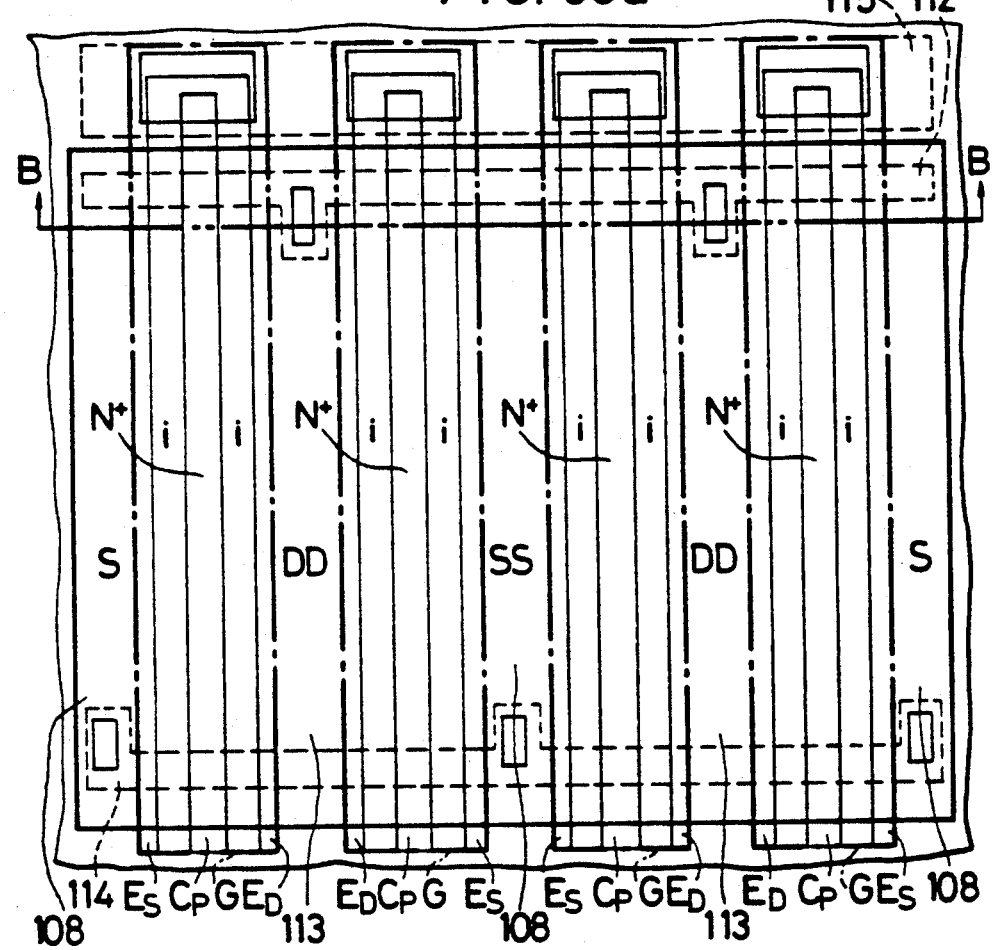
FIGS. 65(a) and 65(b) are plan view and a sectional view of an $N^+$ gate P-channel MOSFET respectively the sectional views being taken along lines indicated by arrows in the corresponding plan views.
Figure 65B:
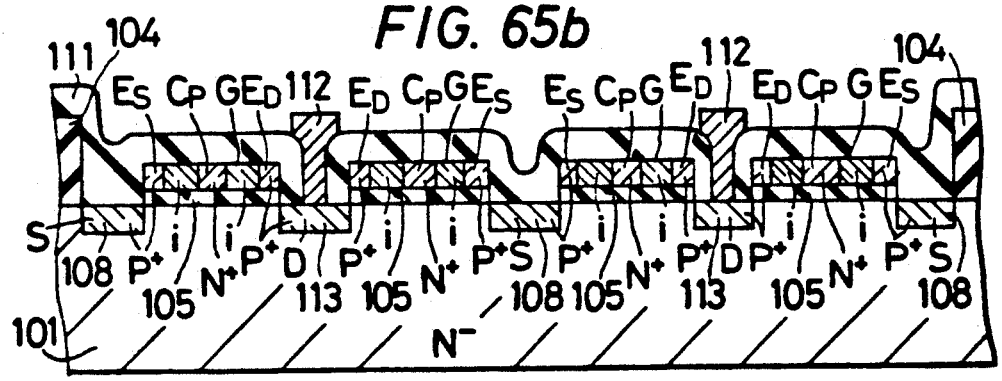
Figure 66A:
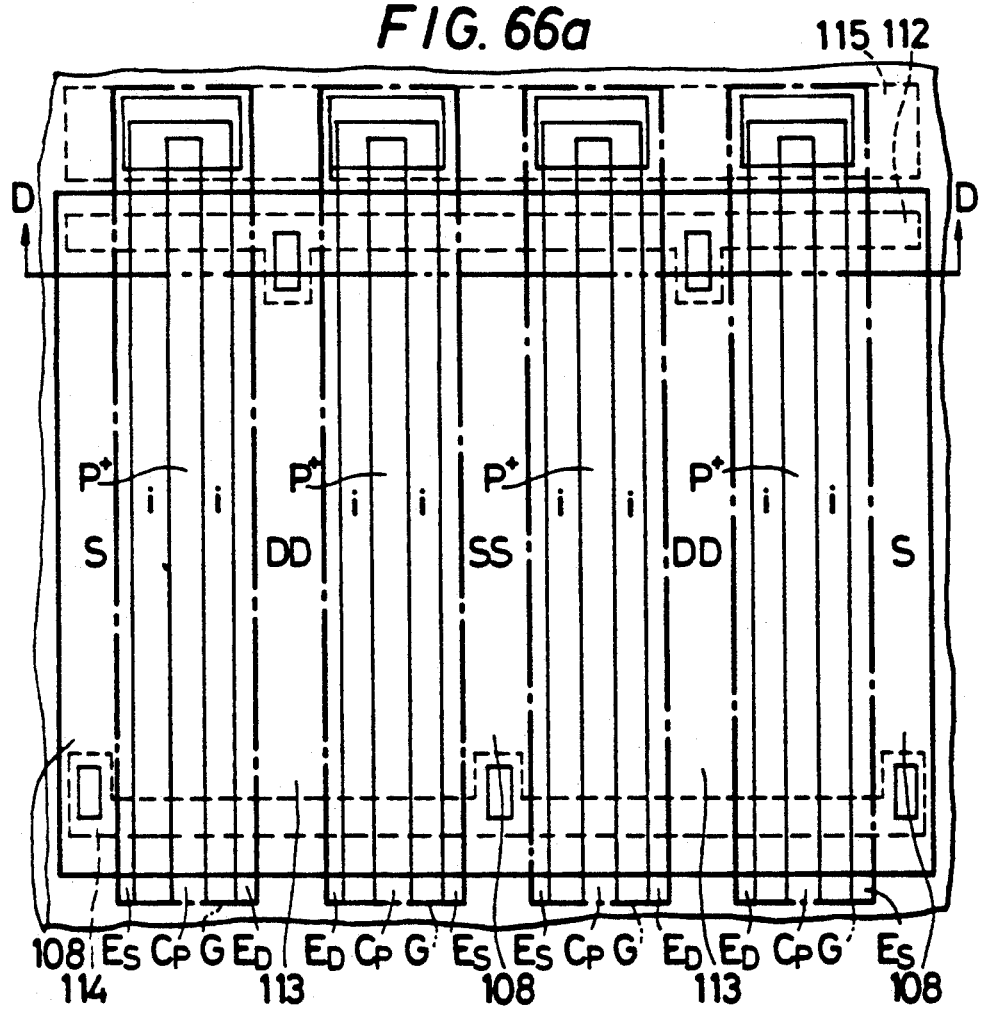
FIGS. 66(a) and 66(b) are a plan view and a sectional view of a $P^+$ gate P-channel MOSFET, respectively.
Figure 66B:
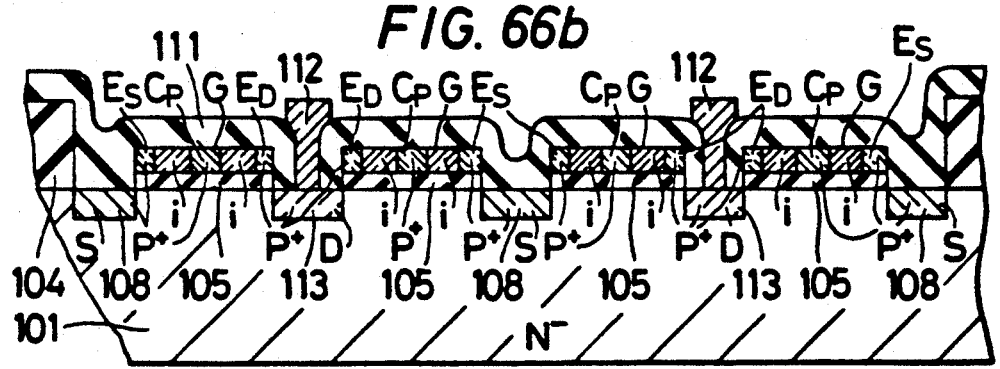

FIG. 64 shows another embodiment of the structure of IGFETs which constitute the reference voltage generator device of this invention and which have gate electrodes of different Fermi levels. Here, IGFETs A, B and C have a gate electrode which is made of P-type silicon 7, a gate electrode whose both ends are made of P-type silicon 7 and whose central part is made of intrinsic silicon 4 and a gate electrode whose both ends are made of P-type silicon 7 and whose central part is made of aluminum 12, respectively. These gate electrodes are overlying on the gate oxide films (SiO$_2$) 3 which are formed on different surface areas of an identical N-type silicon body 1 under substantially the same conditions. Further, the IGFETs have source and drain layers 8. As to the threshold voltages, when the threshold voltage $V_{TH}$ of the IGFET A is made $-0.8$ V, that of the IGFET B becomes approximately $-1.40$ V, and that of the IGFET C becomes approximately $-1.95$ V. They produce differences which are substantially equal to the differences of the Fermi levels of the Si and Al materials at the central parts of the gate electrodes.

This embodiment has been made with note taken of the fact that the temperature-dependency of the difference of approximately 1.15 eV between the Fermi levels of the high concentration P-type silicon and the aluminum or the difference of approximately 0.60 eV between the Fermi levels of the intrinsic silicon and the aluminum is low.

FIGS. 80(a) to 80(d) illustrate an embodiment of a method of manufacturing a P-channel IGFET integrated circuit which includes all the IGFETs A, B and C shown in FIG. 64.

(a) A thick field oxide film (SiO$_2$) 2 having recesses is formed on the surface of an N-type silicon body 1, a gate oxide film 3 is formed in the recesses, and a polycrystalline silicon layer 4 is deposited by the chemical vapor deposition. The polycrystalline silicon layer 4 is of the intrinsic semiconductor. Further, a mask oxide film 6 is formed on a part of the layer 4 by the chemical vapor deposition. (b) The polycrystalline silicon layer is selectively removed by the conventional photoetching process, and a P-type impurity such as boron is thermally diffused, to form source and drain layers 8 and P-type polycrystalline silicon layers 7. At this time, the part of the polycrystalline silicon layer 4 covered with the oxide film 6 is held intrinsic.

(c) An insulating film 9 such as phosphosilicate glass film owing to the chemical vapor deposition is deposited, and contact holes are formed therein. At this time, a contact hole 10 is also formed in the central part of a gate electrode in an area to become an IGFET C.

(d) Aluminum electrodes 11 and 12 are formed, and a heat treatment is conducted at 380° to 540° C. for 30 minutes to 3 hours. Then, the polycrystalline silicon at the contact hole 10 diffuses towards the upper surface of the aluminum layer owing to its alloying reaction with the aluminum, and a structure in which the aluminum and the gate oxide film lie in direct contact is established. The method of manufacturing the P-channel IGFET integrated circuit as illustrated in FIGS. 80(a) to 80(d) is also applicable to the manufacture of a complementary MIS integrated circuit substantially as it is.

The alloying reaction may be replaced with an expedient in which the central part of the gate electrode is removed by photoetching, whereupon aluminum is brought into direct contact with the gate insulating film.

The reference voltage generator device based on such a construction exhibits a small temperature-dependency and small manufacturing deviations, so that it can be utilized for various electronic circuits.

Figure 81A:
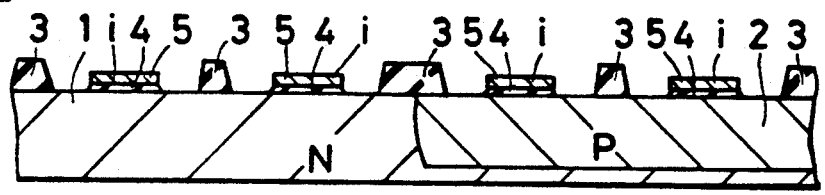
Figure 81B:
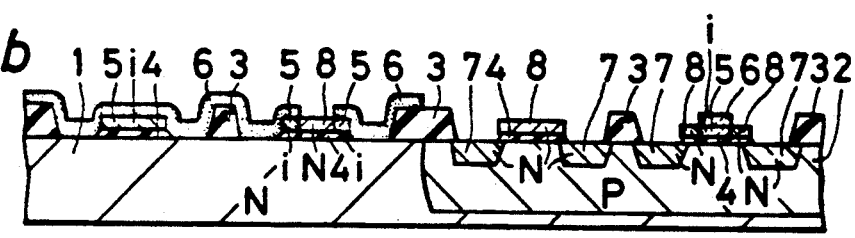
Figure 81C:
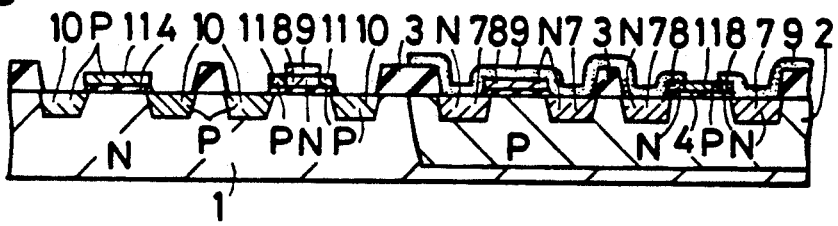
Figure 81D:
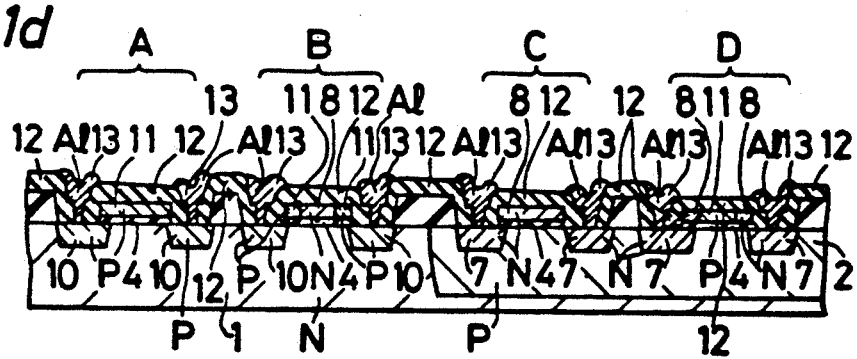

FIG. 81(d) shows the structure of IGFETs A, B, C and D which have threshold voltage differences based on the Fermi level differences of gate electrodes in accordance with another embodiment of this invention. The IGFET A is a P-channel MOSFET having a gate electrode made of P-type silicon 11, while the IGFET B is a P-channel MOSFET having a gate electrode whose both end parts are made of P-type silicon 11 and whose central part is made of N-type silicon 8. The IGFET C is an N-channel MOSFET having a gate electrode made of N-type silicon 8, while the IGFET D is an N-channel MOSFET having a gate electrode whose both end parts are made of N-type silicon 8 and whose central part is made of P-type silicon 11. A reference voltage generator device is constructed by employing a voltage based on the difference of the threshold voltages of the MOSFETs A and B or the MOSFETs C and D.

FIGS. 81(a) to 81(d) illustrate a method of fabricating a MOS integrated circuit which includes the IGFETs A, B, C and D.

(a) A P-type well region 2 is formed in an N-type silicon body 1, and a thick field oxide film 3 having recesses is formed. Thereafter, a gate oxide film 4 is formed in the recesses of the oxide film 3, and a film 5 of polycrystalline silicon being the intrinsic semiconductor is deposited and worked by the photoetching process.

(b) A mask oxide film 6 is formed on selected areas by the chemical vapor deposition. Using it as a mask, an N-type impurity such as phosphorus is diffused into selected regions, whereby N-type regions 7 to become the sources and drains of N-channel MOSFETs and N-type polycrystalline layers 8 are formed.

(c) A mask oxide film 9 is formed on selected areas by the chemical vapor deposition. Using it as a mask, a P-type impurity such as boron is ion-implanted, whereby P-type regions 10 to become the sources and drains of P-channel MOSFETs and P-type polycrystalline silicon layers 11 are formed. Here, in case of using boron, the oxide film 9 is made about 3,000 Å thick, and an implantation energy of 30 to 50 KeV and an implantation quantity of $2 \times 10^{15}$ to $1 \times 10^{16}/cm^2$ are appropriate. The activation of the implanted ions is suitably done by a heat treatment at 900° C. for 10 minutes to at 1,000° C. for 30 minutes.

The diffusion of the N-type impurity in the step (b) may be performed after the step (c). In this case, the N-type impurity diffusion indicated in the step (b) had better be executed by the ion implantation of phosphorus or the like. In case of using phosphorus here, the oxide film 6 is made about 3,000 Å thick, and an implantation energy of 60 to 100 KeV and an implantation quantity of $2 \times 10^{15}$ to $1 \times 10^{16}/cm^2$ are appropriate. Suitable for the activation of the implanted ions is a heat treatment at 900° C. for 10 minutes to at 1,000° C. for 30 minutes. By carrying out the doping with the P-type impurity in this manner, the heat treatment after the doping with the P-type impurity can be relieved, so that the channel portions can be prevented from being doped with the P-type impurity.

(d) After depositing a phosphosilicate glass film 12 by the chemical vapor deposition, contact holes are formed, and aluminum electrodes 13 are formed. Then, the device is finished.

Referring again to FIG. 58, another embodiment of this invention will be described. In the figure, a P-channel MOSFET ($Q_1$) has a gate electrode made of N-type polycrystalline silicon 6', and a P-channel MOSFET ($Q_2$) has a gate electrode made of P-type polycrystalline silicon 6.

Since these FETs are manufactured under substantially the same conditions except the conductivity types of the gate electrodes, the difference of the threshold voltages $V_{th}$ of both the FETs becomes substantially equal to the difference of the Fermi levels of the P-type silicon and the N-type silicon. The gate electrodes are doped with respective impurities near the saturation densities, and the difference becomes substantially equal to the energy gap $E_g$ of silicon (approximately 1.1 V). The $V_{th}$-difference can be taken out at high precision by making the channel dimensions of both the FETs equal, and it is utilized as a reference voltage source.

Since a reference voltage generator device based on such a construction exhibits a small temperature-dependency and small manufacturing deviations, it can be used for various electronic circuits.

In FIG. 58, numeral 1 designates an N-type silicon body, numeral 3 a thick field oxide film, numeral 2 a gate oxide film, numeral 4 a P-type source region, and numeral 5 a P-type drain region. Here, the N-type polycrystalline silicon gate 6' has a structure which is doped with both an N-type impurity and a P-type impurity, the density of the N-type impurity being 1.5 times or more higher than the density of the P-type impurity. Alternatively, it has a structure which is doped with an N-type impurity, almost no P-type impurity being contained, and nevertheless, which is self-aligned with the source and drain.

The reason why the density of the N-type impurity needs to be 1.5 times or more higher than the density of the P-type impurity is as follows. In the ordinary high-density impurity doping techniques, the control of a density is subject to diviations of (set value±20%) or so. Accordingly, the ratio between the deviations of the N-type impurity density and the P-type impurity density becomes $(1.5 \pm 0.3)/(1.1 \pm 0.2)$. Since the minimum value of this ratio becomes 1/1, the Fermi level of the polycrystalline silicon doped with both the N-type and P-type impurities varies greatly.

In order to allow some extent of manufacturing dispersion, accordingly, the ratio of the impurity densities needs to be 1.5 or greater without fail.

Figure 82A:
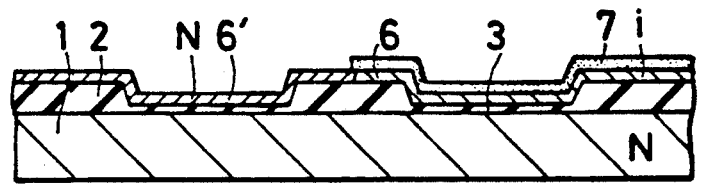
FIGS. 82(a) and 82(b) and FIGS. 83(a) to 83(d) show sectional views in various steps for explaining another method of manufacturing MOSFETs for use in a reference voltage generator circuit device according to this invention, respectively.
Figure 82B:
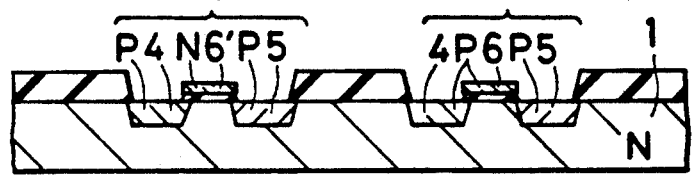

FIGS. 82(a) and 82(b) illustrate a method of manufacturing IGFETs for setting the ratio of the impurity densities at 1.5 or greater.

(a) An N-type silicon body 1 at a comparatively low impurity density (for example, below $5 \times 10^{16}$ cm$^{-3}$) is oxidized to form a thick oxide film 2 for isolating elements. After forming a gate oxide film 3 in recesses of the film 2, an intrinsic semiconductor polycrystalline silicon film at 6 and 6' is deposited by the chemical vapor deposition. Further, a mask oxide film 7 is formed on a selected area by the chemical vapor deposition. Using the oxide film 7 as a mask, the polycrystalline silicon film 6' is doped with an N-type impurity such as phosphorus or arsenic selectively and at a high density (for example, above $5 \times 10^{18}$ cm$^{-3}$). Thus, the N-type polycrystalline silicon film 6' is obtained.

(b) After removing the mask oxide film 7, the working of a polycrystalline silicon gate electrode is done by the photoetching, and source and drain impurity layers 4 and 5 are formed at a low density (for example, below $3.3 \times 10^{18}$ cm$^{-3}$) by the thermal diffusion of a P-type impurity such as boron. Here, the density of the N-type impurity with which the polycrystalline film 6' is doped in the stage (a) is made 1.5 times or more higher than the density of the P-type impurity with which the polycrystalline silicon film 6' is doped at the time of the P-type impurity diffusion in the stage (b), whereby the polycrystalline silicon gate 6' is held at the N-type.

Figure 83A:
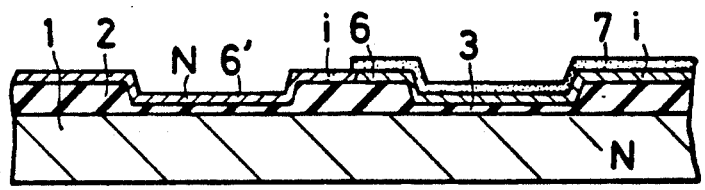
Figure 83B:
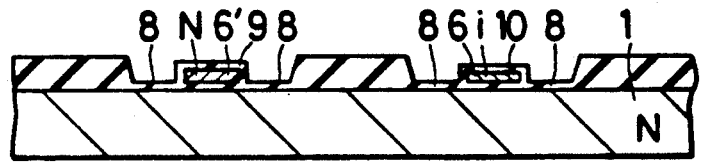
Figure 83C:
Figure 83D:
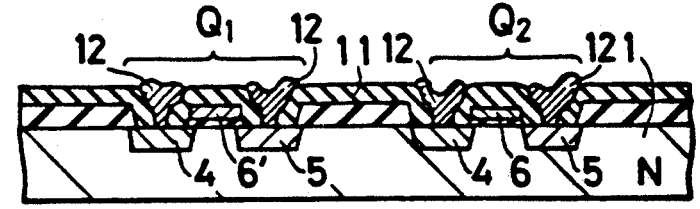

FIGS. 83(a) to 83(d) illustrate another method of manufacture according to this invention. FIG. 83(a) shows the same manufacturing step as in FIG. 82(a).

(b) After removing the mask oxide film 7, the processing of a polycrystalline silicon gate electrode is done by the photoetching. Thereafter, using the polycrystalline silicon gates 6 and 6' as a mask, the gate oxide film which overlies parts corresponding to sources and drains to be formed is removed, whereupon the resultant silicon body is subjected to an oxidation in the steam at 750° C. to 900° C. for 60 seconds to 600 seconds. In the oxidation, the oxide film-growth rate of the silicon surface depends upon the density of an impurity contained in the silicon. Especially when the impurity density is at least $5 \times 10^{18}$ cm$^{-3}$, preferably $10^{20}$ cm$^{-3}$ or higher, the oxide film-growth rate becomes a very great value. Therefore, comparatively thin oxide films 8 and 10 of 20 to 40 Å are respectively formed on the surfaces of the parts corresponding to the source and drain and having the comparatively low impurity density and on the surface of the intrinsic polycrystalline silicon 6. On the other hand, a comparatively thick oxide film 9 of 70 to 200 Å is formed on the surface of the N-type polycrystalline silicon gate 6' having the comparatively high impurity density.

(c) Boron can pass through an oxide film of a thickness of at most 40 Å by the thermal diffusion, and cannot pass through an oxide film of a thickness of at least 70 Å. Therefore, boron is subsequently thermally diffused at 950° to 1,000° C. for about 20 minutes. Thus, the boron penetrate through the comparatively thin oxide films 8 and 10 to form the P-type impurity layers 4 and 5 and the P-type polycrystalline silicon layer 6. At this time, the N-type polycrystalline silicon layer 6' is protected by the comparatively thick oxide film 9, and it is not doped with the boron. As an alternative expedient, before the thermal diffusion of boron, the oxide films are etched with an etchant of HF: $H_2O=1:99$ for 60 seconds, thereby to remove the oxide films 8 and 10 and to leave the oxide film 9 to a thickness of 40–150 Å. Thereafter, the thermal diffusion of boron is carried out. Thus, a similar structure is obtained.

(d) Thereafter, a phosphosilicate glass film 11 is formed, contact holes are formed, and aluminum electrodes 12 are formed. Then, the fabrication of the device is completed.

Although the present method of manufacture has been explained as to the case of the silicon gate P-channel MOSFETs, quite the same applies to the case of P-channel MOSFETs in a silicon gate CMOSIC.

Now, circuits according to embodiments of this invention for deriving the difference of the threshold voltages $V_{th}$ of the MOS transistors will be explained.

Although the circuits described below can become expedients for taking out the differences of the Fermi levels $(E_{fn}-E_{fp})$, $(E_{fn}-E_i)$ and $(E_i-E_{fp})$, they are further applicable as reference voltage generator devices which, in general, utilize as a reference voltage a voltage based on the difference of the threshold voltages $V_{th}$ of FETs having unequal threshold voltage values.

Figure 6A:
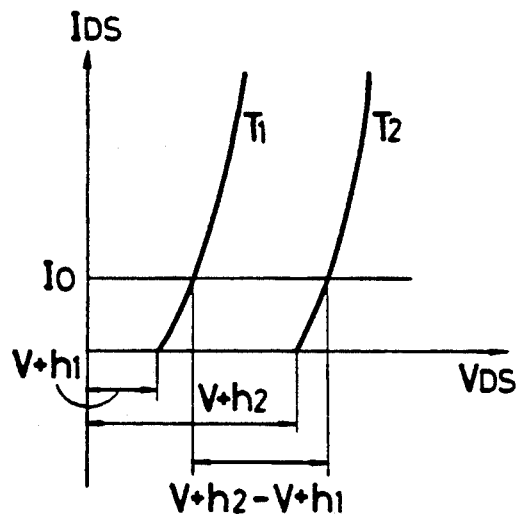
FIGS. 6(a) and 6(b) are a characteristic diagram and a circuit diagram of a MOS diode circuit for deriving the difference of $V_{th}$ of two FETs having unequal threshold voltages $V_{th}$ respectively.
Figure 6B:
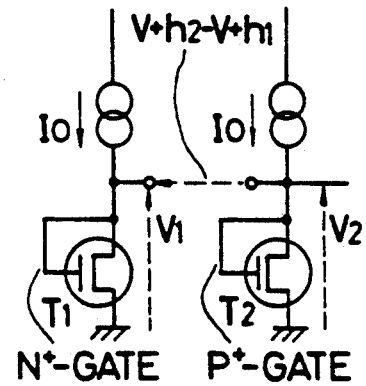

FIG. 6(b) shows a circuit which generates voltages corresponding to threshold voltages of MOS transistors. Transistors $T_1$ and $T_2$ construct the so-called MOS diodes in which drains and gates are connected in common.

$I_o$ designates a constant-current source, and $T_1$ and $T_2$ indicate MOSFETs which have unequal threshold voltages $V_{th1}$ and $V_{th2}$ as indicated in FIG. 6(a) and substantially equal mutual conductances $\beta$. Letting the drain voltages of the respective transistors be $V_1$ and $V_2$, $$I_O = \tfrac{1}{2}\beta(V_1 - V_{th1})^2 \quad (21)$$
$$= \tfrac{1}{2}\beta(V_2 - V_{th2})^2$$

Therefore, $$V_1 = V_{th1} + \sqrt{2 I_O/\beta} \quad (22)$$

$$V_2 = V_{th2} + \sqrt{2 I_O/\beta}$$

By taking the difference of the drain voltages, the difference of the threshold voltages can be derived.

As the constant-current sources, sufficiently high resistances may be used. If their characteristics are uniform, diffusion resistances, polycrystalline Si resistances, resistances formed by the ion implantation, or high resistances formed of MOS transistors can be used.

When, in this circuit, the N+ gate P-channel MOS and the P+ gate P-channel MOS previously explained with reference to FIGS. 58 and 59 respectively are used as the transistors $T_1$ and $T_2$, that difference $(E_{fn}-E_{fp})$ of the Fermi levels of the N-type semiconductor and the P-type semiconductor which is a value substantially equal to the difference of the threshold voltages can be derived.

By making the compositions of the gate electrodes different, it is possible to endow the unequal threshold voltages by, for example, implanting ions into the channels, altering the thicknesses of a doped gate oxide or gate insulating films, etc. When such a measure is applied to the circuit of FIG. 6(b), the difference of threshold voltages corresponding to the implanted quantities of the ions or the difference of threshold voltages corresponding to the quantities of an impurity with which the gate insulating films are doped or corresponding to the thicknesses of the gate insulating films can be similarly derived as the reference voltage.

Figure 7:
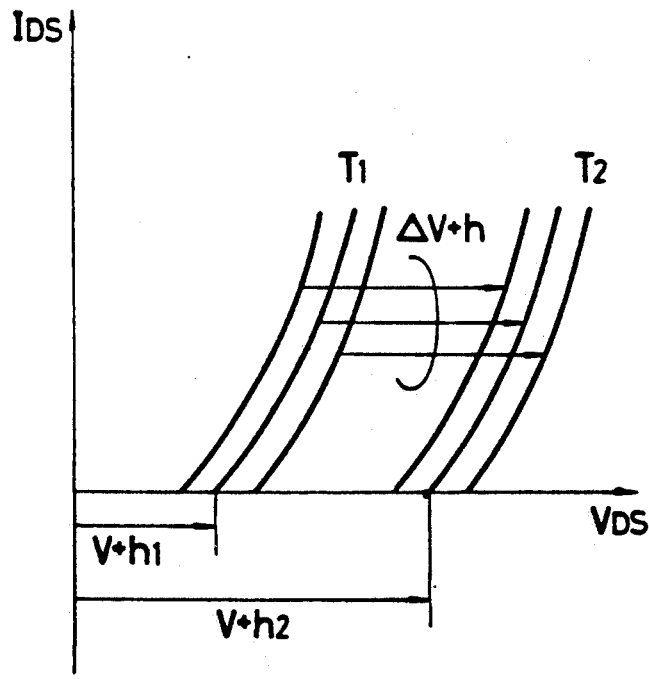
FIG. 7 is a characteristic diagram showing the situation in which a threshold voltage is changed by ion implantation.

For example, the ion implantation is much higher in the precision of the impurity concentration than conventional diffusion because the quantity of implantation can be monitored in the form of current. FIG. 7 illustrates this situation. Even if, letting $T_1$ denote the characteristics of MOS transistors before the implantation of ions, they have been individually dispersed at the manufacture and the threshold values are individually shifted by $\Delta V_{th}$ on account of the ion implantation, the magnitude $\Delta V_{th}$ being the difference of both the threshold voltages is determined by the quantity of the ion implantation and is therefore dispersed extremely little. It can accordingly be similarly used as a reference voltage with only small dispersions of manufacture. More specifically, letting $V_{th1}$ indicate the threshold voltage of the MOS transistor $T_1$ which is not subjected to the ion implantation, likewise to Equation (15):

$$V_{th1} = \phi_{MS} - 2\phi_F - \frac{Q_{SS}}{COX} - \frac{Q_B}{COX} \quad (23)$$

Letting $\Delta Q_B$ indicate the increment of fixed changes in the substrate due to the ion implantation, the threshold voltage $V_{th2}$ of the MOS transistor $T_2$ subjected to the ion implantation becomes:

$$V_{th2} = \phi_{MS} - 2\phi_F - \frac{Q_{SS}}{COX} - \frac{Q_B + \Delta Q_B}{COX} \quad (24)$$

Accordingly, $$V_{th1} - V_{th2} = \frac{\Delta Q_B}{COX} \quad (25)$$

The temperature variation of this difference voltage between the threshold voltages is extremely small because $Q_B$ is almost invariable against temperature changes.

Additional great advantages are that the reference voltage can be freely set by the quantity of ion implantation and that the device can be easily realized even by the single-channel MOS manufacturing process.

Figure 8:
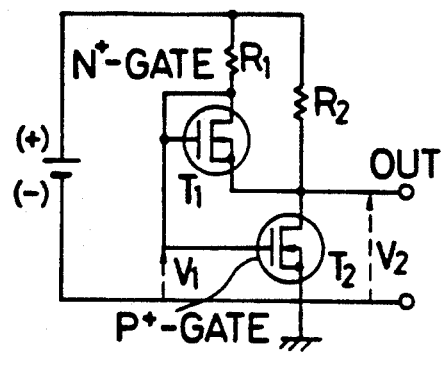
FIGS. 8 and 9 are diagrams each showing an example of a reference voltage generator circuit which exploits the difference of threshold voltages $V_{th}$.
Figure 9:
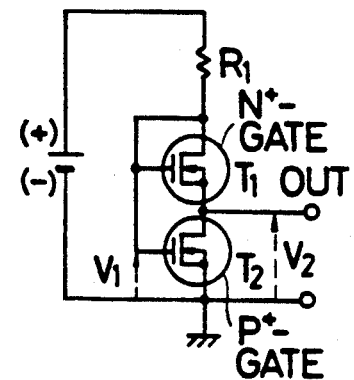

FIGS. 8 and 9 show examples of circuits wherein an N+-gate FET $T_1$ and a P+-gate FET $T_2$ having unequal threshold voltages as in the case of FIGS. 6(a) and 6(b) are used, and the FET $T_1$ is connected in the MOS diode form and is connected in series with the FET $T_2$, thereby to derive the difference of the threshold voltages. It is supposed that the FET $T_1$ has a threshold voltage $V_{th1}$, while the FET $T_2$ has a threshold voltage $V_{th2}$.

Under conditions that a resistance $R_1$ is sufficiently great as compared with the impedance of $T_1$ and that a resistance $R_2$ is sufficiently great as compared with the impedance of $T_2$, $$V_1 - V_2 \approx V_{th1} \tag{26}$$

$$V_1 \approx V_{th2} \tag{27}$$

Therefore, $$V_2 \approx V_{th1} - V_{th2} \tag{28}$$

Figure 11A:
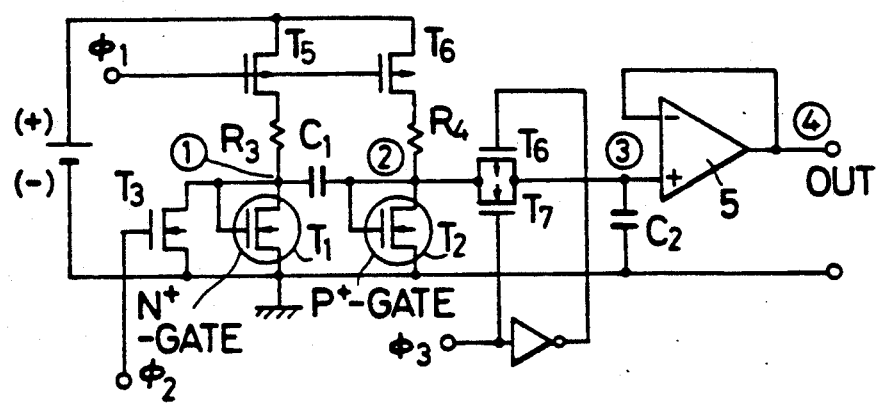
Figure 11B:
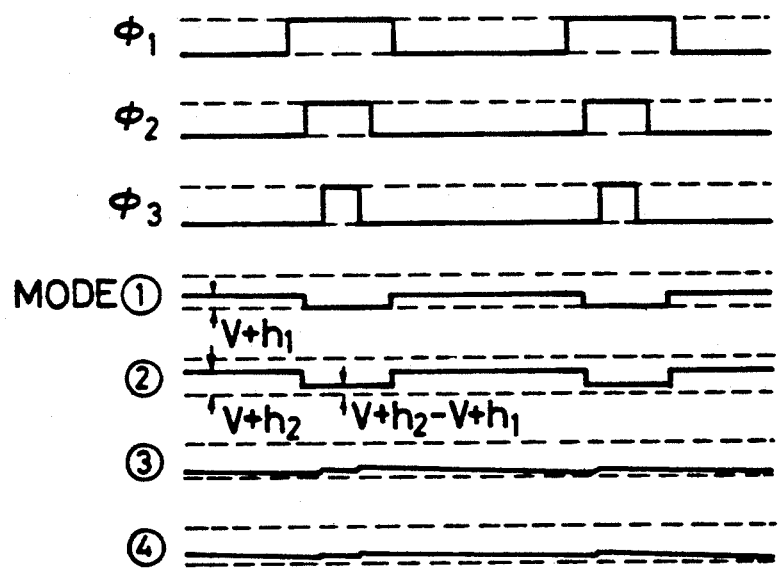
FIG. 11(b) shows timing signal waveforms thereof.

FIG. 11(a) shows a device wherein voltages corresponding to the threshold voltages of an N+-gate MOS $T_1$ and a P+-gate MOS $T_2$ are applied to both terminals of a capacitor $C_1$ connected to the MOS transistors, and a voltage held in the capacitor is taken out as a difference voltage. FIG. 11(b) depicts the operating timings. MOS FETs $T_5$ and $T_6$ are turned "on" by a clock pulse $\phi_1$, to charge the difference voltage of the threshold voltages $V_{th1}$ and $V_{th2}$ of the MOS FET $T_1$ and $T_2$ in a capacitance $C_1$.

After turning the MOS FETs $T_5$ and $T_6$ "off" by the pulse $\phi_1$, a MOS FET $T_3$ is turned "on" by a clock $\phi_2$ so as to ground a node ① of $C_1$. Since, at this time, the difference voltage of the threshold voltages is retained in $C_1$, the difference potential appears at a node ② of the capacitance $C_1$ as it is. In case of a use for a voltage detector circuit to be stated later, the potential of the node ② at this time can be employed as a reference voltage as it is. In order to permit the use in a more general form, however, transmission gates $T_6$ and $T_7$ are turned "on" by a clock $\phi_3$ within a period of time in which the high level signal of the clock $\phi_2$ is entering, the potential is held in a capacitance $C_2$ connected to the non-inverting input (+) of an operational amplifier 5, and the potential is received by the so-called voltage follower in which 100% of an output is negatively fed back to the inverting input (−) of the operational amplifier 5. Then, as the output of the voltage follower, the difference of the threshold voltages of $T_1$ and $T_2$ is obtained as a reference voltage under the state under which the internal impedance is sufficiently low.

Figure 10A:
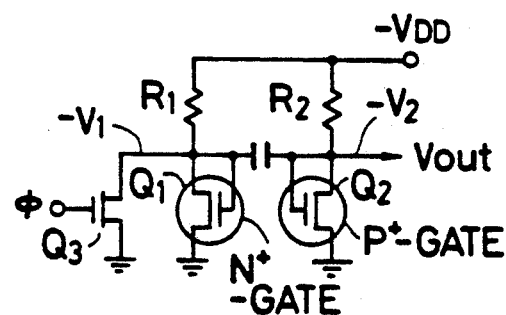

FIG. 10(a) is a circuit diagram showing an embodiment of a dynamic type difference voltage output circuit which exploits the difference of the threshold voltages of an N+-gate N-channel MOS $Q_1$ and a P+-gate N-channel MOS $Q_2$.

Figure 10B:
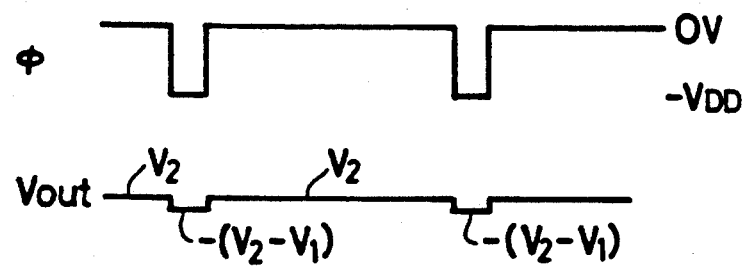
FIG. 10(b) is an operating waveform diagram of the circuit in FIG. 10(a)

In this circuit, the gates and drains of the MISFETs ($Q_1$, $Q_2$) are interconnected, and they are connected to a bias power supply $-V_{DD}$ through load resistors ($R_1$, $R_2$). A capacitor (C) is interposed between the gate and drain terminals, and the difference component between the threshold voltages of the MISFETs ($Q_1$, $Q_2$) is stored in the capacitor so as to provide an output. More specifically, a P-channel MISFET ($Q_3$) which is driven by a clock pulse ($\phi$) is incorporated between the gate and source of the MISFET ($Q_1$) of the smaller threshold voltage. The respective load resistances of the MISFETs ($Q_1$, $Q_2$), and the "on" resistance of the MISFET ($Q_3$) is made sufficiently smaller than the "on" resistances of the MISFETs ($Q_1$, $Q_2$). Owing to such a circuit arrangement, as shown in an operating waveform diagram of FIG. 10(b), when the clock pulse $\phi$ has become a low level to turn the MISFET ($Q_3$) "on", the difference $-(V_2-V_1)$ between the drain voltages (threshold voltages $V_1$, $V_2$) of both the MISFETs ($Q_1$, $Q_2$) is provided from the drain of the MISFET ($Q_2$) or the terminal of the capacitor (C) remote from the MISFET ($Q_3$). The difference voltage output similar to those of the foregoing circuits are obtained by sampling it at the time ($\phi$).

Figure 12:
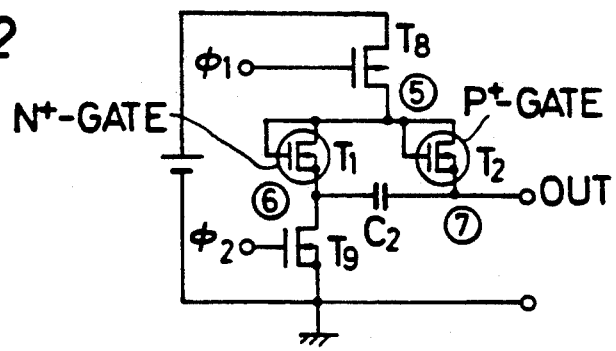
FIG. 12 shows a reference voltage generator circuit which is based on another embodiment.

FIG. 12 shows a reference voltage generator device which utilizes an N+-gate MOS $T_1$ as well as a P+-gate MOS $T_2$ and a capacitance $C_2$ similarly. A MOS FET $T_8$ is turned "on" by a clock $\phi_1$. At this time, a MOS FET $T_9$ is in the "off" state owing to a clock $\phi_2$. The potential of a node ⑥ becomes lower than that of a node ⑤ by the threshold voltage $V_{th1}$ of the MOS FET $T_1$, and the potential of a node ⑦ becomes lower than that of the node ⑤ by the threshold voltage $V_{th2}$ of the MOS FET $T_2$. Accordingly, the difference voltage of both the threshold voltages $V_{th1}$ and $V_{th2}$ is charged across the capacitance $C_2$. Subsequently, the MOS FET $T_8$ is turned "off" by $\phi_1$ and the MOS FET $T_9$ is turned "on" by $\phi_2$. Then, the difference voltage of the threshold voltages is provided at the node ⑦.

Figure 13:
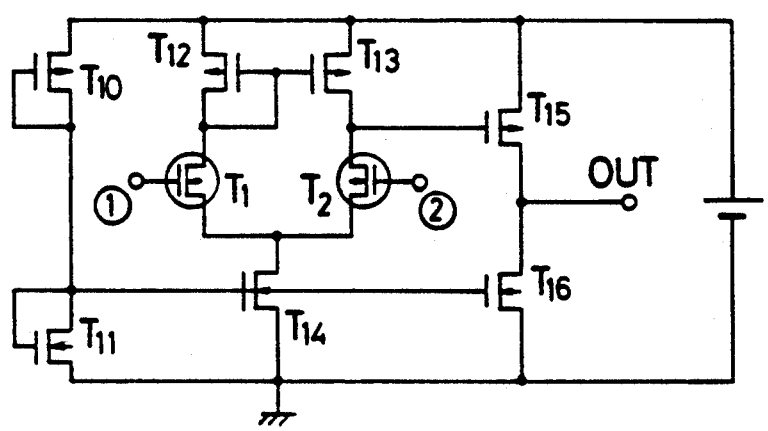
FIG. 13 shows an operational amplifier circuit which has an offset voltage in accordance with this invention.

FIG. 13 shows an operational amplifier according to the principle of this invention. $T_1$ and $T_2$ designate a differential pair constituting a differential amplifier circuit, and $T_{12}$ and $T_{13}$ designate active loads of the differential amplifier. A transistor $T_{11}$ constructs a constant-current circuit together with transistors $T_{14}$ and $T_{16}$. Transistors $T_{15}$ and $T_{16}$ constitute a level shift output buffer circuit whose constant-current source load is the transistor $T_{16}$. Although the example of a circuit arrangement based on C-MOS is shown in the figure, the circuit can of course be constructed of single-channel MOS.

In this operational amplifier, the differential pair transistors $T_1$ and $T_2$ constituting the differential amplifier circuit are specially endowed with unequal threshold voltages $V_{th1}$ and $V_{th2}$ on the basis of the Fermi level difference of the gate electrodes stated before, so that the difference of the threshold voltages can be utilized or derived as a reference voltage. This is an application of the operational amplifier which has hitherto not been existent.

Figure 14:
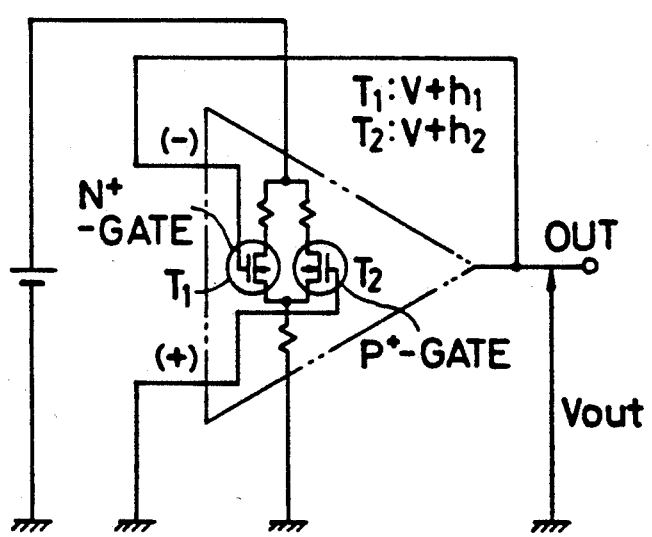
FIG. 14 shows a reference voltage generator circuit which utilizes the operational amplifier circuit of FIG. 13, FIGS. 15, 16 and 17 show reference voltage generator circuits which utilize operational amplifier circuits according to other embodiments.

FIG. 14 schematically depicts an ordinary operational amplifier by picking up only the differential portion thereof. It is here assumed that MOS transistors $T_1$ and $T_2$ have unequal threshold voltages $V_{th1}$ and $V_{th2}$ respectively and that the other characteristics such as mutual conductances are equal. Signs (−) and (+) appearing on the input side signify the inverting and non-inverting inputs, respectively.

Letting $V_1$ denote an input voltage of the transistor $T_1$ and $V_2$ an input voltage of the transistor $T_2$, $$V_1 - V_{th1} = V_2 - V_{th2}$$

that is, $$V_1 - V_2 = V_{th1} - V_{th2} \tag{29}.$$

The output level changes with this input voltage condition as the boundary.

The operational amplifier is endowed with an input offset corresponding to the difference voltage of the threshold voltages. Therefore, when either of the inverting input (−) and the non-inverting input (+) is grounded or connected to a reference potential of a power supply, it can be operated as a voltage comparator whose reference voltage is the offset voltage. On the other hand, when the output is connected to the inverting input terminal (−) to construct a voltage follower circuit and the non-inverting input terminal (+) is grounded as shown in FIG. 14, the difference of the threshold voltages is obtained at the output Out. In this case, in order to effect the operation of the operational amplifier, the transistor $T_2$ needs to be of the depletion mode MOS FET. For example, in case of using the P+-gate MOS for $T_1$ and the N+-gate MOS for $T_2$, they may be made the depletion type by subjecting the channel portions of both the MOSFETs to the ion implantation under the same conditions.

Figure 15:
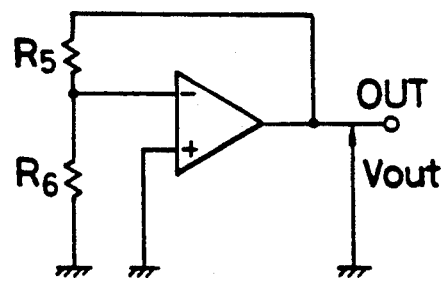

FIG. 15 shows a device which can arbitrarily set a reference voltage by the use of the operational amplifier in FIG. 14. An output is fed back to the inverting input (−) through voltage divider means $R_5$ and $R_6$. Thus, letting r denote the voltage division ration $R_6/R_5+R_6$, the output voltage $V_o$ becomes:

$$V_o = \frac{V_{th1} - V_{th2}}{r} \quad (30)$$

The voltage divider means $R_5$ and $R_6$ should desirably be linear resistances, but any resistances may be adopted insofar as their characteristics are sufficiently uniform to a permissible extent.

Figure 16:
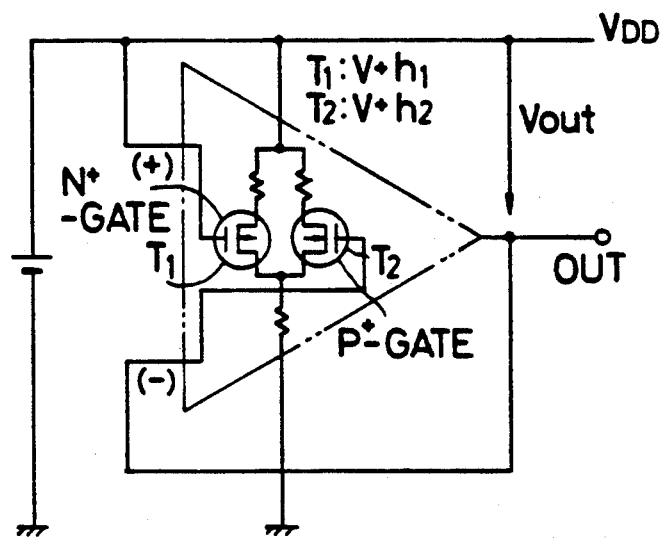
Figure 17:
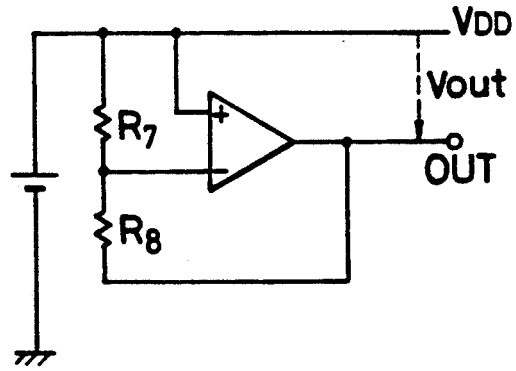

Whereas the circuits of FIGS. 14 and 15 premise the use of the depletion type MOS, circuits in FIGS. 16 and 17 are made operable with enhancement type MOS. Of course, the depletion type MOS may well be adopted.

Likewise to the example of FIG. 14, the example of FIG. 16 directly feeds an output back to an inverting input (−). Letting $V_{DD}$ denote a supply voltage, the output $V_o$ becomes:

$$V_o = V_{DD} - (V_{th1} - V_{th2}) \quad (31).$$

With the circuits of FIGS. 14 and 15, at least one of the differential pair transistors needs to be put into the depletion mode, which necessitates to increase the number of manufacturing steps in some cases. However, they can derive the difference voltage of the threshold voltages $V_{th}$ with reference to the ground potential.

Figure 18:
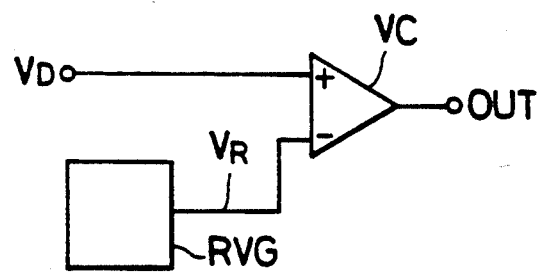
FIGS. 18 and 19 show voltage detector circuits each of which employs a reference voltage produced from the reference voltage generator circuit according to this invention.

Conversely, with the circuits of FIGS. 16 and 18, the reference of the difference voltage to be obtained is not the ground potential. However, the condition of the operating mode of the FET is not imposed.

Which circuit form is to be adopted may be decided by the merit or demerit to which more importance is attached.

Likewise to the example of FIG. 15, the example of FIG. 17 feeds an output back to an inverting input (−) through voltage divider means $R_7$ and $R_8$. The output becomes:

$$V_o = V_{DD} - \frac{V_{th1} - V_{th2}}{r} \quad (32)$$

FIG. 18 shows a voltage detector circuit wherein a reference voltage $V_R$ from a reference voltage generator device RVG according to this invention which exploits the difference of the threshold voltages $V_{th}$ is applied to one input of a conventional voltage comparator VC and a voltage $V_D$ to be detected is applied to the other input, whereby the height of the voltage to-be-detected $V_D$ relative to the reference voltage $V_R$ can be discriminated.

Figure 19:
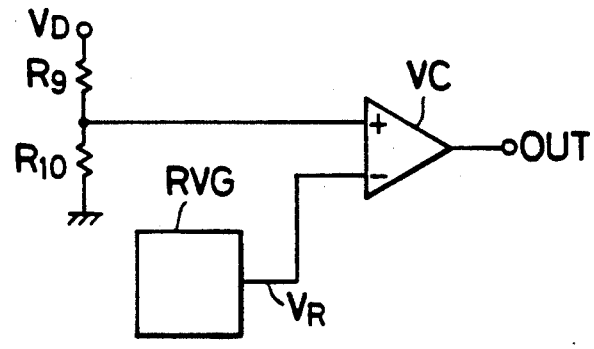

An example in FIG. 19 is a voltage detector circuit wherein a reference voltage $V_R$ from a reference voltage generator device RVG which utilizes the difference of threshold voltages $V_{th}$ corresponding to the Fermi level difference of gate electrodes in accordance with this invention is applied to one input of a voltage comparator VC and wherein a voltage obtained by dividing a voltage to-be-detected $V_D$ with voltage divider means $R_9$ and $R_{10}$ is applied to the other input. Letting r denote the voltage division ratio, $V_{ref}$ denote the reference voltage and $V_{sense}$ the detection level.

$$V_{sense} = \frac{V_{ref}}{r} \quad (33)$$

The detection level $V_{sense}$ can be arbitrarily set through the voltage division ratio r.

Figure 20:
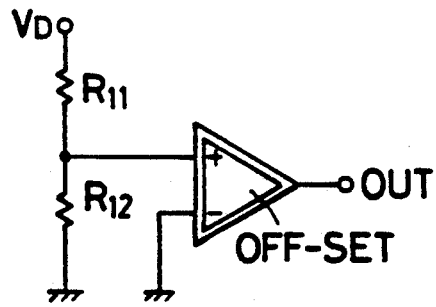
FIG. 20 shows a voltage detector circuit which utilizes an operational amplifier circuit having an offset voltage in accordance with this invention.

An example in FIG. 20 is a voltage detector circuit which uses the operational amplifier with the offset corresponding to the difference of the threshold voltages $V_{th}$ as described with reference to FIG. 13 and exploits the offset voltage as a reference voltage as explained previously. $R_{11}$ and $R_{12}$ indicate voltage divider means as in the example of FIG. 19.

Figure 54:
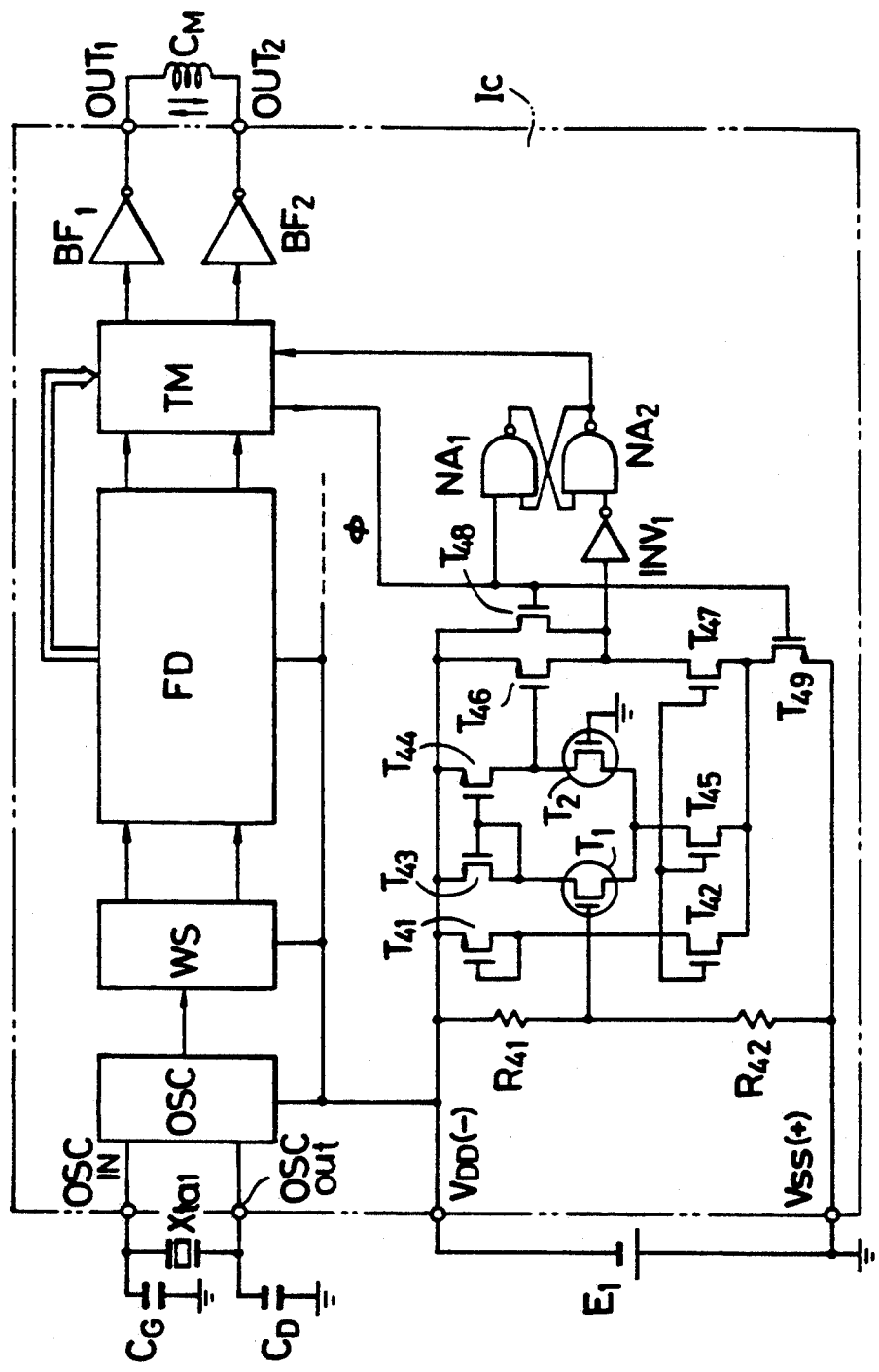
FIG. 54 shows an electronic timepiece to which the battery checker shown in FIG. 20 is applied.

If the voltage to-be-detected $V_D$ is a battery supply voltage in the example of FIG. 18, 19 or 20, the voltage detector circuit can be utilized as a battery checker in a system which uses a battery as a power supply. A concrete example in which the voltage detector circuit of FIG. 20 is applied to the battery checker of an electronic timepiece is shown in FIG. 54, and will be described in detail later.

Figure 21:
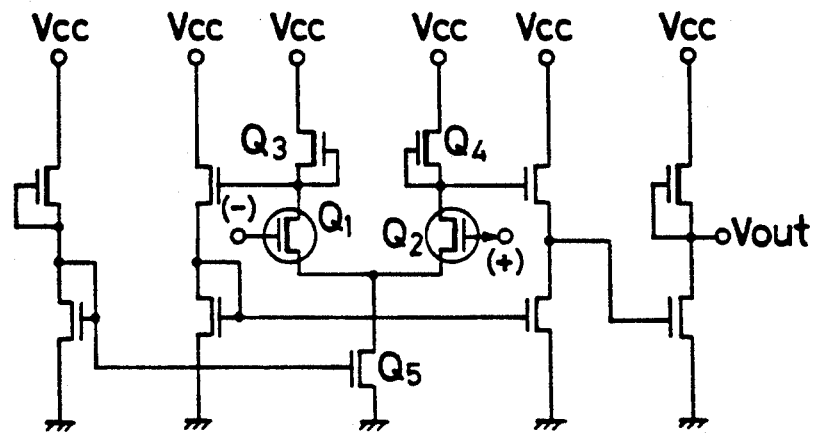
FIG. 21 shows a voltage comparator which is formed by connecting MOSFETs of unequal threshold voltages $V_{th}$ in the differential type in accordance with this invention.

FIG. 21 shows another embodiment of an operational amplifier circuit which is constructed by connecting in the differential form N-channel MOS FETs $Q_1$ and $Q_2$ having unequal threshold voltages $V_{th}$ on the basis of the difference of the Fermi levels of gate electrodes in accordance with this invention. MOS FETs $Q_3$ and $Q_4$ operate as load FETs of the differential pair MOS FETs $Q_1$ and $Q_2$, and a MOS FET $Q_5$ operates as a constant-current source of the differential pair MOS FETs $Q_1$ and $Q_2$.

Figure 22:
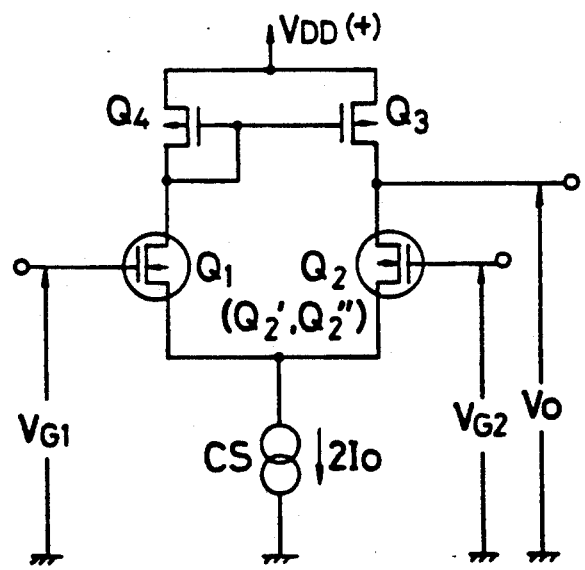
FIG. 22 shows a differential amplifier circuit which employs MOSFETs of unequal threshold voltages $V_{th}$ in accordance with this invention.

FIG. 22 shows a differential amplifier circuit which has as its offset voltage the difference of the threshold voltages $V_{th}$ of MOS transistors $Q_1$ and $Q_2$ according to this invention.

Figure 23:
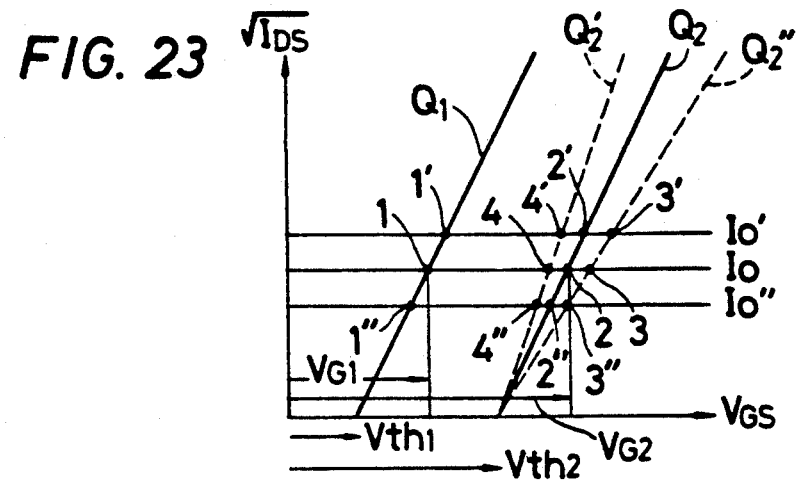
FIG. 23 shows the drain current-versus-gate voltage characteristics of the differential pair MOS transistors of the differential amplifier circuit shown in FIG. 22.

FIG. 23 shows the drain current-versus-gate voltage characteristics of the MOS transistors $Q_1$ and $Q_2$ in FIG. 22.

In this case, the mutual conductances of the MOS transistors $Q_1$ and $Q_2$ constituting the differential pair are designed so as to become equal. As the current of a constant-current source CS of the differential circuit changes to be $I_o$, $I_o'$ and $I_o''$, their points of intersections with the $V_{GS}-\sqrt{I_{DS}}$ characteristic of the transistor $Q_1$ vary to be points 1, 1' and 1'', and their points of intersections with the $V_{GS}-\sqrt{I_{DS}}$ characteristics of the transistor $Q_2$ vary to be points 2, 2' and 2''. At first, voltages $V_{G1}$ and $V_{G2}$ are applied to the gates of the respective transistors $Q_1$ and $Q_2$ in order to bring the differential circuit into the balanced state. Herein, even when the current of the constant-current source CS has changed from $I_o$ to $I_o'$ or $I_o''$ in dependence on the temperature, the difference of the voltages $V_{G1}$ and $V_{G2}$ which balance the differential circuit are held substantially constant. In actuality, the difference voltage reflects the difference $(V_{th1}-V_{th2})$ of the threshold voltages of the transistors $Q_1$ and $Q_2$ as it is. Accordingly, the temperature characteristic of the difference $(V_{th1}-V_{th2})$ of the threshold voltages of the transistors $Q_1$ and $Q_2$ appears as it is, as the difference $(V_{G1}-V_{G2})$ of the voltages to be applied to the gates of the transistors $Q_1$ and $Q_2$ in order to put these transistors into the balanced state.

When the P+-gate and N+-gate N-channel MOS transistors previously described are respectively used as the transistors $Q_1$ and $Q_2$, the voltage of approximately 1.1 V corresponding to the band gap is obtained. In case of the silicon semiconductor, this difference voltage has a gradient of $-0.24$ mV/°C. as the temperature dependency.

The temperature dependency of the difference voltage of the gate voltages can be nullified by making the values of the conductances of the transistors $Q_1$ and $Q_2$ unequal.

It is supposed by way of example that the temperature dependency of the constant-current source CS of the differential circuit has a positive gradient, while the difference ($V_{th1} - V_{th2}$) of the threshold voltages of the transistors $Q_1$ and $Q_2''$ exhibits a temperature dependency of a negative gradient. As indicated at $Q_1$ and $Q_2''$ in FIG. 23, the conductance of $Q_2''$ is made smaller than the conductance of $Q_1$, whereby the gate voltage of the transistor $Q_2$ under the balanced state varies as indicated at 3, 3' and 3'' in dependence on the temperature, and the temperature dependency of the difference of the gate voltages of the transistors $Q_1$ and $Q_2''$ as based on the difference of the conductances of the transistors $Q_1$ and $Q_2''$ has a positive gradient. By properly combining the magnitudes of the conductances, the total temperature dependency can be made zero or can be improved.

In a case where the temperature dependency of the constant-current source of the differential circuit has a negative gradient, the conductance of the transistor $Q_2'$ is made greater than the conductance of the transistor $Q_1$ conversely to the above, whereby the temperature dependency can be improved into zero.

Under the balanced state, the following relations hold among the current $I_o$ of the constant-current source, and the threshold voltages $V_{th1}$ and $V_{th2}$, mutual conductances $\beta_1$ and $\beta_2$ and gate voltages $V_{G1}$ and $V_{G2}$ of the respective transistors $Q_1$ and $Q_2$:

$$I_o = \frac{\beta_1}{2}(V_{G1} - V_{th1})^2 = \frac{\beta_2}{2}(V_{G2} - V_{th2})^2 \quad (34)$$

$$V_{G1} = V_{th1} + \sqrt{2 I_o/\beta_1} \quad (35)$$

$$V_{G2} = V_{th2} + \sqrt{2 I_o/\beta_2} \quad (36)$$

$$V_{G1} - V_{G2} = (V_{th1} - V_{th2}) + \sqrt{2 I_o}\left(\frac{1}{\sqrt{\beta_1}} - \frac{1}{\sqrt{\beta_2}}\right) \quad (37)$$

In Equation (37), when $$\beta_1 > \beta_2, \frac{1}{\beta_1} - \frac{1}{\beta_2} < 0,$$

and when $$\beta_1 < \beta_2, \frac{1}{\beta_1} - \frac{1}{\beta_2} > 0.$$

Therefore, the temperature gradient of the second term of Equation (37) can become both positive and negative.

Figure 24:
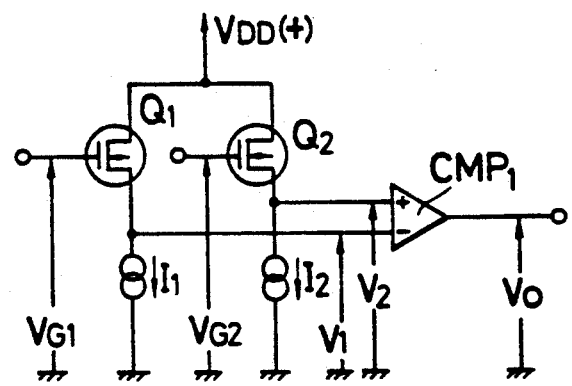
FIG. 24 shows an offset type voltage comparator circuit which is constructed of a voltage comparator circuit and source follower circuits employing two MOSFETs of threshold voltages different from each other in accordance with this invention.
Figure 25:
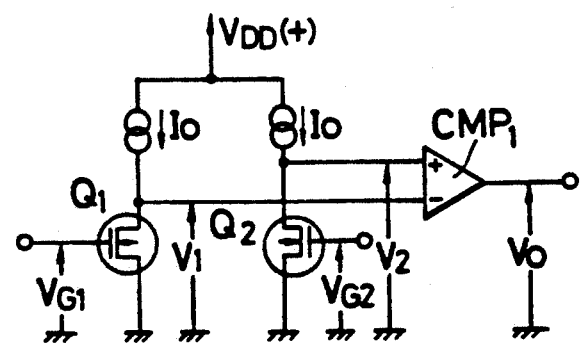
FIG. 25 shows an offset type voltage comparator circuit which is constructed of a voltage comparator circuit and grounded-source circuits employing two MOSFETs of threshold voltages different from each other in accordance with this invention.

FIGS. 24 and 25 show application circuits of voltage comparators each being another embodiment which can reduce the temperature dependency on the basis of the concept described above.

In FIG. 24, MOS FETs $Q_1$ and $Q_2$ whose threshold voltages $V_{th}$ are unequal owing to the difference of the Fermi levels of gate electrodes in accordance with this invention are operated as source followers. The balanced state corresponds to the time when the differential input voltage of a voltage comparator circuit or operational amplifier circuit $CMP_1$ becomes 0 (zero) volt. Under the balanced state, the following relations hold among the threshold voltages $V_{th1}$ and $V_{th2}$, mutual conductances $\beta_1$ and $\beta_2$, gate voltages $V_{G1}$ and $V_{G2}$, source voltages $V_1$ and $V_2$ and drain currents $I_1$ and $I_2$ of the respective MOS FETs $Q_1$ and $Q_2$:

$$I_1 = \frac{1}{2}\beta_1(V_{G1} - V_{th1} - V_1)^2$$

$$I_2 = \frac{1}{2}\beta_2(V_{G2} - V_{th2} - V_2)^2 \quad (38)$$

$$V_1 = V_2 \quad (39)$$

Accordingly, $$V_{G1} = V_{th1} + V_1 + \sqrt{2 I_1/\beta_1} \quad (40)$$

$$V_{G2} = V_{th2} + V_2 + \sqrt{2 I_2/\beta_2} \quad (41)$$

$$V_{G1} - V_{G2} = (V_{th1} - V_{th2}) + (\sqrt{2 I_1/\beta_1} - \sqrt{2 I_2/\beta_2}) \quad (42)$$

Thus, assuming that $I_1 = I_2 = I$, the temperature dependency of ($V_{G1} - V_{G2}$) can be made zero by appropriately setting $\beta_1$ and $\beta_2$ in conformity with the temperature dependency of I and the temperature dependency of ($V_{th1} - V_{th2}$) quite similarly to the case of the differential circuit.

Further, in this example of the circuit, assuming that $\beta_1 = \beta_2 = \beta$, Equation (42) becomes:

$$V_{G1} - V_{G2} = V_{th1} - V_{th2} + \sqrt{2/\beta}(\sqrt{I_1} - \sqrt{I_2}) \quad (43)$$

Therefore, even when the currents $I_1$ and $I_2$ are set at unequal values, the temperature dependency of the difference ($V_{G1} - V_{G2}$) can be similarly made 0 (zero).

Figure 26:
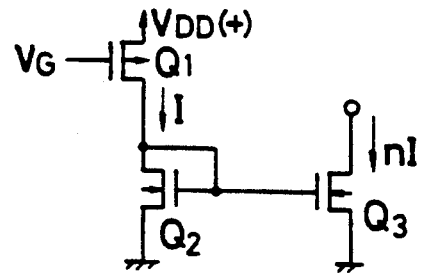
FIG. 26 shows an example of a constant-current circuit which is used in the offset type voltage comparator circuit of FIG. 24.

As an example of a constant-current circuit, one as shown in FIG. 26 is considered. Here, when the conductances of FETs $Q_2$ and $Q_3$ are made 1:n, a current flowing through the FET $Q_3$ can be made n.I relative to a current I flowing through FETs $Q_1$ and $Q_2$.

Accordingly, $I_1$ and $I_2$ in Equation (43) can be readily realized by changing the ratio n in the above constant-current circuit.

Figure 27:
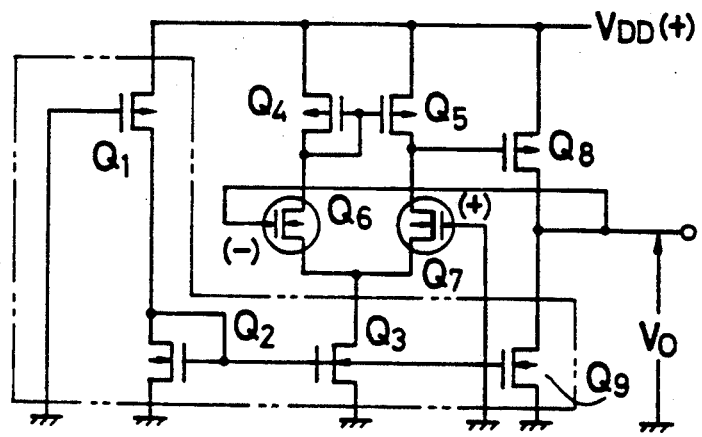
FIG. 27 shows a reference voltage generator circuit which employs the differential amplifier circuit shown in FIG. 22.

FIG. 27 shows an embodiment of a concrete form of a reference voltage generator circuit based on the differential circuit of FIG. 22.

Transistors $Q_1$, $Q_2$, $Q_3$ and $Q_9$ enclosed with dotted lines in FIG. 27 constitute a constant-current circuit similar to that in FIG. 26, while transistors $Q_4$, $Q_5$, $Q_6$, $Q_7$ and $Q_3$ constitute a differential circuit similar to that in FIG. 22. Here, the transistor $Q_6$ is a P+-gate N-channel MOS transistor, and the transistor $Q_7$ is an N+-gate N-channel MOS transistor.

Symbols of arrows of gates represent the N+-gate and the P+-gate discriminatingly.

The MOS transistors $Q_6$ and $Q_7$ have their threshold voltages shifted by equal values by means of the ion implantation or the like, and the MOS transistor $Q_7$ is made a depletion MOS transistor.

An output based on transistors $Q_8$ and $Q_9$ is negatively fed back to the gate of the transistor $Q_6$. For an output voltage, the offset voltage of the transistors $Q_6$ and $Q_7$ can be used as a reference voltage. Letting $V_o$ denote the output voltage and letting in Equation (37) $V_{G1}=V_o$, $V_{G2}=0$, $V_{th1}=V_{thn}+$, $V_{th2}=V_{thp}+$, $\beta_1=\beta_6$ and $\beta_2=\beta_7$, then:

$$V_o = V_{thn}^+ - V_{thp}^+ + \sqrt{2 I_o} \left( \frac{1}{\sqrt{\beta_6}} - \frac{1}{\sqrt{\beta_7}} \right) \quad (44)$$

In this case, $(V_{th1}-V_{th2})$ is the difference between the threshold voltages of the P+-gate N-channel MOS transistor and the N+-gate N-channel MOS transistor and become substantially equal to the band gap voltage of 1.1 V. The output voltage $V_o$ has the form in which the correction voltage of the second term is added to the band gap voltage.

Letting the mutual conductance of the transistor $Q_1$ be $\beta_1$, and supposing the drain voltage of the transistor $Q_2$ to be substantially equal to the threshold voltage $V_{thn}$ thereof, $$I_o = \beta_1 [(V_{DD}-V_{thn})(V_{DD}-V_{thp}) - \tfrac{1}{2}(V_{DD}-V_{thp})^2] \quad (45)$$

In addition, $$\beta_1 = \beta_{OP}(W/L)_1$$

$$\beta_6 = \beta_{ON}(W/L)_6$$

$$\beta_7 = \beta_{ON}(W/L)_6$$

where
$\beta_{OP}$ and $\beta_{ON}$ denote the mutual conductances per unit area of the N-MOS and P-MOS transistors, respectively.

Accordingly, the output voltage becomes:

$$V_o = V_{thn}^+ - V_{thp}^+ + \sqrt{\frac{\beta_{OP}}{\beta_{ON}}} \cdot \sqrt{(W/L)_1} \quad (46)$$

$$\frac{\sqrt{(W/L)_7} - \sqrt{W/6}}{\sqrt{(W/L)_6 \cdot (W/L)_7}} \times$$

$$\left[ (V_{DD} - V_{thn})(V_{DD} - V_{thp}) - \tfrac{1}{2}(V_{DD} - V_{thp})^2 \right]$$

Differentiating Equation (46) as to the temperature T, $$\frac{\partial V_o}{\partial T} = \frac{\partial}{\partial T}(V_{thn}^+ - V_{thp}^+) + \sqrt{\frac{\beta_{OP}}{\beta_{ON}}} \cdot \quad (47)$$

$$\sqrt{(W/L)_1} \cdot \frac{\sqrt{(W/L)_7} - \sqrt{(W/L)_6}}{\sqrt{(W/L)_6 (W/L)_7}} \cdot$$

$$\times \frac{\partial}{\partial T} \left[ (V_{DD} - V_{thn})(V_{DD} - V_{thp}) - \tfrac{1}{2}(V_{DD} - V_{thp})^2 \right]$$

$(W/L)_6$ and $(W/L)_7$ can be set so that $$\frac{\partial V_o}{\partial T} \approx 0$$

may be held.

Figure 28:
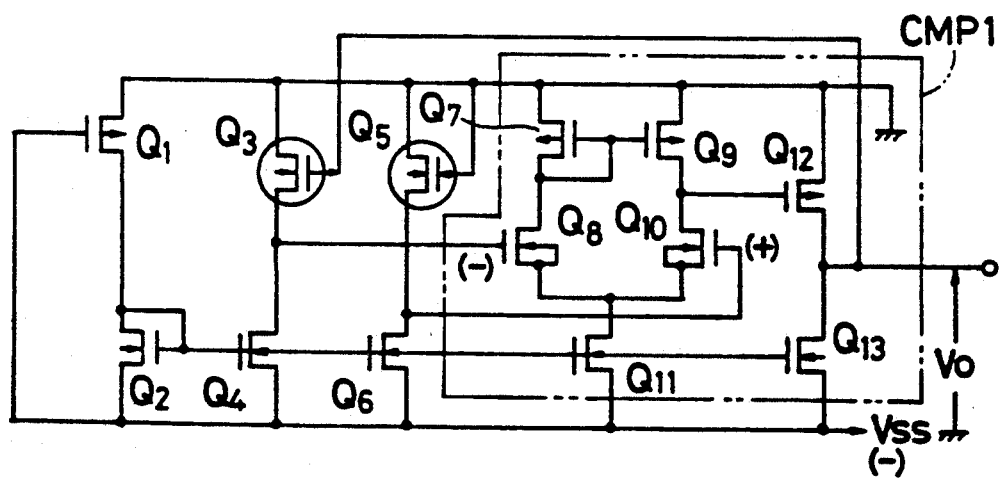
FIG. 28 shows the details of the offset type voltage comparator circuit shown in FIG. 24, and illustrates a case where a reference voltage generator circuit is constructed by employing this voltage comparator circuit.

FIG. 28 shows an embodiment of a reference voltage generator circuit which is based on the principle construction of FIG. 24. A circuit within dotted lines in FIG. 28 forms the comparator circuit CMP$_1$ in FIG. 24.

Transistors $Q_1$, $Q_2$, $Q_4$ and $Q_6$ constitute a constant-current circuit. Currents to flow through transistors $Q_3$ and $Q_5$ can also be made unequal by making different the ratios of the conductances of the transistors $Q_4$ and $Q_6$ relative to the conductance of the transistor $Q_2$.

Here, the transistors $Q_3$ and $Q_5$ are an N+-gate N-channel MOS transistor and a P+-gate N-channel MOS transistor respectively.

As in the foregoing, the output voltage $V_o$ is negatively fed back to the gate of the transistor $Q_3$ so as to construct the voltage follower, and the ground potential is applied to the transistor $Q_5$.

The temperature dependency of the output voltage can be made 0 (zero) by making the conductances of the transistors $Q_3$ and $Q_5$ or the conductances of the transistors $Q_4$ and $Q_6$ unequal in accordance with Equation (42) or (43), or by combining both the measures.

By way of example, it is supposed that the conductances of the transistors $Q_3$ and $Q_5$ are equal and $\beta$, that the current to flow through the transistor $Q_1$ is $I_o$, and that the ratio of the conductances of the transistors $Q_2$ and $Q_4$ is 1:n, while the ratio of the conductances of the transistors $Q_2$ and $Q_6$ is 1:n'. Then, the output voltage $V_o$ becomes:

$$V_o = V_{thn}^+ - V_{thp}^+ + \sqrt{\frac{2 I_o}{\beta}} \left( \sqrt{n'} - \sqrt{n} \right) \quad (48)$$

By adjusting the values of n' and n, the temperature dependency of the output voltage $V_o$ can be made substantially zero. As a circuit arrangement which generates a reference voltage and which can make zero or improve the temperature dependency of the reference voltage, one shown in FIG. 25 is considered besides the foregoing circuit arrangements. This circuit is operated with the sources of transistors $Q_1$ and $Q_2$ grounded.

Figure 29:
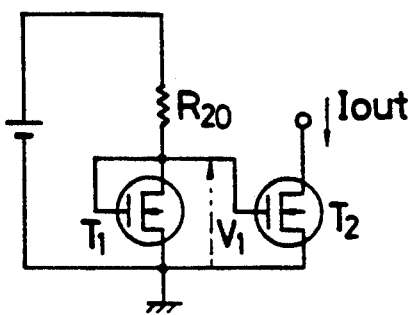
FIG. 29 shows a constant-current circuit which exploits the difference of the threshold voltages of two MOSFETs in accordance with this invention.

An example in FIG. 29 is a circuit of a constant current which is determined by the difference of the threshold voltages of MOS FETs $T_1$ and $T_2$ in accordance with this invention.

The MOS FETs $T_1$ and $T_2$ have equal mutual conductances $\beta$, and their threshold voltages have values $V_{th1}$ and $V_{th2}$ different from each other owing to the difference of the Fermi levels of gate electrodes in accordance with this invention. If a resistance $R_{20}$ is sufficiently high as compared with the impedance of $T_1$, the drain voltage (=gate voltage) $V_1$ of $T_1$ becomes substantially equal to $V_{th1}$.

When $T_2$ is in the saturation region, a current $I_2$ flowing through $T_2$ is:

$$I_{OUT} = \tfrac{1}{2}(V_{th1} - V_{th2})^2 \quad (49)$$

Figure 30:
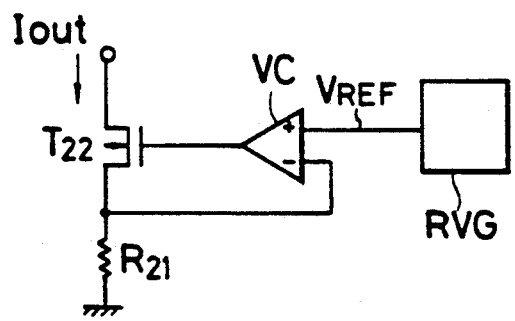
FIG. 30 shows a constant-current circuit to which is applied a reference voltage generator circuit that produces a reference voltage on the basis of the difference of the threshold voltages of two MOSFETs in accordance with this invention.

An example in FIG. 30 is a constant-current circuit employing a reference voltage generator device RVG which generates a reference voltage $V_{REF}$ ($=V_{th1}-V_{th2}$) decided by the difference voltage of the threshold voltages of MOS FETs corresponding to the difference of the Fermi levels of the gate electrodes thereof in accordance with this invention, and an ordinary operational amplifier VC. In the constant-current circuit, a voltage drop $I_{Out}R_{21}$ based on a current I flowing through a MOS FET $T_{22}$ is compared with a reference voltage $V_{REF}$, and the gate voltage of $T_1$ is controlled so that both may become equal at all times. From $$I_{Out}R_{21} = V_{REF}, \quad (50)$$
$$I_{Out} = \frac{V_{REF}}{R}$$

Here, the reference voltage may be obtained by endowing the operational amplifier VC with an offset and grounding the non-inverting input (+) of the operational amplifier VC as in the foregoing example of FIGS. 13 and 14.

Figure 31:
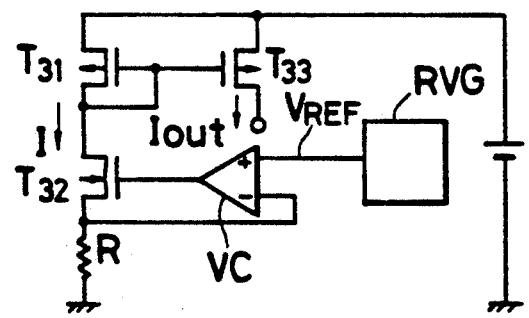
FIG. 31 shows a constant-current circuit in which a current mirror circuit is added to the constant-current circuit shown in FIG. 30, FIGS. 32 and 33 are circuit diagrams each showing a stabilized power supply circuit to which is applied a reference voltage generator circuit that produces a reference voltage based on the difference of the threshold voltages of MOSFETs in accordance with this invention.

An example in FIG. 31 is a constant-current circuit wherein the so-called current mirror circuit in which MOS transistors $T_{31}$ and $T_{33}$ have the same characteristics.

Figure 32:
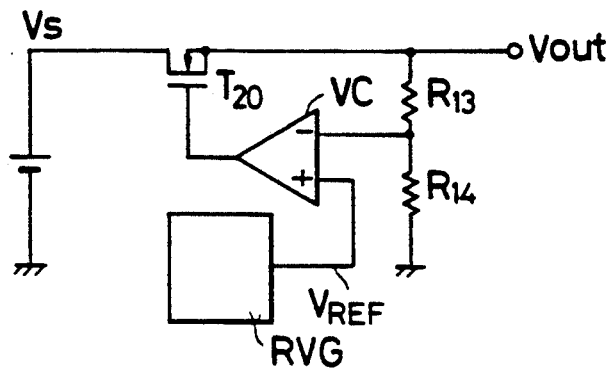

An example in FIG. 32 is an application wherein a reference voltage $V_{REF}$ which is decided by the difference voltage of the threshold voltages of MOS FETs corresponding to the difference of the Fermi levels of the gate electrodes of the MOS FETs in accordance with this invention is exploited for a stabilized power supply circuit. A reference voltage generator device RVG is constructed by any of the above-stated several methods according to the principle of this invention. A divided voltage of a stabilized output owing to voltage divider means $R_{13}$ and $R_{14}$ and a reference voltage are compared, and the gate voltage of a controlling MOS FET $T_{20}$ is controlled so as to bring them into agreement, thereby to stabilize the output voltage $V_{Out}$. Any operational amplifier may be used as long as its characteristics are allowable.

Figure 33:
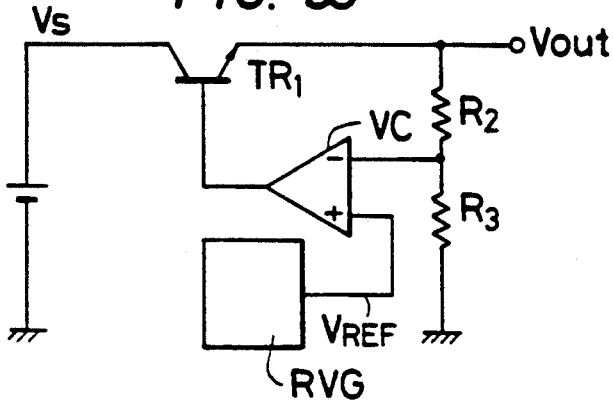

In an example of FIG. 33, the MOS transistor used for $T_{20}$ in the example of FIG. 32 is replaced with a bipolar transistor $TR_1$.

Figure 34:
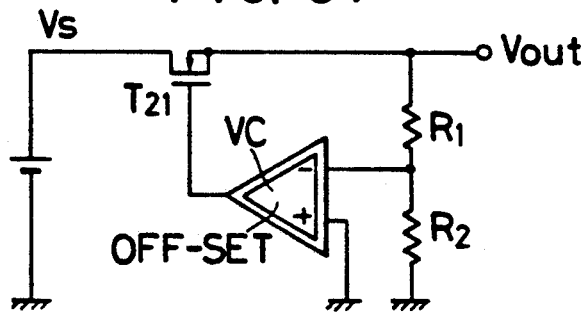
FIG. 34 shows a stabilized power supply circuit to which is applied an operational amplifier that has the difference of the threshold voltages of MOSFETs as its off-set voltage in accordance with this invention.

An example in FIG. 34 uses the operational amplifier VC as shown in the example of FIGS. 13 and 14, which has the offset voltage based on the difference voltage of the threshold voltages $V_{th}$ of MOS FETs and whose non-inverting input (+) is grounded. $T_{21}$ may be a MOS transistor, a bipolar transistor or a junction field-effect transistor.

Figure 35A:
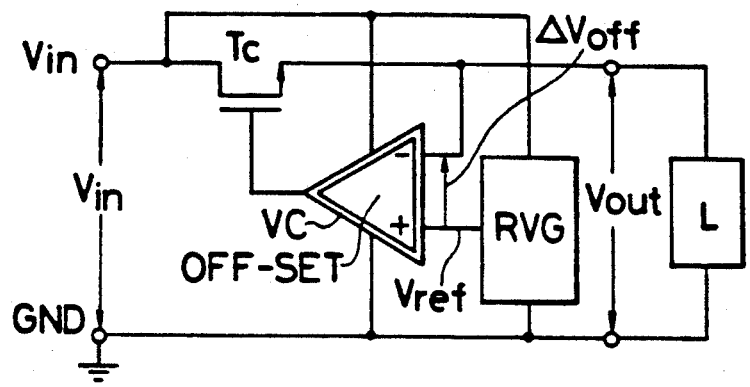

FIG. 35(a) shows a voltage regulator according to this invention which is a further improvement on the stabilized power supply circuits illustrated in FIGS. 32, 33 and 34, and FIG. 35(b) is a characteristic diagram thereof.

The circuit arrangement in FIG. 35(a) has the construction of a comparing voltage regulator. It differs from a conventional voltage comparator in that the input characteristics of an operational amplifier VC being a voltage comparator are asymmetric at the input terminals of an non-inverting input (+) and an inverting input (−). That is, this voltage comparator does not balance when the voltage levels of the non-inverting input (+) and the inverting input (−) are equal to each other, and if balances when a predetermined high input voltage (in the absolute value) is applied on the inverting input (−). In other words, in this voltage comparator, the input levels of the non-inverting input (+) and the inverting input (−) have an offset with respect to the balance point.

On the other hand, according to a conventional voltage regulator, in case where an input voltage $V_{in}$ is high, an output voltage $V_{out}$ depends upon a reference voltage $V_{ref}$ generated from the reference voltage generator RVC and the difference of $V_{out}-V_{in}$ is made large, whereas in case where the input voltage $V_{in}$ is low, $V_{out}$ depends solely upon $V_i$ and the difference of $|V_{in}-V_{out}|$ is made small. According to this invention, the changing point P between both the cases is set at a point of $V_{in}=V_1$ with respect to the input voltage $V_{in}$ ($V_1$ indicates the lowest operating voltage of a regulator load L).

According to the voltage regulator of this invention thus constructed, when the input voltage $V_{in}$ is higher than the lowest operating voltage $V_1$, the load L is operated by the output voltage $V_{out}$ which is higher than the lowest operating voltage $V_1$ but lower than the input voltage $V_{in}$, and hence, the power dissipation is reduced while ensuring the operation. When the input voltage $V_{in}$ is low, the load L is operated by the output voltage which is substantially equal to the input voltage $V_{in}$ or somewhat smaller than it, and hence, a voltage near the lowest operating voltage $V_1$ of the load L for the input voltage $V_{in}$ is supplied. Since the output voltage $V_{out}$ is reduced to a voltage suited to the load L for the high input voltage $V_{in}$, this voltage regulator can endow the load L with a low power dissipation and a wide range of input voltages $V_{in}$.

Figure 35B:
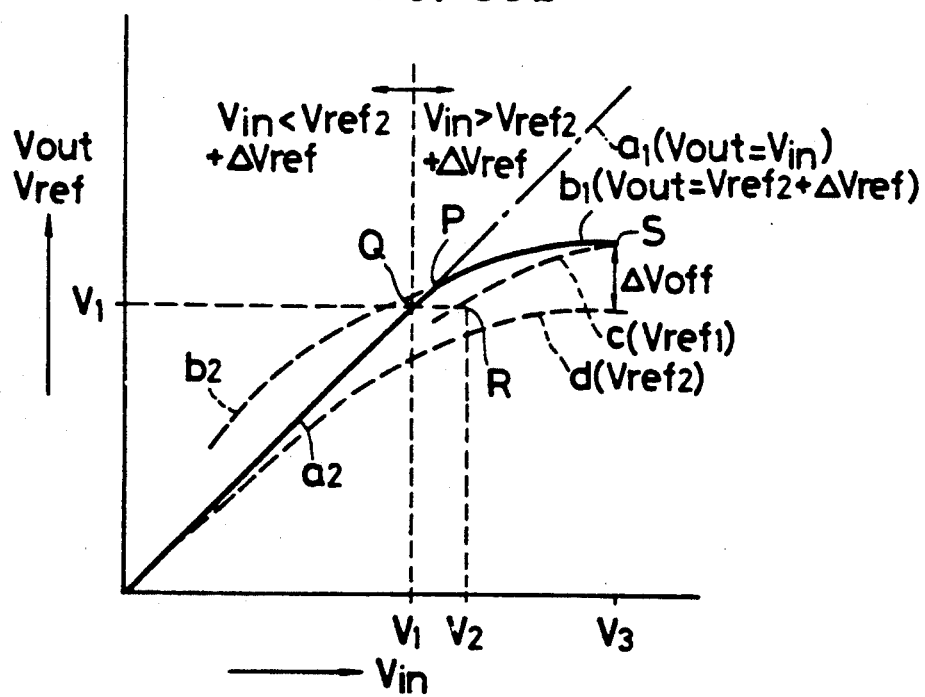
FIG. 35(b) is an electrical characteristic diagram for explaining the operation of the voltage regulator.

Such an effect of this invention will be described in detail with reference to the graph of FIG. 35(b) in comparison with the prior-art voltage comparing regulator having no offset.

In the figure, the axis of abscissas represents the input voltage $V_{in}$, while the axis of ordinates represents the output voltage $V_{out}$ and the reference voltage $V_{ref}$. Straight line $a_1$ indicates $V_{out}$ equal to $V_{in}$, in other words, a virtual curve in the case where the load L is operated directly by the input voltage $V_{in}$ without employing the voltage generator.

Curve c indicates a reference voltage $V_{refl}$ generated from any of reference voltage generator devices in various forms. In dependence on the form thereof, the reference voltage generator circuit device RVG utilizes parameters of semiconductor devices such as the threshold voltage $V_{th}$ of a MOSFET, the mutual conductance $g_m$, the forward voltage $V_F$ of backward Zener voltage $V_Z$ of a PN-junction, and the current gain $h_{fe}$ of a bipolar transistor. Therefore, the reference voltage $V_{refl}$ depends upon the supply voltage $V_{in}$ according to the voltage dependency of the parameter [$V_{refl}=f(V_{in})$].

In case where such a reference voltage $V_{refl}$ is used as the reference voltage of the voltage comparator circuit VC and where the comparator circuit VC is not endowed with the offset as previously stated, the output voltage $V_{out}$ becomes equal to the reference voltage $V_{refl}$ and agrees with the curve c. Since the reference voltage $V_{refl}$ does not become higher than the input voltage $V_{in}$, the output voltage $V_{out}$ becomes lower than the input voltage $V_{in}$ in any range. As a result, the input voltage $V_{in}$ at the time when the output voltage $V_{out}$ becomes equal to the lowest operating voltage $V_1$ of the load (point R) becomes $V_2$ ($V_2 > V_1$). Accordingly, the usable range of input voltages $V_{in}$ as viewed from the load L suffers a loss of a voltage component corresponding to $|V_2 - V_1|$.

In order to make this loss small, in the voltage regulator of FIG. 35(a) according to this invention the operational amplifier VC making up the voltage comparator balances when the inverting input (−) has become higher than the non-inverting input (+) by the offset voltage $\Delta V_{off}$.

In consideration of the offset voltage $\Delta V_{off}$ of the operational amplifier VC, a reference voltage $V_{ref2}$ (curve d) which is smaller than the virtual reference voltage $V_{ref1}$ and which has a similar characteristic is employed as an actual reference voltage $V_{ref}$. The values of $V_{ref2}$ and $\Delta V_{off}$ are set so that a substantial comparison voltage ($V_{ref2} + \Delta V_{off}$) at an input voltage $V_3$ in the normal operation may become equal to the virtual reference voltage $V_{ref1}$, namely, that it may agree with a desired operating point S.

With such a construction, the voltage comparator VC formed into the voltage follower balances under condition of $V_{out} = V_{ref2} + \Delta V_{off}$. Since input voltages $V_{in}$ satisfying the balance condition are only $V_{in} \geq V_{ref2} + \Delta V_{off}$.

In case where the input voltage $V_{in}$ is smaller than ($V_{ref2} + \Delta V_{off}$), the output voltage $V_{out}$ also becomes smaller than it, so that the voltage comparator VC functions intending to raise the output voltage $V_{out}$. This feedback control, however, is limited when the output voltage $V_{out}$ has become equal to the input voltage $V_{in}$.

Accordingly, with the inflexion point (P) at $V_{in} = V_{ref2} + \Delta V_{off}$, the output voltage $V_{out}$ is reduced (limited) to $V_{ref2} + \Delta V_{off}$ (curve $b_1$) when the input voltage $V_{in}$ is higher than the inflexion point P, and it is made substantially equal to the input voltage $V_{in}$ (curve $a_2$) when $V_{in}$ is lower than the inflexion point.

If the inflexion point P is the same as or higher than the lowest operating voltage $V_1$ (point Q) with respect to the input voltage $V_{in}$ (on the axis of abscissas), the foregoing loss can be avoided.

This is because the curve $b_1$ has a point of intersection with the straight line $a_1$ owing to $\Delta V_{off}$. In case where the operational amplifier does not have the offset voltage $\Delta V_{off}$ and where there is no point of intersection with the straight line $a_1$ as in the curve d, such an effect is not achieved.

Although a MOS FET $T_C$ in FIG. 35(a) functions as a source follower, it is a depletion mode N-channel FET, so that it makes $V_{out} = V_{in}$ possible when $V_{in} \leq V_{ref2} + \Delta V_{off}$ and that its threshold voltage $V_{th}$ has no loss. Accordingly, this is effective when the input voltage $V_{in}$ is small.

This, however, does not deny the use of a source follower FET of the enhancement mode. The enhancement mode FET is very effective in case where the input voltage is great and the $V_{th}$ loss is not a serious problem and where the adoption of a depletion mode FET manufacturing process is difficult. In this case, curve $a_2$ ($V_{out} = V_{in}$) which determines lower output voltages $V_{out}$ (below the changing point P) merely shifts downwards by $V_{th}$ ($V_{out} = V_{in} - V_{th}$), and it is similarly possible to bring forth the effect as previously stated on the output voltage $V_{out}$.

In the figure, the N-channel FET can be replaced with a P-channel FET. In this case, the P-channel FET functions with the source grounded, and the loss of $V_{th}$ above described is not involved.

Whether the source grounding or the source follower is adopted as the controlling FET does not produce an essential difference. However, in case of the source grounding, any special consideration for the loss of the threshold voltage $V_{th}$ as is done for the depletion mode FET is not necessary. In case of the source follower, when the operation of the voltage comparison needs to be cyclically sampled (for example, when the comparator is subjected to the clock drive in order to render the power dissipation low), this FET is convenient as it functions as a voltage follower. This is because the output voltage is determined by the gate voltage if the mutual conductance $g_m$ of the FET is sufficiently high.

It is also possible to use a bipolar transistor as the controlling transistor.

It is not necessarily denied that the offset $\Delta V_{off}$ becomes a function of the input voltage $V_{in}$. In setting the inflexion point P, however, it is desirable that $\Delta V_{off}$ is constant with respect to $V_{in}$.

If a reference voltage which has a fluctuating factor similar to that of the load L is used as the reference voltage $V_{ref2}$, output voltages $V_{out}$ corresponding to the characteristic of the load L can be obtained, which is also convenient. If, in that case, $V_{ref2}$ is set at the lowest voltage at which the load L can operate in advance, $\Delta V_{off}$ can be exploited as means of a certain margin.

While a construction for bestowing the offset $\Delta V_{off}$ and an application circuit exploit the difference of the threshold voltages of two MOS FETs according to the principle of this invention to be described later, another method for endowing the output voltage $V_{out}$ with the inflexion point will be explained here with reference to a circuit diagram of FIG. 36(a) and a graph of FIG. 36(b).

In the following description and the graph of FIG. 36(b), all the voltage values shall be absolute values.

Figure 36A:
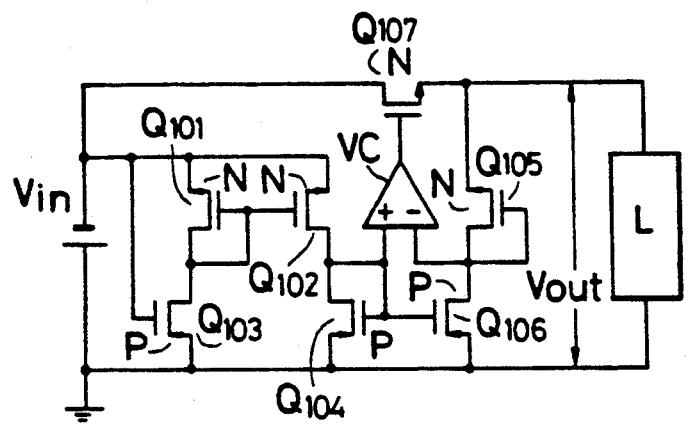
Figure 36B:
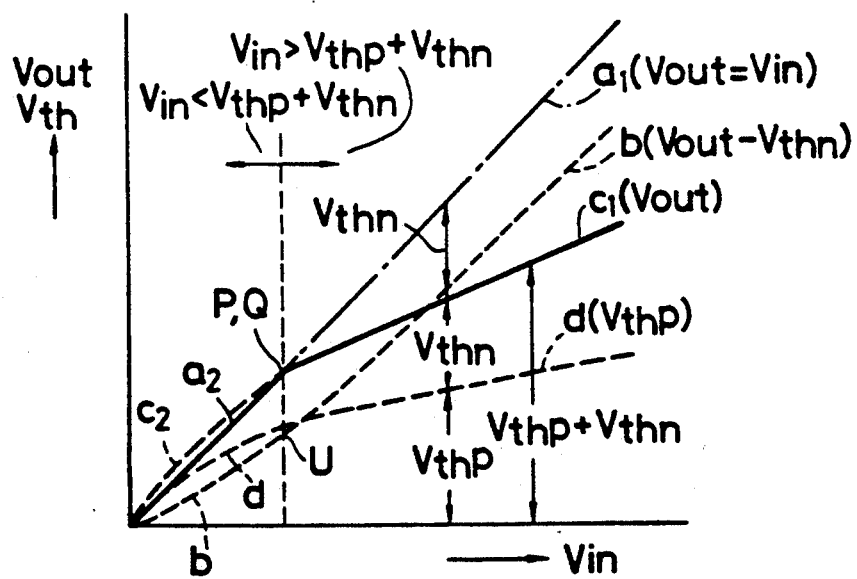
FIG. 36(b) is an electrical characteristic diagram for explaining the operation of the voltage regulator.

In FIG. 36(a), $Q_{107}$ designates a controlling transistor which is made of an N-channel depletion mode FET. N-channel FETs $Q_{101}$ and $Q_{102}$, and P-channel FETs $Q_{104}$ and $Q_{106}$ construct current mirror circuits. A drain current approximately equal to the drain current of $Q_{103}$ flows through a diode-connected P-channel FET $Q_{104}$ and a diode-connected N-channel FET $Q_{105}$. The source-drain voltage drops $V_{DS}$ of the diode-connected P-channel FET $Q_{104}$ and N-channel FET $Q_{105}$ become approximately equal to respective threshold voltages $V_{thp}$ and $V_{thn}$ owing to the high impedance loads $Q_{102}$ and $Q_{106}$. Accordingly, voltages $V_{thp}$ and ($V_{out} - V_{thn}$) are respectively applied to the non-inverting input (+) and the inverting input (−) of an operational amplifier VC constructing a voltage comparator (curves d and b in FIG. 36(b)).

Supposing a where the operational amplifier VC has no offset, it balances when both the inputs of the non-inverting input (+) and the inverting input (−) are equal. Accordingly, the equilibrium condition is ($V_{out} - V_{thn}$) = $V_{thp}$, that is, $V_{out} = V_{thp} + V_{thn}$. The output voltage $V_{out}$ is limited to ($V_{thp} + V_{tjn}$) when $V_{in} \geq V_{thp} + V_{thn}$, and it becomes substantially equal to $V_{in}$ when $V_{in} \leq V_{thp} + V_{thn}$. Accordingly, in case where the load L is constructed of a complementary MOS integrated circuit (CMOSIC), the operating lower-limit voltage of the CMOS circuit usually becomes ($V_{thp} + V_{thn}$) and the output voltage $V_{out}$ can compensate for it.

Although the threshold voltage to be derived by the diode-connected MOS $Q_{104}$ and $Q_{105}$ is close to the inherent threshold voltage, it is not equal thereto and follows up the drain current of the circuit. Of course, it is favorable to make the output voltage $V_{out}$ of the equilibrium point somewhat greater than the inherent $(V_{thp}+V_{thn})$. To that end, the mutual conductance of the FET $Q_{103}$ may be made small in advance so as to make low the current to flow through each MOS diode $Q_{104}$ or $Q_{105}$.

The approximate threshold voltage to be derived by the MOS diode premises the flow of the drain current. Therefore, the circuit must be constructed so that the currents may flow through both the diodes even when the input voltage $V_{in}$ becomes low.

Figure 37:
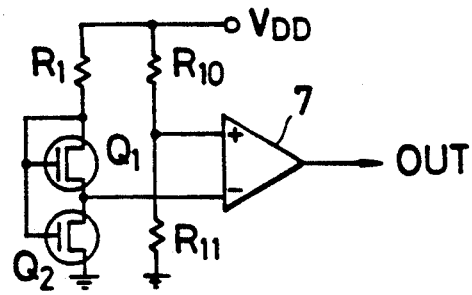
FIG. 37 is a circuit diagram showing an example in the case where this invention is applied to a battery lifetime detector circuit.

The reference voltage generator device according to this invention can generate the difference voltage of the threshold voltages of MOS as the reference voltage, and can therefore be constructed of MISFETs. Accordingly, it can be extensively utilized as various constant-voltage sources in monolithic integrated circuits for an electronic desk top calculator, an electronic timepiece etc. made up of MISFETs. As illustrated by way of example in FIG. 37, a lifetime detector circuit for a battery can be obtained in such a way that the output of the reference voltage generator device (N+-gate N-channel MOS $Q_1$, P+-gate N-channel MOS $Q_2$, resistor $R_1$) as shown in the foregoing embodiment is applied to one input of a voltage comparator circuit (7) as a reference voltage and that a voltage obtained by dividing a battery voltage ($V_{DD}$) by means of divider resistors ($R_{10}$, $R_{11}$) is applied to the other input.

In this case, since the battery voltage does not lower suddenly, it is desirable to drive the constant-voltage generator circuit, the voltage divider circuit and the voltage comparator circuit with clock pulses, thereby to achieve the reduction of current consumption. Likewise, in case where the constant-voltage output is not required at all times, the constant-voltage generator circuit may be clock-driven as stated above.

The circuit for obtaining the difference of the threshold voltages of the MISFETs ($Q_1$, $Q_2$) is not restricted to the construction of the above embodiment, but it can be modified variously and any concrete circuit arrangement may be used.

Figure 38:
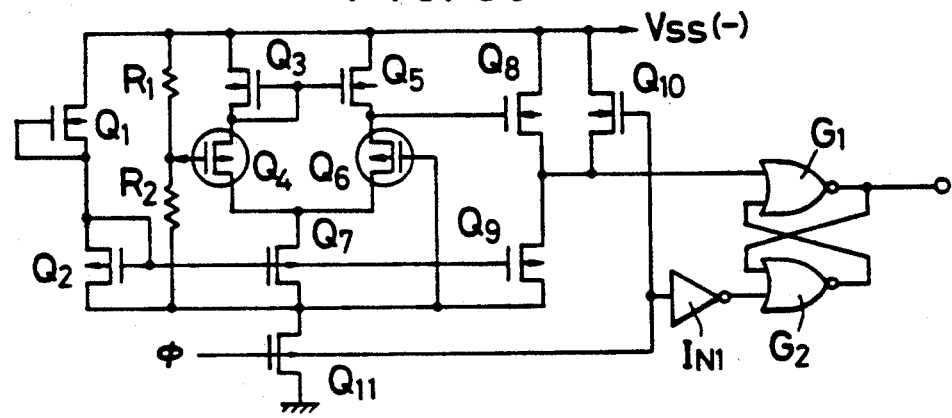
FIG. 38 is a diagram of a circuit for a clock-driven battery checker according to another embodiment.

FIG. 38 shows another embodiment in which this invention is applied to a battery checker.

$Q_1$, $Q_2$, $Q_7$ and $Q_9$ constitute a constant-current circuit. $Q_3$, $Q_5$, $Q_4$, $Q_6$ and $Q_7$ constitute a differential circuit. $Q_{11}$ and $Q_{10}$ serve for the clock drive to the end of the reduction of power dissipation.

$R_1$ and $R_2$ constitute a battery voltage divider circuit for setting the detection level of a battery voltage. $G_1$ and $G_2$ function to latch an output owing to $Q_8$ and $Q_9$.

$Q_4$ and $Q_6$ are an N+-gate P-channel MOS and a P+-gate N-channel MOS, respectively. By the ion implantation of equal quantities, $Q_6$ is adapted to operate in the depletion mode.

The embodiment shown in FIG. 38 is the battery checker for a timepiece. In case where the detection level is set between 1.3 V and 1.5 V, a current flowing through $Q_7$ has a positive gradient for the temperature, and the difference (=band gap voltage $\approx$1.1 V) of the threshold voltages of $Q_4$ and $Q_6$ has a negative gradient for the temperature. Therefore, the dimensional ratio of the MOSFETs is set so that the conductance of $Q_6$ may become smaller than the conductance of $Q_4$.

Figure 39:
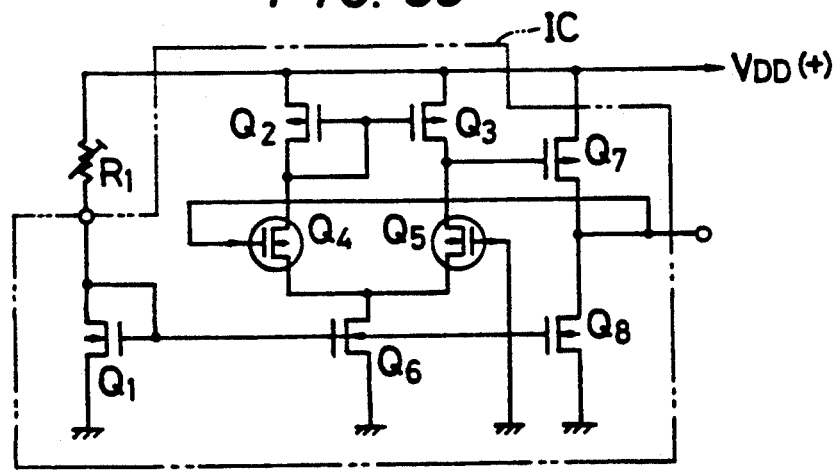
FIG. 39 is a diagram of a reference voltage generator circuit whose reference voltage can be finely adjusted with a resistor outside an IC.

FIG. 39 shows a high-precision reference voltage generator circuit of the voltage follower type utilizing an operational amplifier. N-channel MOS FETs of the P+-gate and N+-gate are used for $Q_4$ and $Q_5$, respectively. Further, the conductances of the FETs are made different to produce an offset voltage. By adjusting a resistor $R_1$ outside an IC, a constant current to flow through a constant-current source $Q_6$ is adjusted, thereby to adjust the offset voltage. Thus, the fine adjustment of a reference voltage is made possible.

Figure 40A:
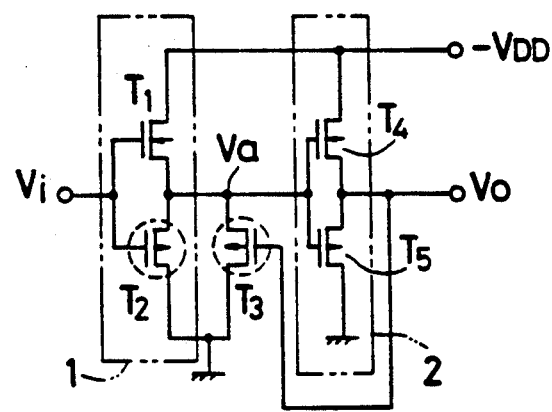

On the other hand, as a Schmitt trigger circuit composed of MISFETs, a circuit as shown in FIG. 40(a) which has reduced the number of constituent elements has been proposed by one of the inventors (Japanese Patent Application No. 52-147085 entitled "Schmitt Trigger Circuit" filed Dec. 9, 1977).

The circuit shown in FIG. 40(a) is such that two inverters are connected in cascade and that a MISFET ($T_3$) forming a positive feedback circuit is disposed between the input and output of the inverter on the output side. With the circuit, the width of a hysteresis curve (the difference of two logic threshold values $V_{TL1}$ and $V_{TL2}$) deviates on account of deviations in a supply voltage ($V_{DD}$), the threshold voltages ($V_{th}$) of MISFETs, etc. Therefore, in such a case where the circuit is applied to an oscillator whose output oscillates within the voltage width, the frequency deviates disadvantageously.

This invention employs MISFETs formed by a method wherein the threshold voltage of one ($T_2$) of MISFETs constituting the first-stage inverter in FIG. 40(a) is made higher than that of the other MISFET having the same conductivity type channel by a voltage component based on the difference of Fermi levels. In this way, it is intended that the width of the hysteresis curve of the Schmitt trigger circuit (the difference of two logic threshold voltages) assumes a fixed voltage (a voltage substantially equal to the Fermi level difference) fluctuating little against the supply voltage, the manufacturing deviations of the MISFETs, temperature changes, etc.

Hereunder, this invention will be concretely described in connection with an embodiment. Referring to FIG. 40(a), the Schmitt trigger circuit is constructed of an inverter (1) to which an input signal ($V_i$) is applied, an inverter (2) which receives an output of the inverter (1) as its input and which forms an output signal ($V_o$), and a MISFET ($T_3$) which is interposed between an input terminal and a ground terminal of the inverter (2) and which is controlled by the output signal ($V_o$).

The MISFET ($T_3$) acts as positive feedback means of the output side inverter (2). The operation of positively feeding the input signal of the inverter (2) to the output signal thereof is inseparable from the operation of the inverter (1) forming the input signal. The circuit operation is more easily understood when explained in relation with the input side inverter (1). The description will therefore be made so below.

When the input signal ($V_i$) is at a high level (ground level), the output of the input side inverter (1) becomes a low level ($-V_{DD}$) because the N-channel MISFET ($T_1$) is "on" and the P-channel MISFET ($T_2$) is "off". The N-channel MISFET ($T_4$) of the output side inverter (2) receiving this output of the input side inverter (1) turns "off" and the P-channel MISFET ($T_5$) turns "on", so that the output of the output side inverter (2) becomes the high level (ground level). For this reason, the P-channel MISFET ($T_3$) falls into the "off" state.

When, under this condition, the input signal ($V_i$) intends to change to the low level, the output of the inverter (1) forms an output signal which is dependent upon the level of the input signal ($V_i$) and which is determined by the impedance ratio of the MISFETs ($T_1$, $T_2$), because the MISFET $T_3$ is "off". The input level of the output side inverter (2) is changed from the low level to the high level.

Figure 40B:
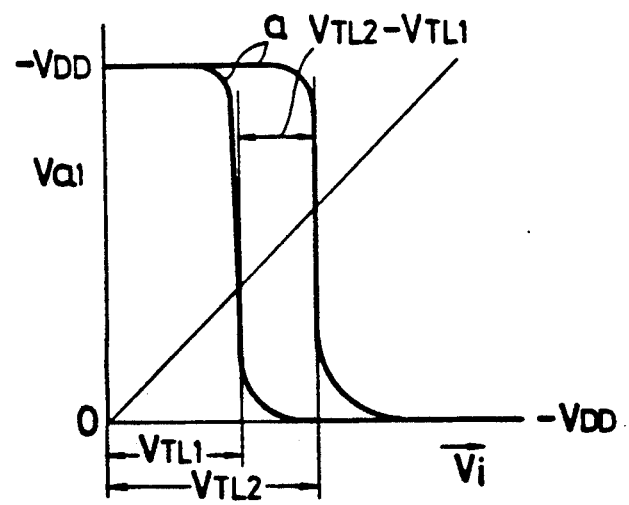
FIG. 40(b) shows the hysteresis characteristic of the Schmitt trigger circuit.

Accordingly, when the output of the output side inverter (2) is changed from the high level to the low level and this output signal ($V_o$) has exceeded the threshold voltage of the MISFET ($T_3$), the MISFET ($T_3$) starts the "on" operation. Owing to the "on" operation of the MISFET ($T_3$), the output level of the input side inverter (1) is decided by the impedance ratio between the MISFET ($T_1$) and the parallel MISFETs ($T_2$, $T_3$), and it is shifted onto a higher level side. In other words, upon the "on" operation of the MISFET ($T_3$) which is controlled by the output of the output side inverter (2), the positive feedback in which the input level of the output side inverter (2) is changed onto the high level side is applied to the input of the output side inverter (2). Then, the output signal ($V_o$) changes abruptly. Accordingly, the logic threshold value ($V_{TL2}$) in FIG. 40(b) is determined by the threshold voltages $V_{th1}$ and $V_{th2}$ and mutual conductances $\beta_1$ and $\beta_2$ of the MISFETs ($T_1$, $T_2$) in FIG. 40(a). That is, $$V_{TH2} = \frac{V_{DD} - V_{th1} + \sqrt{\frac{\beta_2}{\beta_1}}\, V_{th2}}{1 + \sqrt{\frac{\beta_2}{\beta_1}}} \tag{51}$$

On the other hand, when the input signal ($V_i$) is at the low level, the N-channel MISFET ($T_1$) of the input side inverter (1) is "off" and the P-channel MISFET ($T_2$) is "on", the N-channel MISFET ($T_4$) of the output side inverter (2) is "on" and the P-channel MISFET ($T_5$) is "off", and the P-channel MISFET ($T_3$) is "on" owing to the low level of the output signal ($V_o$), so that the output signal of the input side inverter (1) is determined by the impedance ratio between the MISFET ($T_1$) and the parallel MISFETs ($T_2$, $T_3$).

Accordingly, in the course in which the input signal ($V_i$) changes from the low level to the high level, unless the input signal ($V_i$) becomes a level higher than the logic threshold voltage ($V_{TL2}$) in the preceding operation, the output signal of the input side inverter (1) does not change to the low level. However, once this output (the input signal for the output side inverter (2)) has begun to change towards the low level and to change the output of the output side inverter (2) onto the high level side, the impedance of the MISFET ($T_3$) changes to increase. Therefore, the positive feedback in which the change of the output of the input side inverter (1), namely, the input signal of the output side inverter (2) is promoted is applied, and the output signal ($V_o$) changes abruptly. Here, when the P-channel MISFET ($T_2$) has its gate electrode formed of semiconductor of the opposite conductivity type (N-type) to the conductivity type (P-type) of the gate of the conventional P-channel MISFET ($T_3$) or formed of an intrinsic (i-type) semiconductor, it has a threshold voltage which is higher than the threshold voltage $V_{TH}$ of the ordinary MISFET ($T_3$) by a voltage corresponding to the difference of Fermi levels e.g. to the difference of the intrinsic level and the Fermi level, respectively.

Accordingly, the logic threshold voltage ($V_{TL1}$) in FIG. 40(b) is approximately expressed as follows:

$$V_{TL1} = \frac{V_{DD} - V_{th1} + \sqrt{\frac{\beta_3}{\beta_1}}\, V_{th3}}{1 + \sqrt{\frac{\beta_3}{\beta_1}}} \tag{52}$$

$\beta_2 = \beta_3$ is held by making the sizes of the MISFET ($T_1$) and the MISFET ($T_2$) equal. Therefore, the difference ($V_{TL2} - V_{TL1}$) of the two logic threshold values becomes:

$$V_{TL2} - V_{TL1} = \frac{\sqrt{\frac{\beta_2}{\beta_1}}}{1 + \sqrt{\frac{\beta_2}{\beta_1}}} (V_{th2} - V_{th3}) \tag{53}$$

Accordingly, the difference ($V_{TL2} - V_{TL1}$) of the logic threshold values in FIG. 40(b) assumes a fixed voltage which is proportional to the difference ($V_{th2} - V_{th3}$) of the threshold voltages of the MISFET (2) and the MISFET (3), that is, the difference of the Fermi levels of the gate electrodes of these MISFETs (2) and (3).

An example for deriving the voltage corresponding to the difference of the Fermi levels is to utilize the difference of the threshold voltages $V_{th}$ of two MOSFETs having semiconductor gate electrodes which have different conductivity types and which are formed on gate insulating films formed on an identical semiconductor substrate by an identical process. Hereunder, a concrete example will be explained.

FIG. 59 previously referred to represents the conceptual sectional structure of the respective FETs, and the structure can be fabricated by the MOS manufacturing process illustrated in FIGS. 73(a)-73(f). Hereunder, for the sake of brevity, the MOS transistor whose gate electrode is made of a P+-type semiconductor shall be called the "P+ gate MOS", and the MOS transistor whose gate electrode is made of an N+-type semiconductor shall be called the "N+ gate MOS".

The difference ($V_{thP+} - V_{thN+}$) of the threshold voltages of the P+ gate MOS and the N+ gate MOS becomes the difference of the Fermi potentials of semiconductors making the gate electrodes as seen from Equation (16).

While the above description has been made by taking the P+-channel MOS transistor as an example, quite the same applies to the case of the N+-channel MOS transistor. Besides, quite the same applies to the i-type gate MOS whose gate electrode is made of an intrinsic semiconductor.

Figure 41:
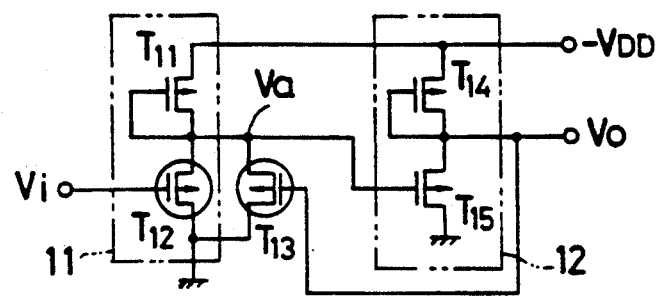
FIG. 41 shows a Schmitt trigger circuit according to another embodiment.

FIG. 41 shows a Schmitt trigger circuit according to another embodiment of this invention. The point of difference from the embodiment of FIG. 40(a) is that an input inverter (11) includes a P+-gate P-channel depletion type MOS transistor $T_{11}$ for a load, a P+-gate P-channel enhancement type MOS transistor $T_{12}$ for drive and an N+-gate P-channel enhancement type MOS transistor $T_{13}$ for feedback, and that an output inverter (12) includes a P+-gate P-channel depletion type MOS transistor $T_{14}$ for a load and a P+-gate P-channel enhancement type MOS transistor $T_{15}$ for drive. It is identical that the difference of logic threshold values becomes a constant voltage proportional to the difference of the Fermi levels of the gate electrodes of the MISFET (12) and MISFET (13).

Now, an oscillator will be described as an example of application of the Schmitt trigger circuit of this invention.

Figure 42:
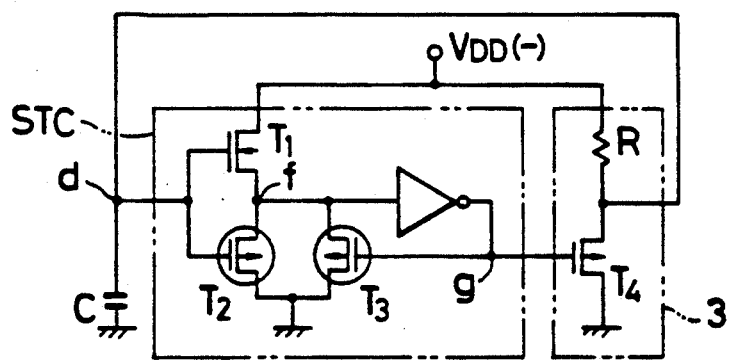
FIGS. 42 and 43 are diagrams each showing an oscillator circuit to which the Schmitt trigger circuit according to this invention is applied.

FIG. 42 is a circuit diagram of an oscillator to which the Schmitt trigger circuit of this invention is applied. A part enclosed with dotted lines in FIG. 42 is the Schmitt trigger circuit. An output of the Schmitt trigger circuit (STC) becomes an input of an inverter (3), an output of which becomes an input of the Schmitt trigger circuit (STC).

Upon closure of a supply voltage, the level of a point (d) proceeds towards the level $(-V_{DD})$ gradually. When it has exceeded the threshold voltage $(V_{TL2})$ of the Schmitt trigger circuit (STC), the potential of a point (f) changes to the ground voltage, and the potential of a point (g) changes to the supply voltages $(-V_{DD})$. Then, as the point (g) is the input of the inverter (3), a MISFET ($T_4$) turns "on", and the potential of the point (d) proceeds towards the ground voltage immediately. When the level of the point (d) has become below the logic threshold voltage $(V_{TL1})$ of the Schmitt trigger circuit (STC), the potential of the point (f) changes to the ground voltage, and the voltage of the point (g) changes to the supply voltage $(-V_{DD})$. Therefore, the MISFET ($T_4$) of the succeeding inverter (3) turns "off", and the level of the point (d) is charged according to a time constant CR which is determined by a resistor (R) and a capacitor (C) connected to the point (d). When the potential of the point (d) gradually approaches the supply voltage $(-V_{DD})$ and has exceeded the threshold voltage $(V_{TL2})$ of the Schmitt trigger circuit (STC), the potential of the point (f) changes to the ground potential, and the potential of the point (g) changes to the supply voltage $(-V_{DD})$. Thereafter, the inversions are similarly repeated to cause oscillation. Since the potential of the point (d) reciprocates between the two logic threshold voltages ($V_{TL1}$, $V_{TL2}$) of the Schmitt trigger circuit (STC), the oscillation frequency of the oscillator is determined by the speed at which charges are stored into or discharged from the capacitor (C) by the resistor (R) or the MISFET ($T_4$). Assuming now that the resistance (R) is sufficiently greater than the impedance of the MISFET ($T_4$), the oscillation frequency of the oscillator circuit is determined by only R and C, and the oscillation of a frequency which is stable against fluctuations in the supply voltage, temperature changes, manufacturing deviations, etc.

When the resistor (R) is mounted outside the integrated circuit, only one pin suffices for the integrated circuit of the oscillator circuit, and the stable oscillation is realizable under such a condition.

The resistor (R) may be any of a diffusion resistor, a resistor owing to a MISFET, etc. However, when a resistor of sufficiently small deviation is formed in an integrated circuit, the oscillator circuit can be entirely contained therein.

Figure 43:
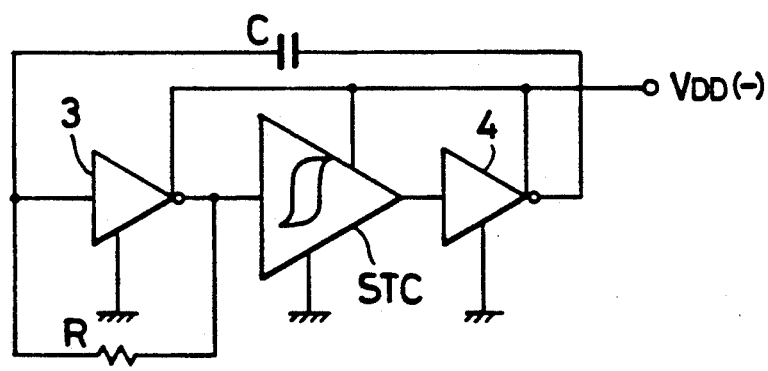

FIG. 43 is a circuit diagram showing an example of an oscillator circuit utilizing the Schmitt trigger circuit (STC) as shown in FIG. 41 in which the width of hysteresis is constant according to this invention. A third inverter (3) is connected to the input of the Schmitt trigger circuit (STC), a fourth inverter (4) is connected to the output of the Schmitt trigger circuit (STC), and a resistor (R) and a coupling capacitor (C) for determining the oscillation frequency are connected to the input of the third inverter (3).

Control of Threshold Voltage

The threshold voltages $(V_{th})$ of MOSFETs being discrete elements in a MOS integrated circuit form an important parameter which determines the characteristics of the LSI. The threshold voltage $V_{th}$ undergoes a great deviation due to the manufacturing process and a great change depending upon the temperature, and the control of $V_{th}$ is a difficulty in the manufacture of the MOS LSI.

Figure 47:
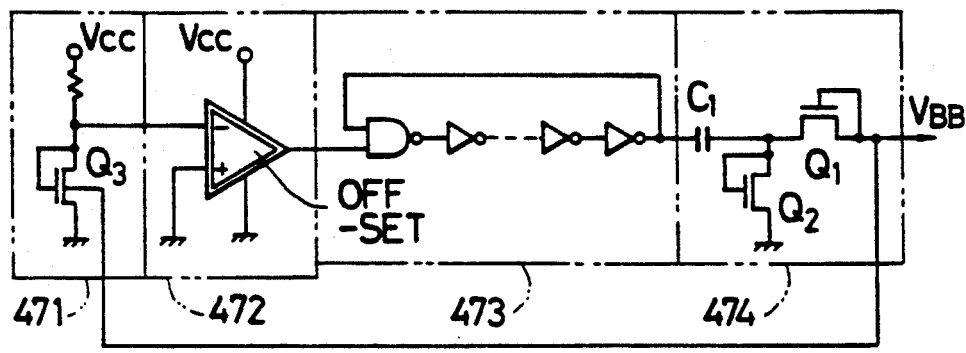
FIG. 47 shows a substrate bias generator circuit according to this invention.
Figure 50:
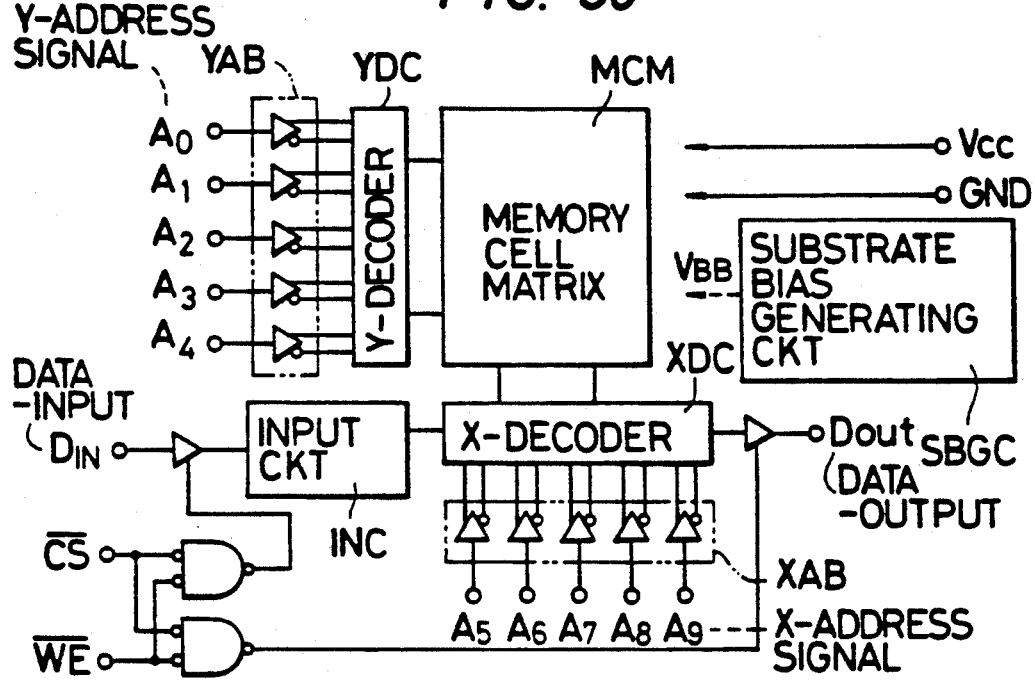
FIG. 50 shows a MOS memory which employs the substrate bias generator circuit shown in FIG. 47.

In this invention, as shown by way of example in FIG. 50, a bias voltage $V_{BB}$ is applied to a silicon substrate of a MOS memory IC to reduce parasitic capacitances. In order to obtain the bias voltage $V_{BB}$, a substrate bias generator circuit SBGC is employed. The substrate bias generator circuit SBGC has an arrangement which is illustrated in FIG. 47.

In this invention, the comparator employing the difference of the work functions of the gate electrodes of MIS FETs as previously stated is used in the substrate bias generator circuit SBGC so as to control $V_{th}$ into a constant voltage.

$V_{th}$ changes in dependence on the substrate bias $V_{BB}$, and is expressed by the following equation:

$$V_{th} = V_{tho} + K(2\phi_F + |V_{BB}| - 2\phi_F)$$

where $V_{tho}$ denotes $V_{th}$ when the substrate bias voltage $V_{BB} = 0$ V, K denotes the substrate effect constant, and $\phi_F$ denotes the Fermi level. Therefore, $V_{th}$ is controllable by varying the substrate bias $V_{BB}$. A substrate bias voltage generating circuit SBGC shown in FIG. 47 has a $V_{th}$ sense portion (471), a comparator (472), an oscillation circuit (473) and a waveform shaping portion (474). The oscillation circuit portion (473) may be replaced with another oscillation circuit. The waveform shaping portion (474) is composed of two MOS diodes $Q_1$ and $Q_2$ and a capacitor $C_1$, and it functions to drawing out charges of $V_{BB}$ to the earth point by a pumping action. Owing to the pumping action, $V_{BB}$ is drawn towards a negative voltage. The maximum voltage $V_{BBM}$ of $|V_{BB}|$ is determined by a point at which the drawing-out voltage owing to the pumping action and the substrate leakage current are stabilized. As long as the oscillation circuit is operating, $V_{BB}$ is held at the stable point $V_{BBM}$. After stop of the oscillation, however, the charges of the substrate leaks due to the substrate leakage current and $V_{BB}$ approaches the ground level. When $V_{BB}$ has become close to the ground level, $V_{th}$ lowers.

Figure 51:
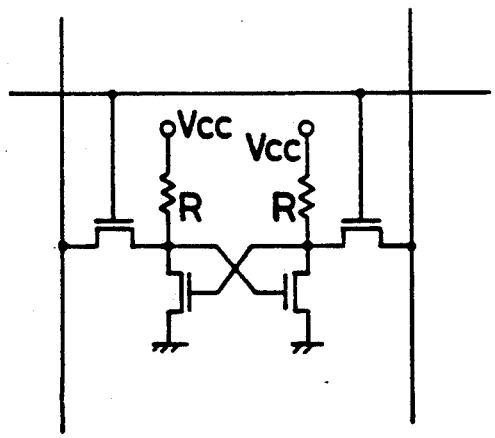
FIG. 51 shows a memory cell in the MOS memory of FIG. 50.

The comparator portion (472) in FIG. 47 exploits the difference of the Fermi levels of the gate electrodes, and an example in the N-channel process is shown in FIG. 21. The comparator portion (472) employs an intrinsic silicon gate MOS as $Q_1$ in FIG. 21, and an N gate MOS as $Q_2$. These are depletion type MOS. Therefore, this comparator effects the inversion when a voltage of $E_g/2 = 0.55$ V has been put into an inverting input $(-)$. The $V_{th}$ sense portion (471) in FIG. 47 is composed of a resistance and a diode-connected MOSFET $Q_3$. Here, the resistance may be either a polycrystalline silicon diffused layer resistance or a MOS resistance, and the resistance value is set so that an output may become 0.55 V when $V_{th}$ of $Q_3$ has become 0.55 V. Now, when the substrate bias voltage $V_{BB}$ is close to the ground level and $V_{th}$ of $Q_3$ is below 0.55 V, the (−) input voltage of the comparator portion becomes below 0.55 V, the output of the comparator becomes "1" and the oscillation circuit continues to operate. When the substrate bias voltage $V_{BB}$ approaches $V_{BBM}$ and $V_{th}$ rises and exceeds 0.55 V, the comparator output becomes "0", the oscillation ceases and the substrate bias voltage $V_{BB}$ becomes close to the ground level due to the leakage. That is, since a feedback loop is formed, $V_{th}$ is controlled to the stable point by this substrate bias generator circuit SBGC. The voltage 0.55 V obtained in the comparator portion (472) is ½ of the energy gap, which changes little against temperature changes, manufacturing dispersions and supply voltage fluctuations. Therefore, it becomes possible to control $V_{th}$ at a very high precision, and a MOSLSI which is wide in the temperature margin, the manufacturing process margin and the power supply margin is obtained. As will be stated later, also in point of the process, the intrinsic silicon gate MOS $Q_1$ of the comparator portion (472) can be obtained by quite an identical process to that for obtaining a high resistance load R in a memory cell shown in FIG. 51, so that the control of $V_{th}$ can be readily realized with the prior-art process.

Level Shift Circuit

In case where a 5 V power supply is employed as a power source in a MOSLSI and where signals from a TTL logic circuit are employed as inputs, the outputs of the TTL logic circuit become 2.0 V as a high level and 0.8 V as a low level. In converting the TTL signals into the MOS levels, it has heretofore been carried out to take the ratios of inverters in an input portion and to convert them into the MOS levels. However, there has been the problem that the input level margin becomes small on account of the dispersion of $V_{th}$ and temperature changes.

Figure 44:
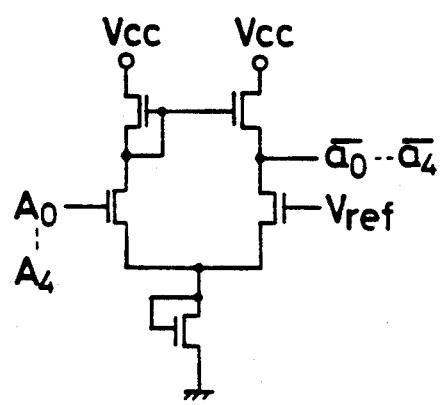
FIG. 44 shows a differential amplifier which employs MOSFETs.
Figure 45:
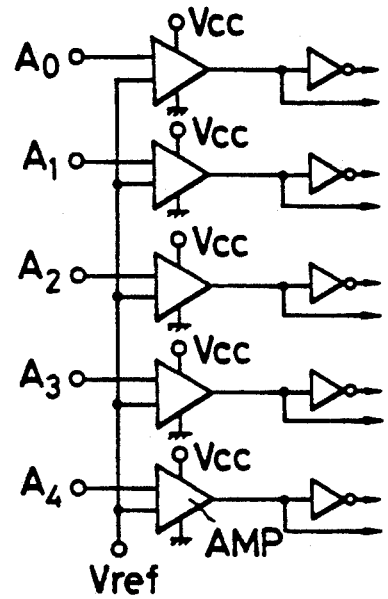
FIG. 45 shows a TTL-MOS signal level shifter circuit according to this invention.

FIG. 45 shows a TTL→MOS signal level converter circuit which employs the reference voltage $V_{ref}$ generated from the reference voltage generator circuit utilizing the difference of the Fermi levels of the gate electrodes as previously described. The signal level converter circuit in FIG. 45 is preferably applied to the address buffer circuits XAB and YAB of the MOS memory shown in FIG. 50. As the reference voltage $V_{ref}$, the reference voltage of 1.4 V is generated by the foregoing reference voltage generator circuit of FIG. 15. A differential amplifier employing MOSFETs in FIG. 44 is employed as an amplifier (AMP) in FIG. 45, and an input buffer in which the logic threshold voltage of an input is 1.4 V equal to the reference voltage $V_{ref}$ is prepared. With the present method, the TTL→MOS signal level converter circuit is obtained.

Alternatively, a signal level converter circuit which has the logic threshold voltage of 1.4 V can be obtained by employing the circuit shown in FIG. 13 as the amplifier (AMP) in FIG. 45. The inphase input (+) ② is grounded as shown in FIG. 14, and an address signal $A_0 - A_4$ is applied to the antiphase input (−). As the transistors $T_1$ and $T_2$, depletion type MOS FETs are used. By making the threshold voltages $V_{tj1}$ and $V_{th2}$ of the respective FETs unequal, the operational amplifier is endowed with an input offset voltage of 1.4 V.

Logic Threshold Stabilizing Circuit

Figure 46:
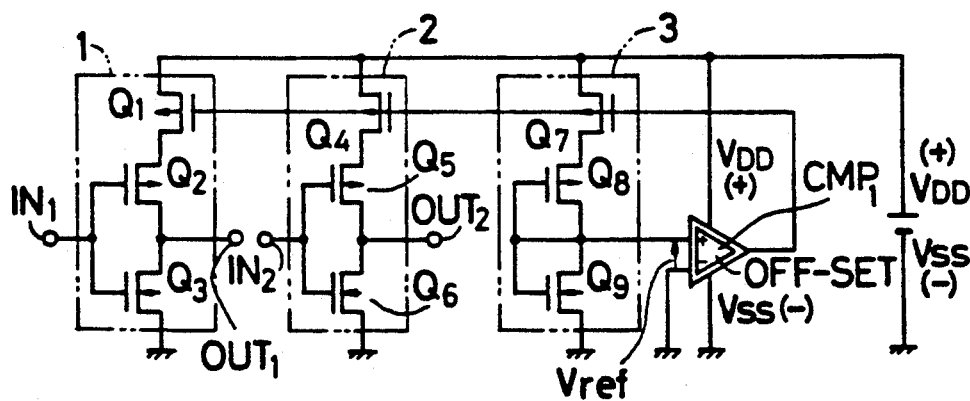
FIG. 46 shows a logic threshold stabilizer circuit according to this invention.

A circuit in FIG. 46 intends to always hold the logic threshold voltages of logical circuits such as inverter constant against changes in the service supply voltage, the threshold voltages of MOS transistors, temperatures, etc.

An inverter 1 composed of $Q_2$ and $Q_3$ and an inverter 2 composed of $Q_5$ and $Q_6$ are especially provided with MOS FETs $Q_1$ and $Q_4$ for controlling logic thresholds, respectively.

A logic threshold detector circuit 3 which is composed of a controlling MOSFET $Q_7$ and an inverter ($Q_8$, $Q_9$) with its input and output coupled is constructed so as to be similar to the inverters 1 and 2 stated above (the pattern size ratios of MOSFETs are equal). Owing to the coupling of the input and output of the inverter ($Q_8$, $Q_9$), just the logic threshold voltage is obtained.

CMP1 indicates the comparator circuit previously stated with reference to FIGS. 13 and 14 which has the reference voltage $V_{ref}$ as the offset of the differential circuit. The comparator circuit CMP1 compares the logic threshold and the reference voltage possessed therein, and controls the gate voltage of the controlling MOSFET $Q_7$ so that the difference of both the voltages may become substantially 0 (zero).

More specifically, if the logic threshold > the reference voltage ($V_{ref}$), the output of CMP1 becomes a high level, and the equivalent resistance of $Q_7$ increases and this transistor functions in the direction of lowering the logic threshold. In case where the logic threshold < the reference voltage ($V_{ref}$), the converse is true. Both the voltages fall into the equilibrium state when they are equal.

The gate voltages of the controlling MOSFETs $Q_1$ and $Q_4$ are common with the gate voltage of the controlling MOSFET $Q_7$, and the former transistors and the latter transistor are in the similar relationship. Thus, the logic thresholds of the inverters 1 and 2 become equal to the reference voltage, and very stable inverter characteristics are exhibited.

As stated at the beginning, this is not restricted only to the inverters, but is similarly applicable to the other logical circuits such as NAND and NOR.

This is readily applicable to the case of inverters and the like logical circuits of ordinary single-channel types, not the CMOS construction.

These circuits are useful as input interface circuits which can digitally process signals reliably especially when the ranges of input levels and logic amplitudes are narrow.

There will now be explained concrete examples in which the reference voltage generator means according to this invention is applied to a status setting circuit (an auto-clear circuit) for electronic devices.

Figure 48:
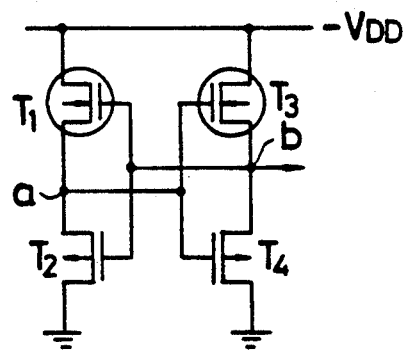
FIG. 48 shows a status setting circuit according to this invention.

FIG. 48 is a circuit diagram showing an example of a status setting circuit, which is a flip-flop circuit constructed of two inverters each including two MOS-FETs. Referring to the figure, in case where potentials at points a and b are 0 (zero), both the MOSFETs $T_1$ and $T_3$ falls into the "ON" state upon closure of a power supply ($-V_{DD}$) because they are N-channel MOS-FETs. Simultaneously with the closure of the supply voltage, the points a and b change towards the supply voltage ($-V_{DD}$). At this time, the Fermi levels of the gate semiconductors of the N-channel MOSFETs $T_1$ and $T_3$ differ from each other, and the threshold voltage $V_{th3}$ of the MOSFET $T_3$ is about three times greater than that $V_{th1}$ of the MOSFET $T_1$ (example: $V_{th1}=0.45$ V, $V_{th3}=1.25$ V). Therefore, in the course of the fall of the supply voltage, the MOSFET $T_3$ turns "OFF" previously. Since the MOSFET $T_1$ continues to be in the "ON" state, the points b and a are respectively stabilized at $-V_{DD}$ and the ground potential.

In case where, with the power supply ($-V_{DD}$) disconnected, the point a is at 0 V and charges remain at about 1 V at the point b, $T_3$ is in the "OFF" state till $V_{DD}=V_{th3}$ in the course of the fall of the supply voltage, and the MOSFET $T_1$ falls into the "ON" state at $V_{DD}=V_{th1}$. Therefore, even when the point a has been 0 V and the point b has been about 1 V (or up to $V_{thN}$ of $T_3$) in the initial state, the point b becomes $V_{DD}$ and the point a becomes 0 V in the stable state. Further, since all the FETs are constructed of E(enhancement)-MOSFETs in the present circuit, the current consumption in the stable state is almost zero.

Figure 49:
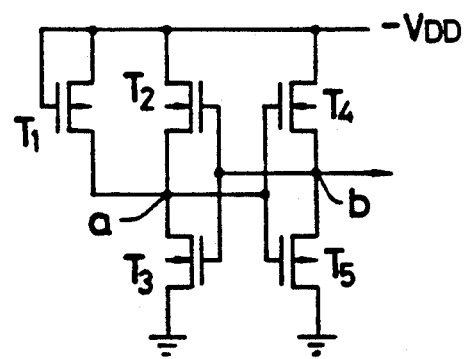
FIG. 49 shows a status setting circuit which has hitherto been proposed.

FIG. 49 is a circuit diagram which shows an example of a status setting circuit having heretofore been proposed. Referring to the figure, the threshold voltage $V_{th}$ of MOSFETs $T_2$ and $T_4$ are equal to each other, and an N-channel D (depletion)-MOSFET $T_1$ is inserted in order to increase the stability of a latch circuit. Owing to the D-MOSFET, upon closure of the power supply ($-V_{DD}$), the point a falls simultaneously with the power supply without fail, and the point b does not turn "ON" unless the supply voltage falls to $V_{th}$ of the MOSFET $T_4$, so that the point a and the point b become $-V_{DD}$ and 0 V in the stable state respectively. Since, however, the D-MOSFET is inserted between the point a and $-V_{DD}$ in the present circuit, the P-MOSFET $T_3$ turns "ON" when the state in which the point b is $-V_{DD}$ and the point a is 0 V (RESET) is subsequently established from some reason, and a D.C. path due to $T_1$ and $T_3$ arises to result in a high current consumption. In contrast, with the status setting circuit of this invention as shown in FIG. 48, the status setting can be reliably done and the current consumption is very low as described above, and hence, effective status setting means can be provided.

Now, an embodiment in which this invention is applied to a semiconductor random access memory (RAM) will be described.

In general, in a storage device constructed of a static RAM, the voltage control of lowering a supply voltage is carried out in order to reduce power dissipation at the time when the storage device is not used (stand-by status). This is called the data retention mode.

In this case, a signal voltage is lowered simultaneously with the supply voltage. In this regard, since a power supply line has a greater time constant than a signal line, the signal voltage lowers to a predetermined value faster. Usually, in a semiconductor RAM, a read control signal is set at a supply voltage level, a write control signal at a reference voltage level, and a chip select signal at a reference potential level.

In the data retention mode, therefore, the level of the control signal lowers faster than the supply voltage, so that the read control signal becomes the write control signal level instantaneously and that the chip select signal is formed. For this reason, the write operation is effected instantaneously, and the information of a bit selected at that time is destroyed.

In order to solve this problem, in a RAM constructed of field-effect transistors of a single channel, it is considered to dispose a time constant circuit for making the time constant of the signal line greater. With this measure, however, an external circuit is required, and the control signals are adversely affected.

In a C-MOS (complementary MOS) integrated circuit, a p-n-p-n element is prone to be formed on account of the structure thereof. Therefore, when the signal voltage is made higher than the supply voltage, such a p-n-p-n element operates, and a great current flows between the supply voltage and the reference potential. For this reason, a time constant circuit with which the signal voltage and the supply voltage lower at the same time must be selected for the C-MOS memory.

These facts are serious problems in the design and manufacture of storage devices on the side of the user of memory chips.

In this regard, it is desirable that a circuit for sensing the lowering of the supply voltage is contained in the same chip as that of the RAM. However, MOSFETs on the semiconductor chip have the temperature dependency of threshold voltages $V_{th}$, manufacturing deviations, etc., and it has been difficult to obtain a detection voltage necessary for the sensing at high precision.

Hereunder, this invention will be concretely described along an embodiment.

Figure 52:
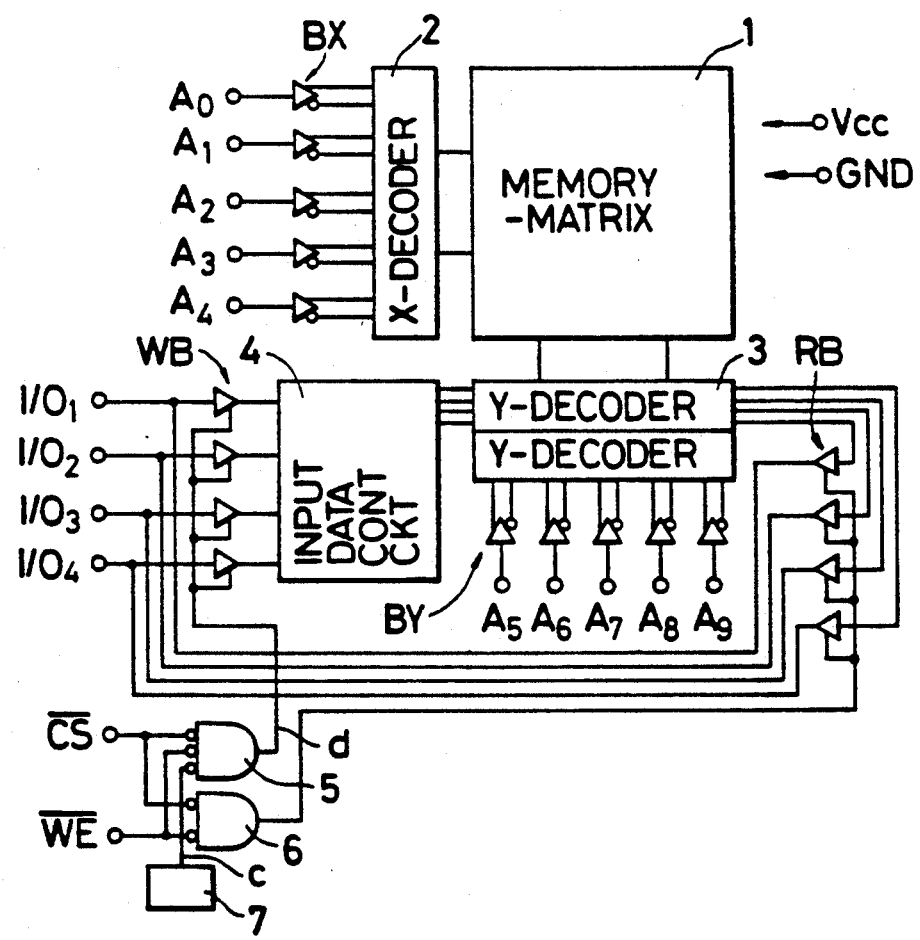
FIG. 52 shows a semiconductor random access memory according to this invention.

FIG. 52 is a block diagram of a static type semiconductor memory integrated circuit device showing an embodiment of this invention.

In the FIG. (1) designates a memory matrix (64×64 bits) circuit which is constructed of static memory cells.

(2) designates an X-decoder circuit. It discerns an information pattern assigned by a row select signal ($A_0$-$A_4$) and applied through a buffer circuit BX, to assign a row (X) line of 1/64.

(3) indicates a Y-decoder and input/output circuit. This circuit (3) discerns an information pattern assigned by a column select signal ($A_5$-$A_9$) and applied through a buffer circuit BY, to assign a column (Y) line of 1/64. It also gives the assigned column line of the memory matrix an input data applied through gates WB. It also provides an output data from the assigned column line to terminals ($1/0_1$-$1/0_4$) through gates RB.

(4) indicates an input data control circuit, which gives the input/output circuit the input data to-be-written. ($1/0_1$-$1/0_4$) indicate input/output terminals. ($\overline{CS}$) denotes a chip select signal, which indicates the selection of this chip by the "0" level i.e. reference potential level.

($\overline{WE}$) denotes a write/read control signal. It signifies the write operation when it is at the "0" level i.e. the reference potential level, while it signifies the read operation when it is at the "1" level i.e. supply voltage level.

(5, 6) designate gate circuits which are alternately controlled by the control signals.

That is, only when ($\overline{CS}$) is "0", the gate circuits are controlled by either "0" or "1" of ($\overline{WE}$), to execute the write or read operation.

Figure 53A:
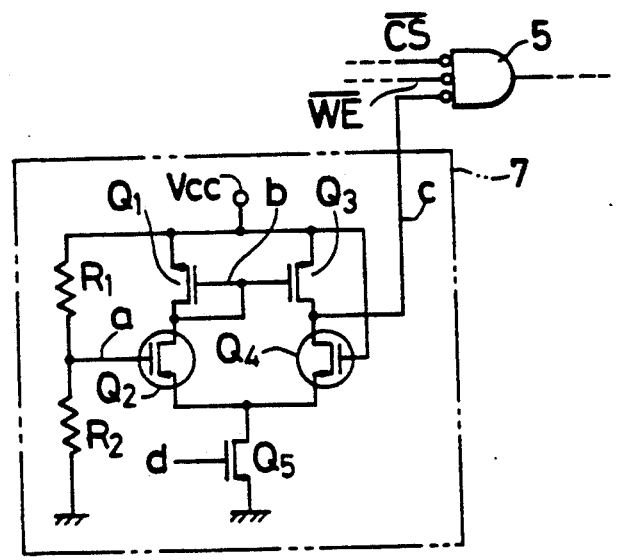

(7) designates a voltage detector circuit. It detects the data retention mode on the basis of the fact that the supply voltage has become below a predetermined voltage, and it controls the gate circuit (5) so as to inhibit the ($\overline{WE}$) at that time. Thus, the malfunction as previously described is prevented. An example of the concrete arrangement of the voltage detector circuit (7) is shown in FIG. 53(a).

Resistors ($R_1$, $R_2$) connected in series constitute a circuit for dividing a supply voltage ($V_{cc}$). The voltage divider circuit applies a divided voltage (a) to the gate of an N-channel MISFET ($Q_2$). The supply voltage ($V_{cc}$) is applied to the gate of an N-channel MISFET ($Q_4$).

A MISFET ($Q_5$) has its gate supplied with a suitable bias voltage from (d), and constructs a constant-current source. It constitutes an operational amplifier, together with load MISFETs ($Q_1$) and ($Q_3$) and the two differential input MISFETs ($Q_2$) and ($Q_4$).

The differential input MISFETs ($Q_2$) and ($Q_4$) are formed on, for example, N-type silicon layers of equal conductivities, and the respective gate electrodes are made of different materials so that the threshold voltages may become unequal. The gate electrodes of the two MISFETs ($Q_2$) and ($Q_4$) are made of, for example, silicon, and their conductivity types are made different. The MISFET ($Q_2$) has the N-type silicon gate, whereas the MISFET ($Q_4$) has the P-type silicon gate. As a result, the threshold voltage ($V_{th4}$) of the MISFET ($Q_4$) becomes greater than the threshold voltage ($V_{th2}$) of the MISFET ($Q_2$) by the difference of the Fermi levels of the P-type and N-type silicon gates.

Accordingly, the operational amplifier has an offset voltage equal to the difference of the threshold voltages.

Under the state under which the supply voltage $V_{cc}$ is comparatively great in the circuit of FIG. 53(a), the MISFET ($Q_4$) is in the "on" state and ($Q_2$) is in the "off" state, and the potential of a point c is at the low level. Due to the lowering of the supply voltage $V_{cc}$, the potential of the point (a) changes as indicated by a curve a in FIG. 53(b). When, due to the lowering of the supply voltage $V_{cc}$, the potential difference between the supply voltage $V_{cc}$ and the potential of the point a has become smaller than the offset voltage, the MISFET ($Q_4$) falls into the "off" state and ($Q_2$) falls into the "on" state. In consequence, the potentials of the points b and c in the circuit of FIG. 53(a) change as indicated by curves b and c in FIG. 53(b), respectively. That is, the potential of the point c becomes the high level when the supply voltage $V_{cc}$ has lowered to a predetermined value.

As described above, the detection level of the circuit of FIG. 53(a) is determined by the offset voltage owing to the MISFETs ($Q_2$) and ($Q_4$) and the divided voltage owing to the resistors $R_1$ and $R_2$. It is not affected by the threshold voltages of the respective MISFETs.

The offset voltage is at a comparatively high precision because it is decided by the difference of the Fermi levels of the gate electrodes of the two MISFETs ($Q_2$) and ($Q_4$) as stated previously. Since, in a semiconductor integrated circuit, the relative values of the resistances of resistor elements are at a comparatively high precision, the voltage division ratio owing to the resistors ($R_1$) and ($R_2$) is at a comparatively high precision.

As a result, the detection level of the circuit of FIG. 53(a) can be set comparatively accurately.

Figure 53B:
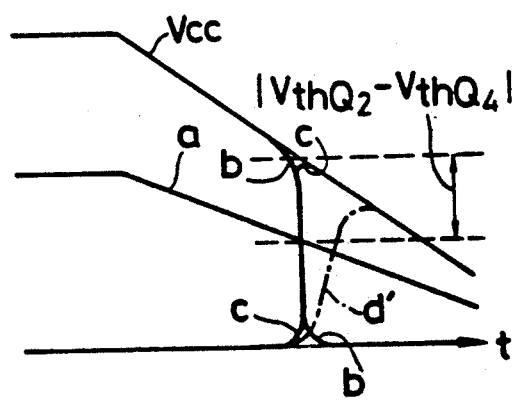
FIG. 53(b) shows the operating waveforms of the voltage detector circuit.

In FIG. 53(b), a waveform (d') indicates the output of the gate circuit (5) during the data retention mode during which the gate circuit (5) is not controlled by the detection output.

In the data retention mode, the input control signals ($\overline{CS}$) and ($\overline{WE}$) lower faster than the supply voltage ($V_{cc}$) of the gate circuit (5). Therefore, when the difference of both the voltages has become above the logic threshold, the output waveform (d') as stated above is generated. This forms the cause of the malfunction explained before.

According to the circuit of the present embodiment, however, the control signal (c) is applied to the input of the gate circuit (5), so that the waveform (d') is inhibited from being provided. Thus, the erroneous write in the data retention mode can be prevented, and data stored in the matrix memory are not destroyed.

In accordance with the embodiment set forth above, the erroneous write in the data retention mode can be perfectly prevented. Moreover, the detector circuit can be constructed with the simple circuit arrangement and can be contained in the memory chip. It is therefore unnecessary to care for the prevention of malfunctions on the side of the user of the semiconductor memory device.

For example, the gate circuit which is controlled by the voltage detection output may obtain the chip select signal. All the memory cell select signals may be inhibited so as to select no memory cell.

This is because the erroneous write can be prevented when one of conditions necessary for the execution of the write operation is inhibited.

The voltage divider circuit which constitutes the voltage detector circuit in the previous embodiment may utilize resistance by means of MISFETs instead of the resistor elements. Desirably, the resistance of this voltage divider circuit is made a large value in order to make the power dissipation low.

The two MISFETs of the foregoing embodiment which have silicon gate electrodes of conductivity types opposite to each other are fabricated within a silicon monolithic semiconductor integrated circuit chip. Since these FETs are manufactured under substantially the same conditions except the conductivity types of the gate electrodes, the difference of the threshold voltages $V_{th}$ of both the FETs becomes approximately equal to the difference of the Fermi levels of P-type silicon and N-type silicon. The P-type and N-type gate electrodes are doped with respective impurities to the vicinities of the saturation densities, and the difference becomes approximately equal to the energy gap $E_g$ of silicon (about 1.1 V), which is utilized as a reference voltage source.

The reference voltage generator device based on such a construction is low in the temperature dependency and small in the manufacturing deviations.

The voltage detector circuit 7 can be modified variously.

That is, the reference voltage sources which exploit the difference of the Fermi levels of semiconductors forming the gate electrodes of two MOS FETs as shown in FIG. 6(b), FIG. 8, FIG. 9, FIG. 10(a), FIG. 11(a), FIG. 12, FIG. 13, FIG. 14, FIG. 15, FIG. 16 and FIG. 17 are effective as the reference voltage source for the voltage detector circuit of this invention.

To this end, there can be employed two FETs which have semiconductor gate electrodes of different conductivity types as already explained with reference to FIG. 59, for example, a MOS transistor with its gate electrode made of a P+-type semiconductor or a P+-gate MOS transistor and a MOS transistor with its gate electrode made of an N+-type semiconductor or an N+-type semiconductor or an N+-gate MOS transistor. As already described with reference to FIGS. 73(a) to 73(f), the above two FETs can be manufactured without the change or addition of any step by the conventional CMOS manufacturing process.

In case of employing the conventional CMOS manufacturing process, the self-alignment structure as shown in FIGS. 65(a) and 65(b) and FIGS. 66(a) and 66(b) is obtained as stated below. Since the MOS transistors are of the P-channel in this case, a P-type impurity is diffused into both end parts of a gate electrode adjoining the source and drain in both the P+-gate MOS and the N+-gate MOS. In a central part of the gate electrode, a P-type impurity is diffused for the P+-gate MOS, and an N-type impurity is diffused for the N+-gate MOS.

Between the central region and both the end parts adjoining the source and drain, regions i in which no impurity is diffused are disposed. Thus, it is considered that the difference of the P+-gate MOS and the N+-gate MOS is only the conductivity type (P or N) of the semiconductor forming the central region of the gate.

Further, in order to reduce to the utmost the deviation (difference) of the effective channel lengths of the MOS transistors attributed to the fact that the regions of the gates which are formed for the self-alignment and in which the P-type impurity is diffused shift onto either the left or right side (source side or drain side) at the manufacture on account of the error of the mask alignment, the columns of the source regions and the drain regions are alternately arranged, and the left half and the right half are put into a line symmetry with respect to the channel direction as a whole. Accordingly, even when the misregistration of the mask alignment with respect to the channel direction (leftward or rightward shifting) changes the effective channel lengths of the FETs in the respective columns, the average effective channel lengths of the P+-gate MOS and the N+-gate MOS in the respective columns connected in parallel have the shifting canceled as a whole and become substantially constant.

Besides by making the compositions of the gate electrodes different, unequal threshold voltages are realized by the ion implantation into channels as described with reference to FIG. 7, by utilizing a doped gate oxide, by changing the thickness of gate insulating films, etc.

An example in FIG. 54 is the example in which the battery checker of the example of FIG. 20 is applied to an electronic timepiece.

$T_1$, $T_2$, $T_{41}$-$T_{49}$ and $R_{41}$ and $R_{42}$ constitute a circuit which checks the voltage level of a mercury battery $E_1$ having a nominal voltage of 1.5 V. A transistor pair ($T_1$; $T_2$) in a differential portion is constructed of a P+ gate N-channel MOS $T_1$ and an N+ gate N-channel MOS $T_2$, the channel portions of which are subjected to ion implantation so that the threshold voltages of both the transistors may lie within 1.0 V to 1.5 V being the operating power supply range of the electronic timepiece.

The difference of the threshold voltages to serve as a reference voltage is about 1.1 V in case of a silicon semiconductor. In order to set at about 1.4 V a level for detecting that the voltage of the battery $E_1$ has lowered, an adjustment is made by the resistance ratio of the resistance means $R_{41}$ and $R_{42}$.

In order to make the current consumption negligible in practical use, the battery checker is intermittently operated by a clock signal $\phi$ which is obtained from a frequency divider circuit FD and a timing circuit TM.

An output of the battery checker is statically held by a latch which is composed of NAND gates $NA_1$ and $NA_2$. The timing circuit TM is controlled by a logic level of an output from the latch circuit, whereby a driving output of a motor is changed and the method of moving hand of the timepiece is changed so as to indicate the lowering of the battery voltage. The lowering of the battery voltage can also be indicated without changing the movements of the hand and by, for example, flickering an electrooptic device such as a liquid crystal and light emitting diode.

In the figure, OSC indicates a crystal oscillator circuit which is constructed of a CMOS inverter and which also includes components outside the IC, a crystal $X_{tal}$ and capacitances $C_G$ and $C_D$. WS indicates a waveform shaping circuit which converts the oscillation output from a sinusoidal wave into a rectangular wave. $C_M$ indicates an excitation coil of a step motor for driving the second hand. $BF_1$ and $BF_2$ indicate buffers which are constructed of CMOS inverters and which serve to drive the excitation coil $C_M$ while inverting the polarities every second.

All the circuits within the IC are operated by the mercury battery $E_1$ of the nominal 1.5 V. TM is the timing pulse generator circuit which reveives a plurality of frequency division outputs of different frequencies from the frequency divider circuit FD and the control output of the latch composed of $NA_1$ and $NA_2$ and which generates pulses having any desired period and pulse width. The IC is of a monolithic Si semiconductor chip for a hand type electronic wrist watch which is fabricated by the Si gate CMOS process already explained with reference to FIGS. 73(a)-73(f).

Figure 55:
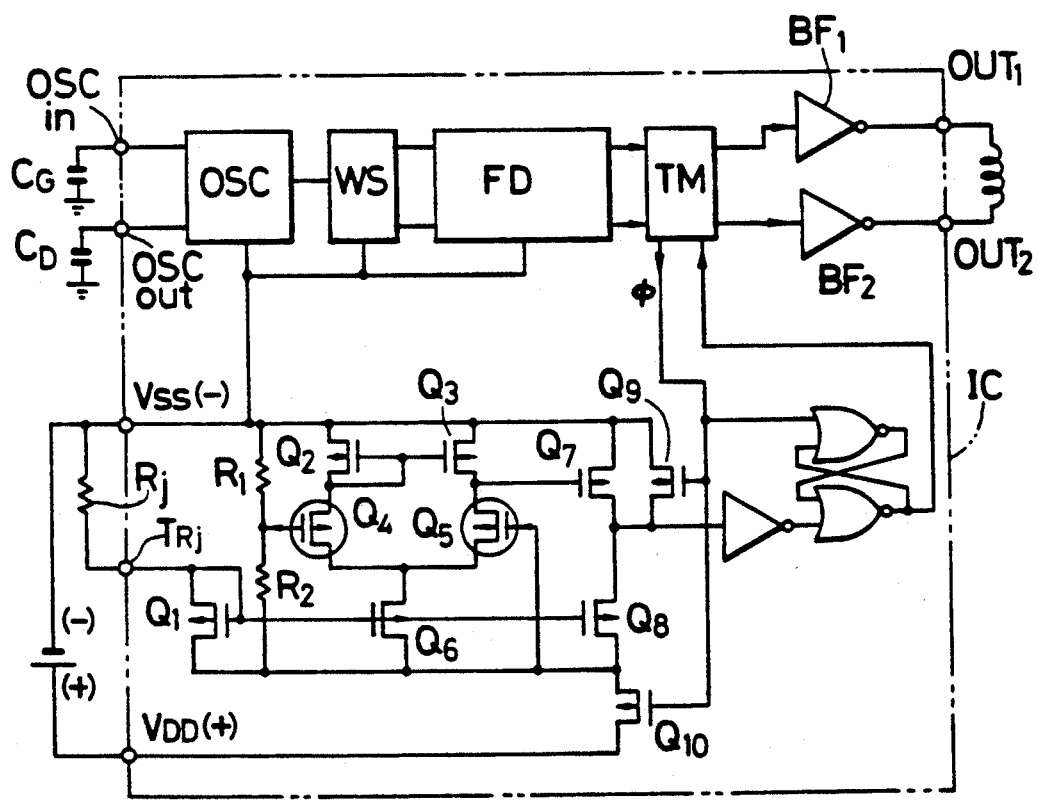
FIG. 55 shows an electronic timepiece to which a similar battery checker is applied.

FIG. 55 shows an example of the construction of a circuit system for an electronic wrist watch containing a battery checker therein. In this example, the conductances of FETs $Q_4$ and $Q_5$ of a differential circuit are made unequal as in FIG. 39, and the detection level can be finely adjusted by means of an adjusting resistor $R_j$ outside the IC.

Owing to the resistor $R_j$, deviations in the manufacture can be perfectly avoided in use.

Now, an example in which the voltage regulator as shown in FIG. 36(a) is applied to an electronic timepiece will be explained with reference to FIG. 56.

Figure 56:
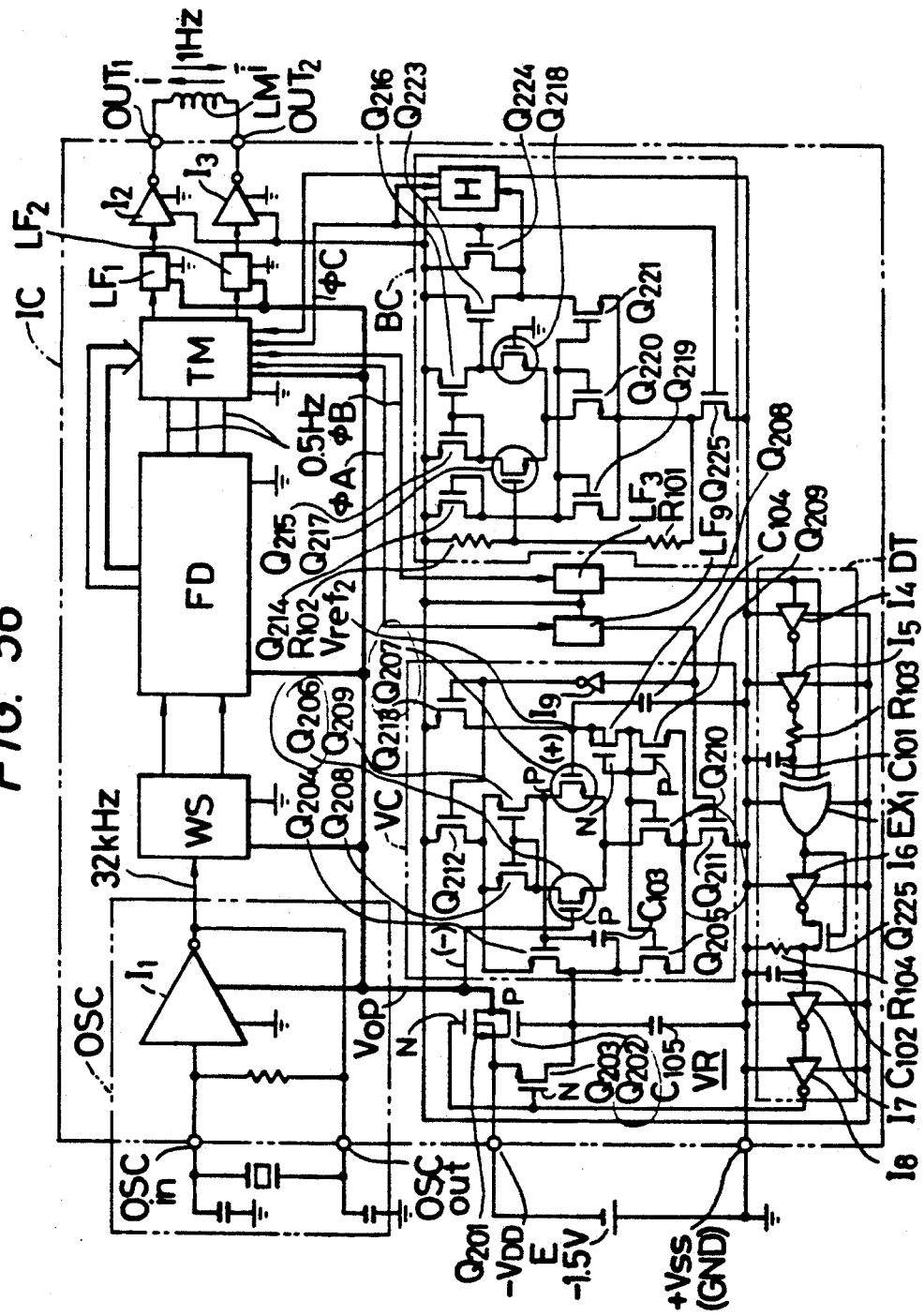
FIG. 56 shows an electronic timepiece to which the voltage regulator as shown in FIG. 36(a)

In FIG. 56, OSC designates a crystal oscillator, WS a waveform shaping circuit which converts a sinusoidal wave oscillation output into a rectangular wave, FD a frequency divider circuit, TM a timing pulse generator circuit which prepares pulses of predetermined period and width from frequency division outputs, LF a level shift circuit which converts a signal of low level into a signal of high level, BC a battery lifetime detector, VC a voltage comparator, VR a voltage regulator which uses the voltage comparator VC, H a hold circuit, DT an oscillation state detector, and LM an excitation coil of a step motor for driving a second hand.

The detector DT detects it through the frequency divider FD and the timing circuit TM that the oscillator OSC has oscillated. In case of the oscillation, it actuates the voltage regulator VR to drop the operating voltage $V_{op}$ of the oscillator OSC as well as WS, FD, TM etc. into a value below the battery voltage ($-1.5$ V).

The moment a battery E is turned "on", the input node of an inverter $I_7$ becomes the earth potential (logic "0") owing to a discharging resistor $R_{104}$, so that an N-channel FET $Q_{201}$ is brought into the "ON" state and that the output of the regulator is made $-1.5$ V being the battery voltage. At this time, a FET $Q_{203}$ is also turned "ON", and the gate node of a FET $Q_{202}$ is charged. This is to the end of previously making the negative feedback loop of the regulator active lest the regulator output should drop the moment the FET $Q_{201}$ is subsequently switched "OFF".

When the oscillator has started operating, the other logical circuits are already in the operative state, so that a pulse $\phi_B$ is supplied from the timing circuit TM to the detector DT. An exclusive OR circuit $EX_1$ detects the issue of the pulse $\phi_B$. One input thereof receives the pulse $\phi_B$ delayed by inverters $I_4$ and $I_5$ and an integration circuit $C_{101}$ and $R_{103}$ with respect to the other. Upon the issue of the pulse $\phi_B$, accordingly, a pulse of a width corresponding to the delay time is provided at the output of the gate $EX_1$. This pulse is integrated by a rectifier circuit made up of a FET $Q_{225}$, an inverter $I_6$ and a capacitor $C_{102}$, and turns "OFF" the N-channel FETs $Q_{201}$ and $Q_{203}$ upon lapse of a short time from the beginning of the issue of $\phi_B$. Thus, the regulator VR generates a predetermined voltage (less than 1.5 V) at the source electrode of the controlling P-channel FET $Q_{202}$ by the negative feedback control loop, and it contributes to reduce the power dissipation of the electronic timepiece.

Hereunder, the operation of the regulator, especially the voltage comparator VC will be explained. Since this comparator VC effects an operation similar to that of the comparator CP described with reference to the principle diagram of FIG. 35(a) and the characteristic diagram of FIG. 35(b), only a brief explanation will be given.

Figure 67A:
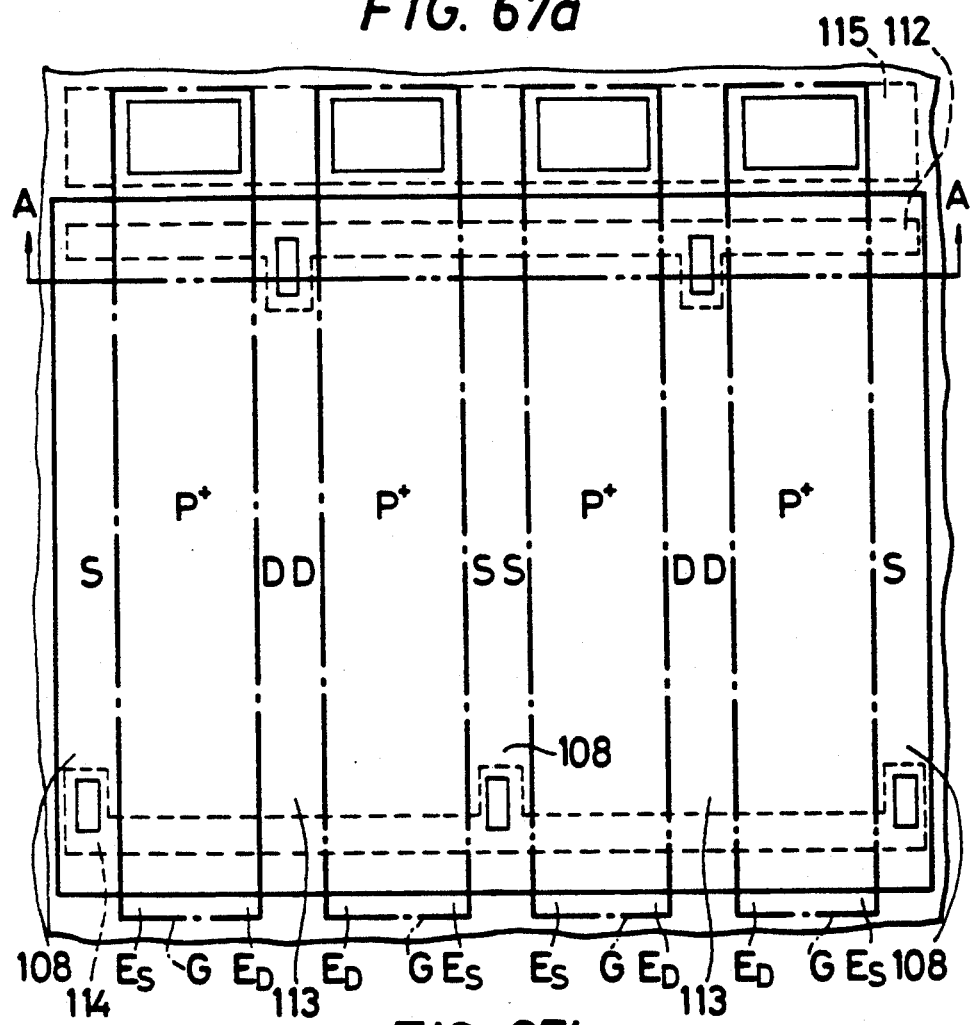
FIGS. 67(a) and 67(b) show a plan view and a sectional view of a $P^+$ gate P-channel MOSFET, respectively.
Figure 67B:
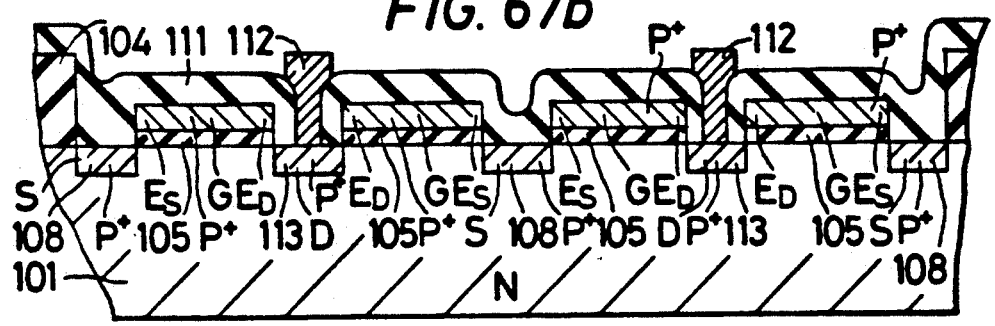
Figure 68A:
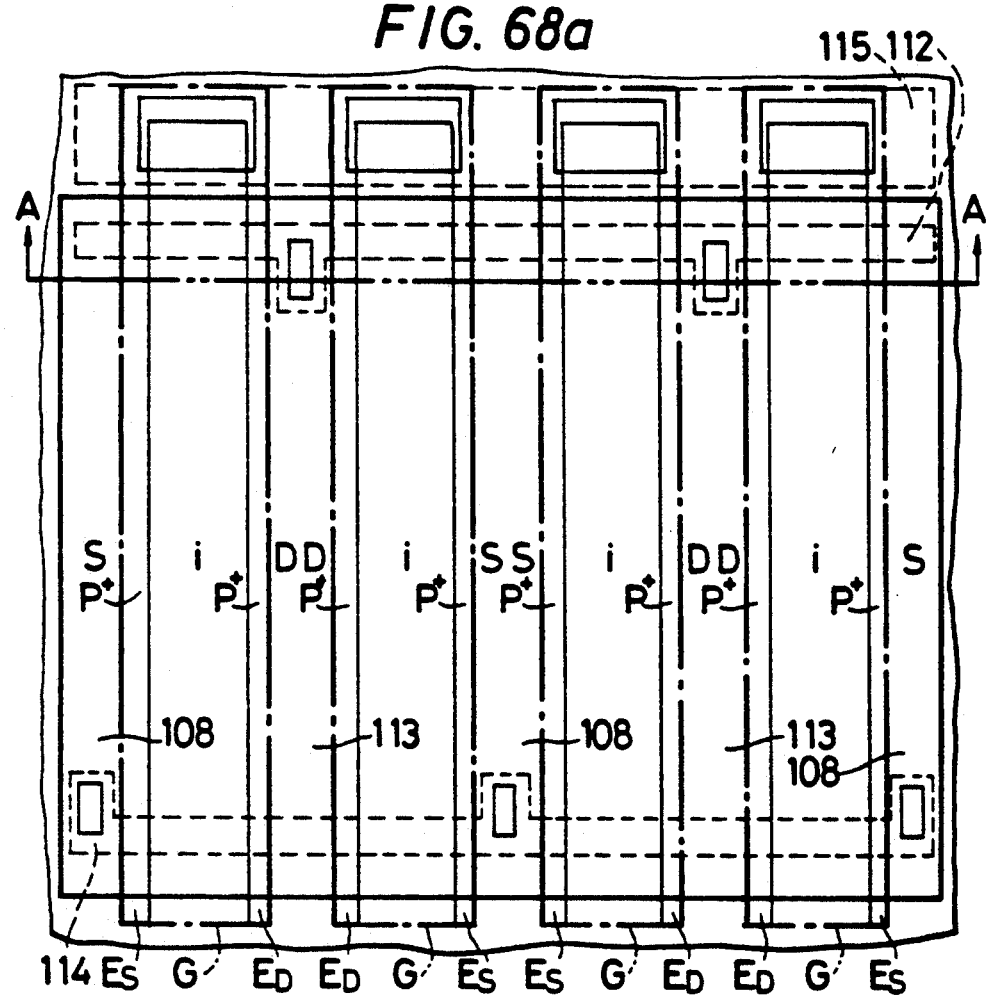
FIGS. 68(a) and 68(b) show a plan view and a sectional view of an i gate P-channel MOSFET, respectively.
Figure 68B:
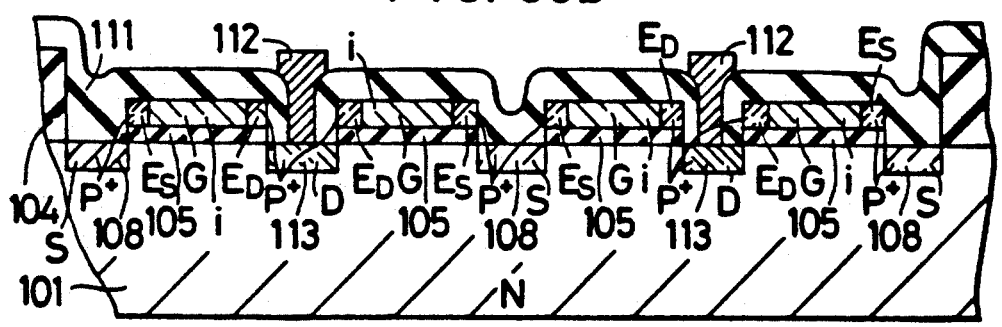
Figure 69A:
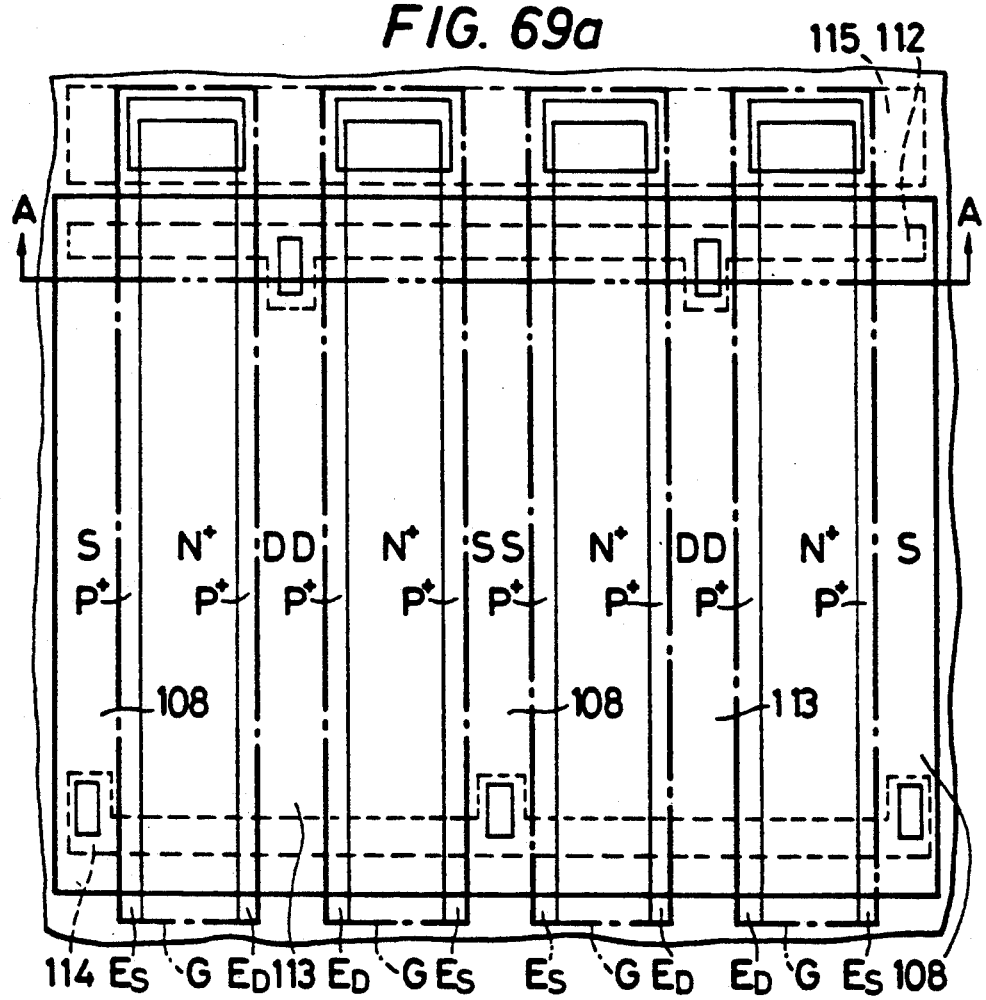
FIGS. 69(a) and 69(b) show a plan view and a sectional view of an $N^+$ gate P-channel MOSFET, respectively.
Figure 69B:
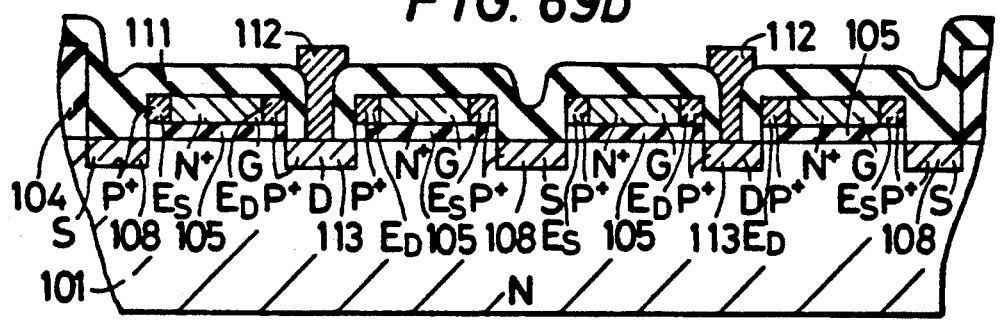
Figure 70A:
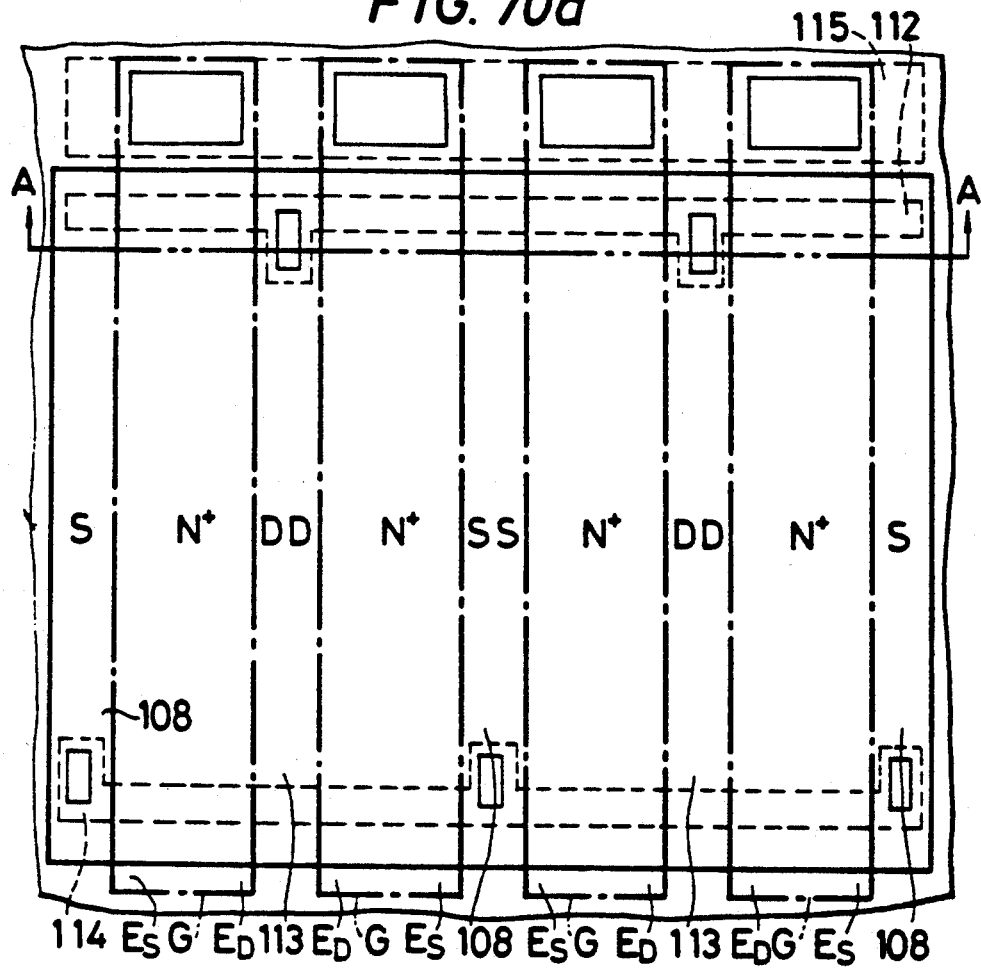
FIGS. 70(a) and 70(b) show a plan view and a sectional view of an $N^+$ gate N-channel MOSFET, respectively.
Figure 70B:
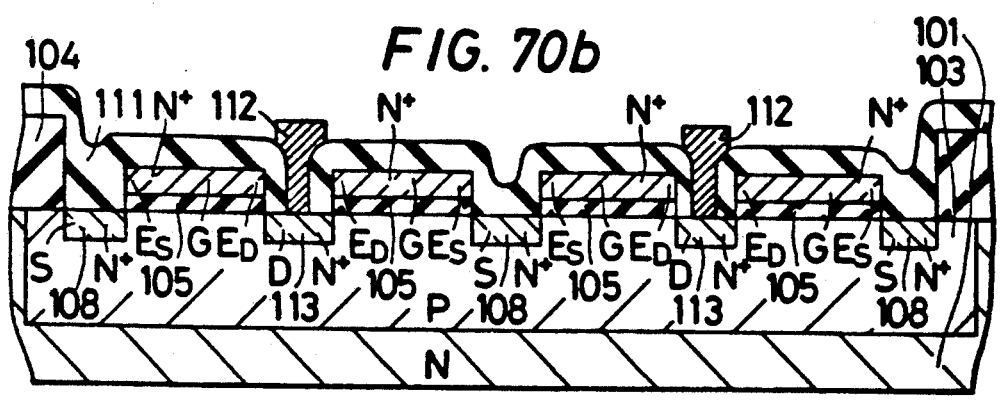
Figure 71A:
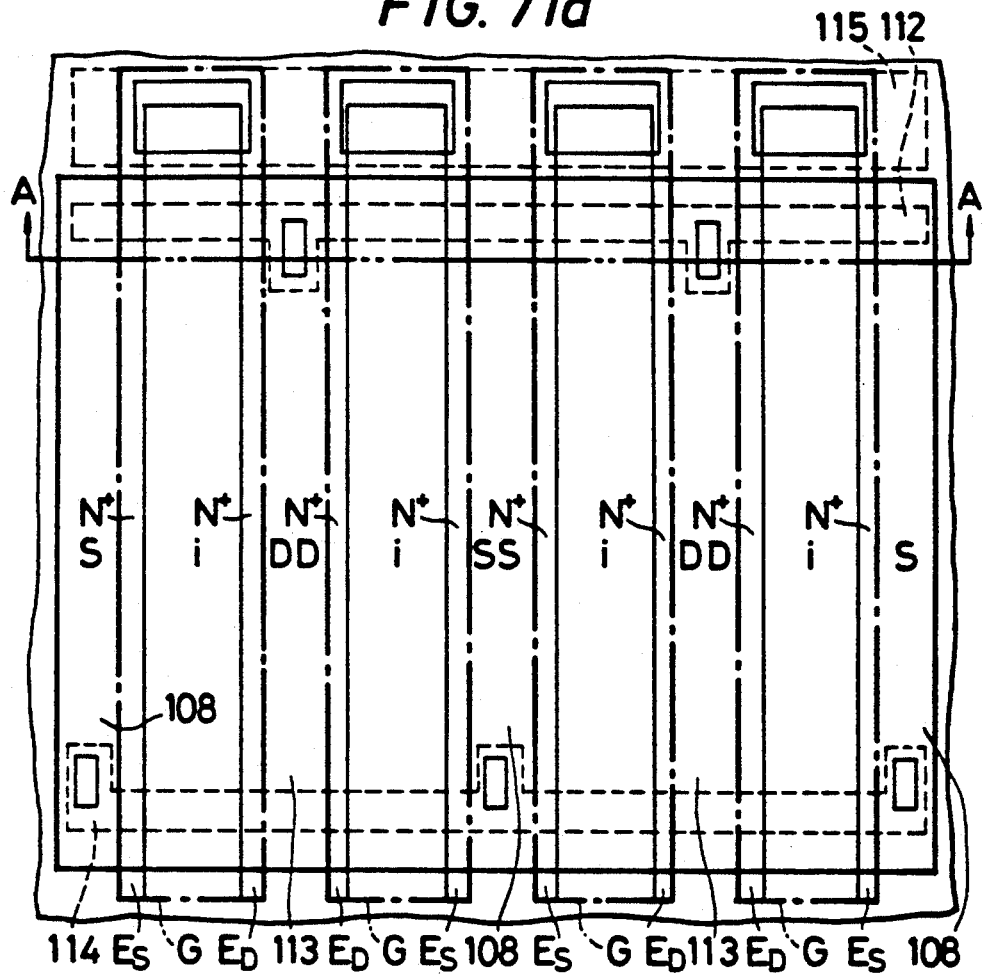
FIGS. 71(a) and 71(b) show a plan view and a sectional view of an i gate N-channel MOSFET, respectively.
Figure 71B:
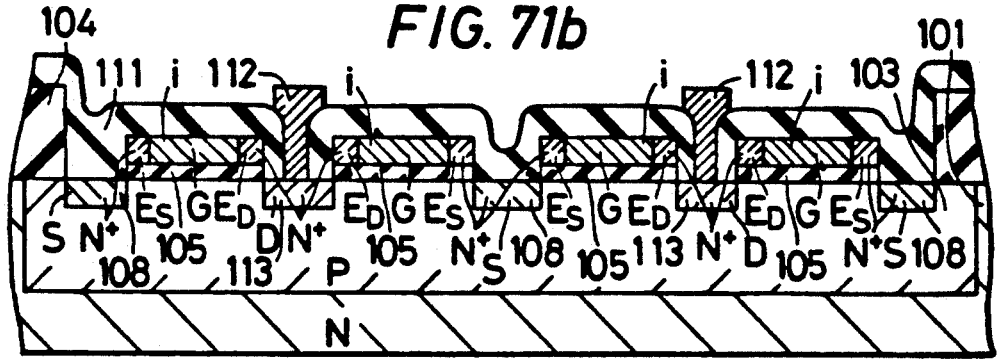
Figure 72A:
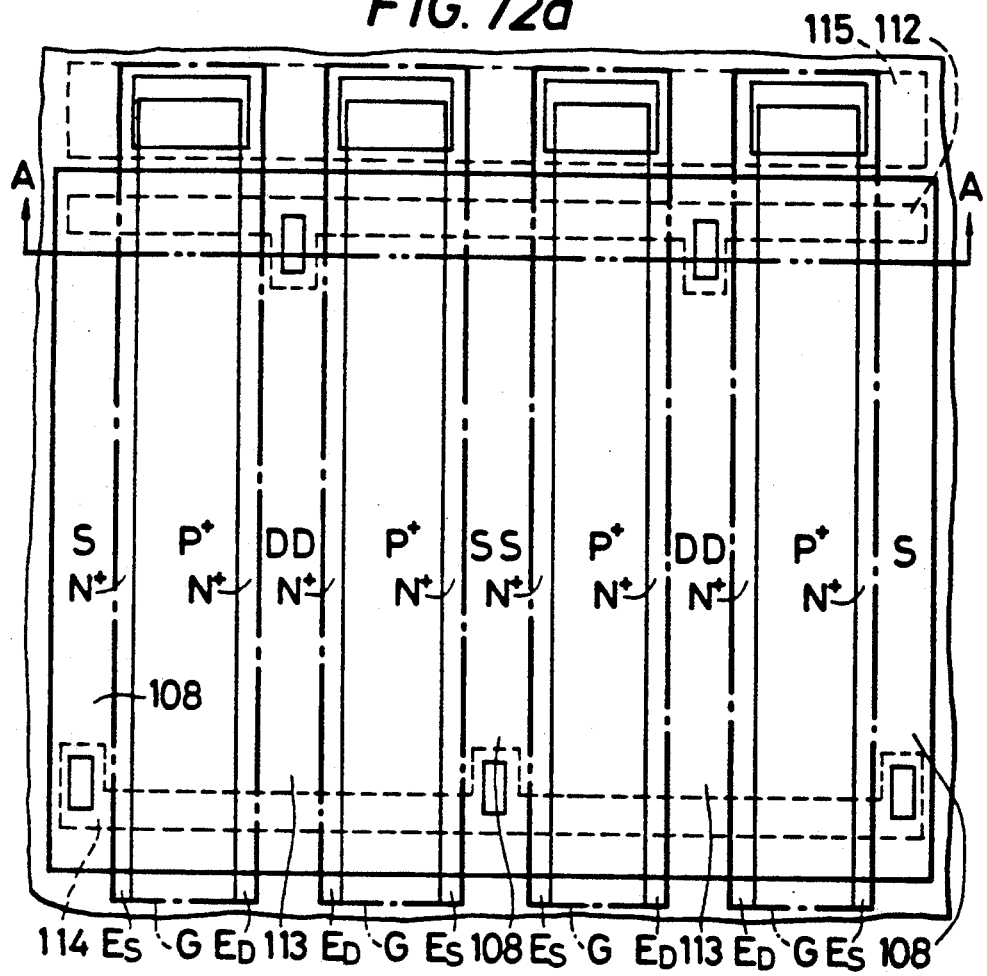
FIGS. 72(a) and 72(b) show a plan view and a sectional view of a $P^+$ gate N-channel MOSFET, respectively.
Figure 72B:
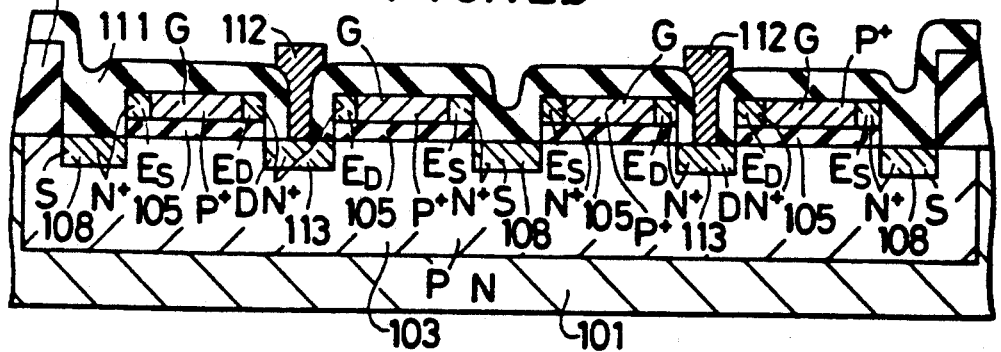

Regarding P-channel MOSFETs $Q_{206}$ and $Q_{207}$, in order to obtain the offset voltage $V_{off}$, the gate of $Q_{206}$ is made the P-type as in $Q_1$ of FIG. 60 and FIGS. 67(a) and 67(b), and the gate of $Q_{207}$ is made the i-type (intrinsic semiconductor) as in $Q_2$ of FIG. 60 and FIGS. 68(a) and 68(b). Accordingly, the threshold voltage $V_{th}$ of $Q_{207}$ becomes higher than that of $Q_{206}$ by about 0.55 V, which serves as the aforecited offset voltage $V_{off}$. On the other hand, since both an N-channel FET $Q_{208}$ and a P-channel FET $Q_{209}$ are diode-connected, the sum of both the threshold voltages $V_{th}$ i.e. ($V_{thp209} + V_{thn208}$) is applied to the gate of $Q_{207}$ being the non-inverting input (+) of the comparator VC, and the sum serves as the voltage $V_{ref2}$ as indicated in the curve d in FIG. 35(b). On the other hand, the gate of the FET $Q_{206}$ being the inverting input (−) of the comparator is connected to the source of the controlling P-channel FET $Q_{202}$ of the source follower type.

Accordingly, the output voltage $V_{out}$ of the voltage regulator VR which is generated at the source of the controlling FET $Q_{202}$ under the control action of this controlling FET $Q_{202}$ driven by the comparator VC becomes $V_{out} = V_{thp209} + V_{thn208} + \Delta V_{off}$ (in case where $V_{in} \geq V_{thp} + V_{thn} + \Delta V_{off}$). When the input voltage $V_{in}$ is low, the output voltage becomes $V_{out} = V_{in}$ as in the foregoing. Of course, the output voltage $V_{out}$ of the voltage regulator VR is utilized as the operating voltage $V_{op}$ of the oscillator OSC as well as WS, FD, TM, etc.

In order to render the power dissipation low, this comparator has the operating time limited by a timing signal $\phi_A$ owing to the on-off operation of the driven FET $Q_{211}$. Of course, the same applies to the circuit for obtaining the reference voltage $V_{ref2}$. To this end, a capacitor $C_{104}$ is connected to the gate of $Q_{207}$ and a capacitance $C_{105}$ is connected to the gate of $Q_{202}$ so as to hold the voltage of the reference voltage $Q_{ref2}$ and to hold the gate voltage of $Q_{202}$, respectively. These capacitances $C_{104}$ and $C_{105}$ are added separately from parasitic capacitances such as gate capacitances. A capacitor $C_{103}$ serves to prevent any oscillation which is attributed to a phase rotation caused by the cascade connection of several FETs in the feedback loop.

Since the battery checker BC has a construction similar to that in FIG. 54, the explanation is omitted.

At the output stage of the IC, drivers $I_2$ and $I_3$ for the excitation coil directly use the battery of 1.5 V as the power supply in order to make the driving capability high.

Figure 57:
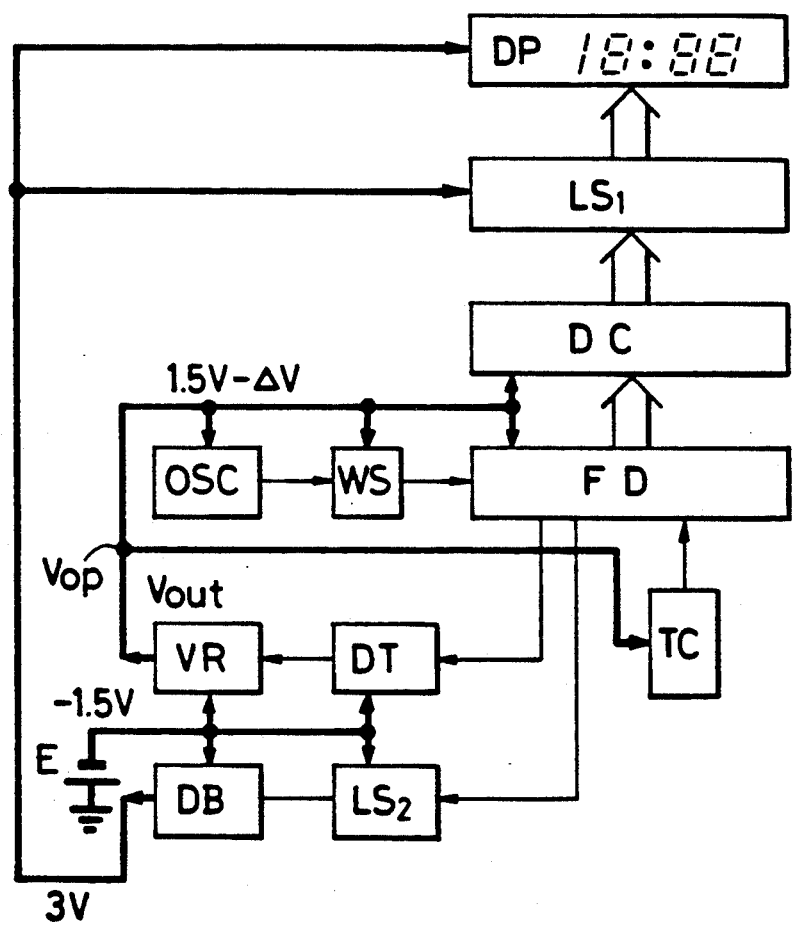
FIG. 57 shows an electronic timepiece to which a similar voltage regulator is applied.

FIG. 57 shows an example in which the voltage regulator VR and the battery checker BC according to this invention are applied to a digital display electronic timepiece.

In the figure, parts OSC, WS and FD use an adjusted voltage lower than 1.5 V as a power supply as in the example of FIG. 56, and also logical circuits within an IC such as decoder DC and time correction circuit TC use the lower voltage as a power supply.

DB designates a voltage doubler circuit which boosts the voltage of 1.5 V to 3.0 V, which is used as a drive voltage for a liquid crystal display DP (a driver is not shown). Each of $LS_1$ and $LS_2$ indicates a level shift circuit, which converts a low signal level into a high one D.C.-wise and supplies it to circuits of high supply voltages.

It is effective for rendering the power dissipation low and the expansion of a service power supply range that, as thus far described, the low operating power supply is used for the ordinary logical circuits within the IC which operate at low operating voltages, while the high operating power supply is used for the display driver etc. at the input/output interface of the IC which require high operating voltages.

What is claimed is:

1. A reference voltage generator device comprising:
   first and second insulated gate field-effect transistors of the same conductivity type formed at a common semiconductor substrate of one conductivity type, and having first and second gate electrodes of a substantially identical semiconductor material respectively, said first electrode having a part which is of one of P, N and intrinsic types to determine a threshold voltage of said first insulated gate field-effect transistor, said second electrode having a part which is of one of P, N and intrinsic types but is of type different from said threshold determining part of said first gate electrode to determine a threshold voltage of said second insulated gate field-effect transistor and to provide a difference of the threshold voltages corresponding to a difference of Fermi levels of said first and second gate electrodes, the impurity concentrations of the semiconductor material of said P and N types being higher than $10^{18} cm^{-3}$ respectively; and
   a voltage detecting circuit for providing a reference voltage which is based on said difference of the threshold voltages of said first and second insulated gate field-effect transistors,
   wherein said semiconductor material is silicon,
   wherein said first gate electrode has at least a central part of N-type silicon, while said second gate electrode has at least a central part of P-type silicon or intrinsic silicon, whereby the voltage thresholds of said first and second insulated gate field-effect transistors are determined by the central parts of said first and second gate electrodes respectively, and
   wherein the conductivity type of the first and second insulated gate field-effect transistors is of N-channel type and said second gate electrode is made of intrinsic silicon.

2. A reference voltage generator device comprising:
   first and second insulated gate field-effect transistors of the same conductivity type formed at a common semiconductor substrate of one conductivity type, and having first and second gate electrodes of a substantially identical semiconductor material respectively, said first electrode having a part which is of one of P, N and intrinsic types to determine a threshold voltage of said first insulated gate field-effect transistor, said second electrode having a part which is of one of P, N and intrinsic types but is of type different from said threshold determining part of said first gate electrode to determine a threshold voltage of said second insulated gate field-effect transistor and to provide a difference of the threshold voltages corresponding to a difference of Fermi levels of said first and second gate electrodes, the impurity concentrations of the semiconductor material of said P and N types being higher than $10^{18}$ cm$^{-3}$ respectively; and a voltage detecting circuit for providing a reference voltage which is based on said difference of the threshold voltages of said first and second insulated gate field-effect transistors, wherein said semiconductor material is silicon, wherein said first gate electrode has at least a central part of N-type silicon, while said second gate electrode has at least a central part of P-type silicon or intrinsic silicon, whereby the voltage thresholds of said first and second insulated gate field-effect transistors are determined by the central parts of said first and second gate electrodes respectively, and wherein the conductivity type of the first and second insulated gate field-effect transistors is of N-channel type and said second gate electrode is made of a silicon layer having a central part which is P-type and having end portions on each side of said central part which are N-type.

3. A reference voltage generator device comprising:

first and second insulated gate field-effect transistors of the same conductivity type formed at a common semiconductor substrate of one conductivity type, and having first and second gate electrodes of a substantially identical semiconductor material respectively, said first electrode having a part which is of one of P, N and intrinsic types to determine a threshold voltage of said first insulated gate field-effect transistor, said second electrode having a part which is of one of P, N and intrinsic types but is of type different from said threshold determining part of said first gate electrode to determine a threshold voltage of said second insulated gate field-effect transistor and to provide a difference of the threshold voltages corresponding to a difference of Fermi levels of said first and second gate electrodes, the impurity concentrations of the semiconductor material of said P and N types being higher than $10^{18}$ cm$^{-3}$ respectively; and a voltage detecting circuit for providing a reference voltage which is based on said difference of the threshold voltages of said first and second insulated gate field-effect transistors, wherein said semiconductor material is silicon, wherein said first gate electrode has at least a central part of N-type silicon, while said second gate electrode has at least a central part of P-type silicon or intrinsic silicon, whereby the voltage thresholds of said first and second insulated gate field-effect transistors are determined by the central parts of said first and second gate electrodes respectively, and wherein the conductivity type of the first and second insulated gate field-effect transistors is of N-channel type and said second gate electrode is made of a silicon layer whose central part is intrinsic and whose both ends are N-type.

4. A reference voltage generator device comprising:

first and second insulated gate field-effect transistors of the same conductivity type formed at a common semiconductor substrate of one conductivity type, and having first and second gate electrodes of a substantially identical semiconductor material respectively, said first electrode having a part which is of one of P, N and intrinsic types to determine a threshold voltage of said first insulated gate field-effect transistor, said second electrode having a part which is of one of P, N and intrinsic types but is of type different from said threshold determining part of said first gate electrode to determine a threshold voltage of said second insulated gate field-effect transistor and to provide a difference of the threshold voltages corresponding to a difference of Fermi levels of said first and second gate electrodes, the impurity concentrations of the semiconductor material of said P and N types being higher than $10^{18}$ cm$^{-3}$ respectively; and a voltage detecting circuit for providing a reference voltage which is based on said difference of the threshold voltages of said first and second insulated gate field-effect transistors, wherein said semiconductor material is silicon, wherein said first gate electrode has at least a central part of P-type silicon, while said second gate electrode has at least a central part of N-type silicon or intrinsic silicon, whereby the voltage thresholds of said first and second insulated gate field-effect transistors are determined by said central parts of said first and second gate electrodes respectively, and wherein the conductivity type of the first and second insulated gate field-effect transistors is of P-channel type and said second gate electrode is made of intrinsic silicon.

5. A reference voltage generator device comprising:

first and second insulated gate field-effect transistors of the same conductivity type formed at a common semiconductor substrate of one conductivity type, and having first and second gate electrodes of a substantially identical semiconductor material respectively, said first electrode having a part which is of one of P, N and intrinsic types to determine a threshold voltage of said first insulated gate field-effect transistor, said second electrode having a part which is of one of P, N and intrinsic types but is of type different from said threshold determining part of said first gate electrode to determine a threshold voltage of said second insulated gate field-effect transistor and to provide a difference of the threshold voltages corresponding to a difference of Fermi levels of said first and second gate electrodes, the impurity concentrations of the semiconductor material of said P and N types being higher than $10^{18}$ cm$^{-3}$ respectively; and a voltage detecting circuit for providing a reference voltage which is based on said difference of the threshold voltages of said first and second insulated gate field-effect transistors, wherein said semiconductor material is silicon, wherein said first gate electrode has at least a central part of P-type silicon, while said second gate electrode has at least a central part of N-type silicon or intrinsic silicon, whereby the voltage thresholds of said first and second insulated gate field-effect transistors are determined by said central parts of said first and second gate electrodes respectively, and wherein the conductivity type of the first and second insulated gate field-effect transistors is of P-channel type and said second gate electrode is made of a silicon layer having a central part which is N-type and having end portions on each side of said central part which are P-type.

6. A reference voltage generator device comprising:
first and second insulated gate field-effect transistors of the same conductivity type formed at a common semiconductor substrate of one conductivity type, and having first and second gate electrodes of a substantially identical semiconductor material respectively, said first electrode having a part which is of one of P, N and intrinsic types to determine a threshold voltage of said first insulated gate field-effect transistor, said second electrode having a part which is of one of P, N and intrinsic types but is of type different from said threshold determining part of said first gate electrode to determine a threshold voltage of said second insulated gate field-effect transistor and to provide a difference of the threshold voltages corresponding to a difference of Fermi levels of said first and second gate electrodes, the impurity concentrations of the semiconductor material of said P and N types being higher than $10^{18}$ cm$^{-3}$ respectively; and
a voltage detecting circuit for providing a reference voltage which is based on said difference of the threshold voltages of said first and second insulated gate field-effect transistors,
wherein said semiconductor material is silicon,
wherein said first gate electrode has at least a central part of P-type silicon, while said second gate electrode has at least a central part of N-type silicon or intrinsic silicon, whereby the voltage thresholds of said first and second insulated gate field-effect transistors are determined by said central parts of said first and second gate electrodes respectively, and
wherein the conductivity type of the first and second insulated gate field-effect transistors is of P-channel type and said second gate electrode is made of a silicon layer having a central part which is intrinsic and having end portions on each side of said central part which are P-type.

7. A reference voltage generator device comprising:
a first semiconductor layer being a silicon layer of N-type, a silicon layer of P-type, an intrinsic silicon layer, a silicon layer whose central part is N-type and whose both ends are P-type, a silicon layer whose central part is P-type and whose both ends are N-type, a silicon layer whose central part is intrinsic and whose both ends are P-type, a silicon layer whose central part is intrinsic and whose both ends are N-type, a silicon layer whose central part is N-type and whose both ends are P-type and whose intermediate parts between said central part and said both ends are intrinsic or a silicon layer whose central part is N-type, whose both ends are P-type and whose intermediate parts between said central part and said both ends are intrinsic;
a second semiconductor layer being a silicon layer of N-type, a silicon layer of P-type, an intrinsic silicon layer, a silicon layer whose central part is N-type and whose both ends are P-type, a silicon layer whose central part is P-type and whose both ends are N-type, a silicon layer whose central part is intrinsic and whose both ends are P-type, a silicon layer whose central part is intrinsic and whose both ends are N-type, a silicon layer whose central part is N-type and whose both ends are P-type and whose intermediate parts between said central part and said both ends are intrinsic or a silicon layer whose central part is N-type, whose both ends are P-type and whose intermediate parts between said central part and said both ends are intrinsic, the conductivity type determining impurity concentration of the silicon layer of P-type or N-type used as each of said first and second semiconductor layers is higher than $10^{18}$ cm$^{-3}$, said first and second semiconductor layers being a gate electrode of a first insulated gate field-effect transistor and a gate electrode of a second insulated gate field-effect transistor, respectively, said first and second insulated gate field-effect transistors being of the same conductivity type; and
a voltage detecting circuit for providing a reference voltage which is based on a difference of threshold voltages of said first and second insulated gate field-effect transistors,
wherein said gate electrodes of said first and second insulated gate field-effect transistors are formed on gate insulating films of the same insulating material which are formed on different surface areas of an identical semiconductor substrate, said gate insulating films being of the same insulating material and having the same thickness,
wherein at least respective central parts of said first and second semiconductor layers are utilized as said gate electrodes of said first and second insulated gate field-effect transistors, and
wherein said gate electrode, the source region and the drain region of each of said first and second insulated gate field-effect transistors are respectively made up of a plurality of gate polycrystalline region parts, a plurality of source region parts and a plurality of drain region parts, and said plurality of gate polycrystalline region parts are electrically connected in common by a gate interconnection layer, said plurality of source region parts are electrically connected in common by a source interconnection layer and said plurality of drain region parts are electrically connected in common by a drain interconnection layer.

8. A reference voltage generator device comprising:
a first semiconductor layer being a silicon layer of N-type, a silicon layer of P-type, an intrinsic silicon layer, a silicon layer whose central part is N-type and whose both ends are P-type, a silicon layer whose central part is P-type and whose both ends are N-type, a silicon layer whose central part is intrinsic and whose both ends are P-type, a silicon layer whose central part is intrinsic and whose both ends are N-type, a silicon layer whose central part is N-type and whose both ends are P-type and whose intermediate parts between said central part and said both ends are intrinsic or a silicon layer whose central part is N-type, whose both ends are P-type and whose intermediate parts between said central part and said both ends are intrinsic;
a second semiconductor layer being a silicon layer of N-type, a silicon layer of P-type, an intrinsic silicon layer, a silicon layer whose central part is N-type and whose both ends are P-type, a silicon layer whose central part is P-type and whose both ends are N-type, a silicon layer whose central part is intrinsic and whose both ends are P-type, a silicon layer whose central part is intrinsic and whose both ends are N-type, a silicon layer whose central part is N-type and whose both ends are P-type and whose intermediate parts between said central part and said both ends are intrinsic or a silicon layer whose central part is N-type, whose both ends are P-type and whose intermediate parts between said central part and said both ends are intrinsic, the conductivity type determining impurity concentration of the silicon layer of P-type or N-type used as each of said first and second semiconductor layers is higher than $10^{18}$ cm$^{-3}$, said first and second semiconductor layers being a gate electrode of a first insulated gate field-effect transistor and a gate electrode of a second insulated gate field-effect transistor, respectively, said first and second insulated gate field-effect transistors being of the same conductivity type; and a voltage detecting circuit for providing a reference voltage which is based on a difference of threshold voltages of said first and second insulated gate field-effect transistors, wherein said gate electrodes of said first and second insulated gate field-effect transistors are formed on gate insulating films of the same insulating material which are formed on different surface areas of an identical semiconductor substrate, said gate insulating films being of the same insulating material and having the same thickness, and wherein said gate electrode, a source region and a drain region of each of said first and second insulated gate field-effect transistors are respectively made up of a plurality of gate electrode parts, a plurality of source region parts and a plurality of drain region parts, and said plurality of gate electrode parts are electrically connected in common by a gate interconnection layer, said plurality of source region parts are electrically connected in common by a source interconnection layer and said plurality of drain region parts are electrically connected in common by a drain interconnection layer.

9. A reference voltage generator device comprising first and second insulated gate field-effect transistors which have a difference of threshold voltages corresponding to a difference of Fermi levels of gate electrodes thereof, one of said first and second insulated gate field-effect transistors being diode-connected so that at least its gate and drain may be coupled D.C.-wise, the difference of said threshold voltages of both the insulated gate field-effect transistors being utilized, wherein said first and second insulated gate field-effect transistors are diode-connected with the respective gates and drains coupled D.C.-wise, and wherein a capacitor is connected between the respective drains of said first and second insulated gate field-effect transistors, and a third insulated gate field-effect transistor which is driven by a clock pulse is connected to said first insulated gate field-effect transistor.

10. A reference voltage generator device comprising first and second insulated gate field-effect transistors which have a difference of threshold voltages corresponding to a difference of Fermi levels of gate electrodes thereof, one of said first and second insulated gate field-effect transistors being diode-connected so that at least its gate and drain may be coupled D.C.-wise, the difference of said threshold voltages of both the insulated gate field-effect transistors being utilized, wherein said first and second insulated gate field-effect transistors are diode-connected with the respective gates and drains coupled D.C.-wise, and wherein a third insulated gate field-effect transistor which is driven by a first clock pulse, a fourth insulated gate field-effect transistor which is driven by a second clock pulse, and a capacitor, the respective drains of said first and second insulated gate field-effect transistors being connected to said third insulated gate field-effect transistor in common, said capacitor being connected between respective sources of said first and second insulated gate field-effect transistors, the source of said first insulated gate field-effect transistor being connected to said fourth insulated gate field-effect transistor.

* * * * *